United States Patent
Krzysztof et al.

(10) Patent No.: US 8,311,066 B2
(45) Date of Patent: Nov. 13, 2012

(54) LASER APPARATUS AND EXTREME ULTRAVIOLET LIGHT SOURCE APPARATUS

(75) Inventors: Nowak Krzysztof, Oyama (JP); Takeshi Ohta, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 12/713,874

(22) Filed: Feb. 26, 2010

(65) Prior Publication Data
US 2010/0220756 A1    Sep. 2, 2010

(30) Foreign Application Priority Data

Feb. 27, 2009 (JP) .................................. 2009-047290
Feb. 23, 2010 (JP) .................................. 2010-037108

(51) Int. Cl.
*H01S 3/098* (2006.01)
(52) U.S. Cl. ........................................................ 372/19
(58) Field of Classification Search ...................... 372/19
See application file for complete search history.

(56) References Cited

U.S. PATENT DOCUMENTS

| 6,421,363 B1* | 7/2002 | Osinski et al. ............. 372/50.11 |
| 2005/0254531 A1* | 11/2005 | Furukawa et al. ............... 372/22 |
| 2008/0149862 A1* | 6/2008 | Hansson et al. ........... 250/504 R |

* cited by examiner

*Primary Examiner* — Patrick Stafford
(74) *Attorney, Agent, or Firm* — McDermott Will & Emery LLP

(57) ABSTRACT

A laser apparatus comprises an amplifier including at least one of a MOPA and a MOPO each of which amplifies a single-longitudinal or multiple-longitudinal mode laser light, an amplifiable agent of the amplifier being a molecular gas, a master oscillator constructed from a semiconductor laser being able to oscillate a single-longitudinal or multiple-longitudinal mode laser light of which wavelength is within one or more amplification lines of the amplifier; and a controller executing a wave shape control adjusting a pulse shape and/or a pulse output timing of a single-longitudinal or multiple-longitudinal mode laser light outputted from the master oscillator.

19 Claims, 40 Drawing Sheets

| TRANSITION 00°1 TO 10°0 BAND | WAVELENGTH IN VACUUM [μm] | WAVELENGTH DIFFERENCE BETWEEN EACH LINE [μm] |
|---|---|---|
| P(12) | 10.5135 | 0.0191 |
| P(14) | 10.5326 | 0.0192 |
| P(16) | 10.5518 | 0.0195 |
| P(18) | 10.5713 | 0.0199 |
| P(20) | 10.5912 | 0.0206 |
| P(22) | 10.6118 | 0.0206 |
| P(24) | 10.6324 | 0.021 |
| P(26) | 10.6534 | 0.0214 |
| P(28) | 10.6748 | 0.0217 |
| P(30) | 10.6965 | 0.0229 |
| P(32) | 10.7194 | 0.0221 |
| P(34) | 10.7415 | 0.0233 |
| P(36) | 10.7648 | 0.0232 |
| P(38) | 10.788 | |
| TRANSITION 00°1 TO 02°0 BAND | WAVELENGTH IN VACUUM [μm] | WAVELENGTH DIFFERENCE BETWEEN EACH LINE [μm] |
| P(22) | 9.5691 | 0.0171 |
| P(24) | 9.5862 | 0.0201 |
| P(26) | 9.6063 | 0.0148 |
| P(28) | 9.6211 | 0.018 |
| P(30) | 9.6391 | 0.0185 |
| P(32) | 9.6576 | 0.0186 |
| P(34) | 9.6762 | |

CURRENT PULSE SHAPE OF EACH OF SEMICONDUCTOR LASERS 41 TO 45

OUTPUT PULSE SHAPE OF EACH OF SEMICONDUCTOR LASERS 41 TO 45

OUTPUT PULSE SHAPE OF EACH OF AMPLIFIABLE LINES FROM MAIN AMPLIFIER MA

MULTIPLEXED OUTPUT PULSE SHAPE OF MAIN AMPLIFIER MA

CURRENT PULSE SHAPE OF EACH OF SEMICONDUCTOR LASERS 41 TO 45

OUTPUT PULSE SHAPE OF EACH OF SEMICONDUCTOR LASERS 41 TO 45

OUTPUT PULSE SHAPE OF EACH OF AMPLIFIABLE LINES FROM MAIN AMPLIFIER MA

MULTIPLEXED OUTPUT PULSE SHAPE OF MAIN AMPLIFIER MA

CURRENT PULSE SHAPE OF EACH OF SEMICONDUCTOR LASERS 41 TO 45

OUTPUT PULSE SHAPE OF EACH OF SEMICONDUCTOR LASERS 41 TO 45

OUTPUT PULSE SHAPE OF EACH OF AMPLIFIABLE LINES FROM MAIN AMPLIFIER MA

MULTIPLEXED OUTPUT PULSE SHAPE OF MAIN AMPLIFIER MA

CURRENT PULSE SHAPE OF EACH OF SEMICONDUCTOR LASERS 41 TO 45

OUTPUT PULSE SHAPE OF MAIN AMPLIFIER MA

LASER APPARATUS AND EXTREME ULTRAVIOLET LIGHT SOURCE APPARATUS

CROSS-REFERENCE TO RELATED APPLICATIONS

This application is based upon and claims the benefit of priority from the prior Japanese Patent Applications No. 2009-047290, filed on Feb. 27, 2009, and No. 2010-037108, filed on Feb. 23, 2010; the entire contents of which are incorporated herein by reference.

BACKGROUND OF THE DISCLOSURE

1. Field of the Disclosure

The present disclosure relates to a laser apparatus and an extreme ultraviolet light source apparatus.

2. Description of the Related Art

In recent years, along with a progress in miniaturization of semiconductor device, miniaturization of transcription pattern used in photolithography in a semiconductor process has developed rapidly. In the next generation, microfabrication to the extent of 70 nm to 45 nm, or even to the extent of 32 nm and beyond will be required. Therefore, in order to comply with the demand of microfabrication to the extent of 32 nm and beyond, development of such exposure apparatus combining an extreme ultraviolet (EUV) light source for a wavelength of about 13 nm and a reduced projection reflective optics is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has such advantages that luminance can be made extremely high as close to the black-body radiation because plasma density can be made higher compared with the DPP light source and the SR light source. Among these light sources, the LPP light source has such advantages that luminance can be made extremely high as close to the black-body radiation because plasma density can be made higher compared with the DPP light source and the SR light source. Furthermore, the LPP light source has such advantages that there is no construction such as electrode around a light source because the light source is a point light source with nearly isotropic angular distributions, and therefore extremely wide collecting solid angle can be acquired, and so on. Accordingly, the LPP light source having such advantages is expected as a light source for EUV lithography which requires more than several dozen to several hundred watt power.

In the EUV light source apparatus with the LPP system, as disclosed by US Patent Application Publication No. 2008/0149862, firstly, a target material supplied inside a vacuum chamber is excited by irradiation with a laser light and thus be turned into plasma. Then, a light with various wavelength components including an EUV light is emitted from the generated plasma. Then, the EUV light source apparatus focuses the EUV light on a predetermined point by reflecting the EUV light using an EUV collector mirror which selectively reflects an EUV light with a specific wavelength, e.g. a 13.5 nm wavelength component. The reflected EUV light is inputted to an exposure apparatus. On a reflective surface of the EUV collector mirror, a multilayer coating (Mo/Si multilayer coating) with a structure in that thin coating of molybdenum (Mo) and thin coating of silicon (Si) are alternately stacked, for instance, is formed. The multilayer coating exhibits a high reflectance ratio (of about 60% to 70%) with respect to the EUV light with a 13.5 nm wavelength.

Here, a $CO_2$ pulse laser with high repetition (100 kHz) and high power (10 kW) as being required by an EUV light source apparatus, as it stands, cannot be realized by a TEA $CO_2$ laser. According to US Patent Application Publication No. 2008/0149862, a pulse light is generated from an output light having outputted from a master oscillator (MO) of a driver laser by use of a high-speed shutter, and then multistage-amplified by a $CO_2$ gas amplifier being a power amplifier (PA) to be emitted to a target in a way focusing on the target. Thereby, the target turns into plasma, and an EUV light is emitted from the plasma. In this arrangement, the high-speed shutter located on a beam line of the driver laser is controlled based on a measuring result obtained by detecting the emitted EUV light. As a result, a pulse energy of the driver laser is feedback-controlled so that the energy of the EUV light is adjusted to a desired value. Here, the MO and the PA excite $CO_2$ gas being an amplifiable agent by high-frequency discharge.

BRIEF SUMMARY OF THE DISCLOSURE

In accordance with one aspect of the present disclosure, a laser apparatus comprises an amplifier including at least one of a MOPA and a MOPO each of which amplifies a single-longitudinal or multiple-longitudinal mode laser light, an amplifiable agent of the amplifier being a molecular gas, a master oscillator constructed from a semiconductor laser being able to oscillate a single-longitudinal or multiple-longitudinal mode laser light of which wavelength is within one or more amplification lines of the amplifier, and a controller executing a wave shape control adjusting a pulse shape and/or a pulse output timing of a single-longitudinal or multiple-longitudinal mode laser light outputted from the master oscillator.

In accordance with another aspect of the present disclosure, an extreme ultraviolet light source apparatus comprises a laser apparatus comprises an amplifier including at least one of a MOPA and a MOPO each of which amplifies a single-longitudinal or multiple-longitudinal mode laser light, an amplifiable agent of the amplifier being a molecular gas, a master oscillator constructed from a semiconductor laser being able to oscillate a single-longitudinal or multiple-longitudinal mode laser light of which wavelength is within one or more amplification lines of the amplifier, and a controller executing a wave shape control adjusting a pulse shape and/or a pulse output timing of a single-longitudinal or multiple-longitudinal mode laser light outputted from the master oscillator, wherein using the laser apparatus as a driver laser, a plasma is generated by irradiating an irradiation target with a single-longitudinal or multiple-longitudinal mode laser light outputted from the driver laser, and an extreme ultraviolet light is emitted from the plasma.

These and other objects, features, aspects, and advantages of the present disclosure will become apparent to those skilled in the art from the following detailed description, which, taken in conjunction with the annexed drawings, discloses preferred embodiments of the present disclosure.

DESCRIPTION OF THE PREFERRED EMBODIMENTS

In the following, best mode embodiments of a laser apparatus and an extreme ultraviolet light source apparatus according to the present disclosure will be described in detail with reference to the accompanying drawings.

First Embodiment

Figure 1:
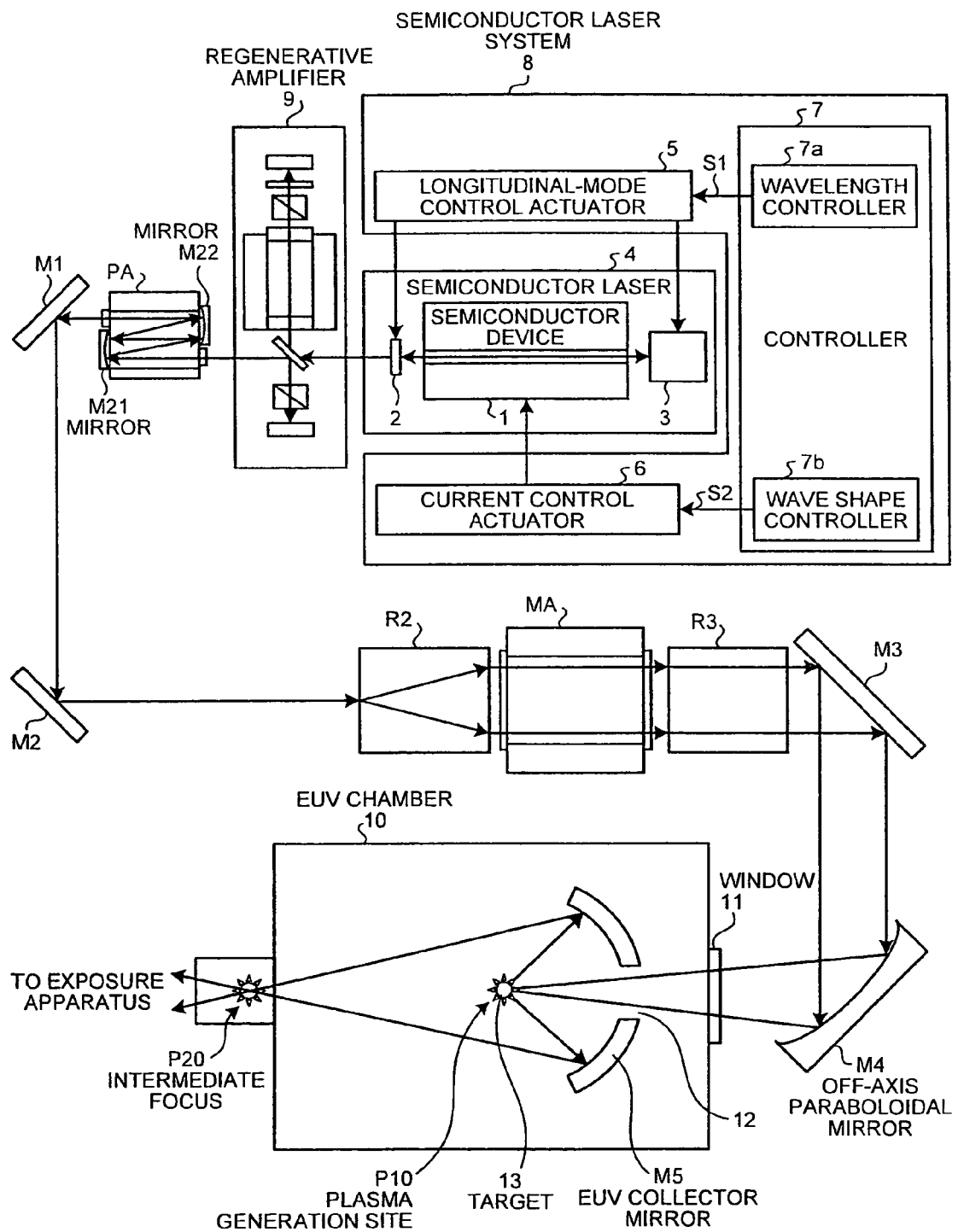
FIG. 1 is a schematic diagram showing a structure of an extreme ultraviolet light source apparatus with a laser apparatus according to a first embodiment of the present disclosure.

FIG. 1 is a schematic diagram showing a structure of an extreme ultraviolet light source apparatus with a laser apparatus according to a first embodiment of the present disclosure. The EUV light source apparatus is constructed mainly from a driver laser and an EUV light generating apparatus using the driver laser. The driver laser has a master oscillator being a semiconductor laser 4, and a MOPA (master oscillator power amplifier) type amplifier which includes a regenerative amplifier 9 using a molecular gas as an amplification agent (molecular gas amplifier), and a two-stage preamplifier PA and a main amplifier MA each of which uses a molecular gas as an amplification agent. Here, in place of the MOPA type amplifier using the molecular gas as the amplification agent, a MOPO (master oscillator power oscillator) type amplifier using a molecular gas as an amplification agent can be used.

The driver laser has a semiconductor laser 4 oscillating and amplifying a longitudinal mode pulse laser light within an amplifiable wavelength group (hereinafter to be referred to as amplifiable lines) of the preamplifier PA and the main amplifier MA. The semiconductor laser 4 is preferably a quantum cascade laser. At a front side of the semiconductor laser 4, an output coupling mirror 2 is arranged, and at a rear side, a rear optical module 3 is arranged. The output coupling mirror 2 and the rear optical module 3 form an optical resonator with an optical amplifiable region while sandwiching a semiconductor device 1 in between. The optical resonator is commanded by a semiconductor laser system 8. The semiconductor laser system 8 has a controller 7. A wavelength controller 7a in the controller 7 controls a resonator length of the optical resonator via a longitudinal mode control actuator 5 by outputting an oscillation wavelength signal Si to the longitudinal mode control actuator 5, and thereby controls a wavelength of light outputted from the optical resonator. On the other hand, a wave shape controller 7b in the controller 7 controls a current shape applied to the semiconductor device 1 via a current control actuator 6 by outputting an oscillation pulse shape signal S2 to the current control actuator 6. By this arrangement, a pulse shape and an output timing of a pulse light outputted from the resonator is controlled. The pulse shape includes a pulse width and a pulse peak value. Accordingly, by controlling the pulse shape, it is possible to control a pulse energy.

The regenerative amplifier 9 executes regeneration-amplification with respect to the pulse laser light having outputted from the semiconductor laser 4 with regeneration and outputs it to a side of the preamplifier PA. The preamplifier PA is a slab laser amplifier. A laser light outputted from the regenerative amplifier 9 enters an input window of the preamplifier PA. The preamplifier PA multipass-amplifies the laser light having entered via mirrors M21 and M22 by making the laser light shuttle over an amplifiable region formed between plate electrodes. The amplified laser light is outputted to a HV (high reflective) mirror M1 from an output window. Thus, the single longitudinal mode pulse laser light is amplified efficiently by passing through the amplifiable region space of the amplification agent in the preamplifier PA, and then outputted from the preamplifier PA.

After being reflected by the HR (high reflective) mirrors M1 and M2, the amplified pulse laser light having outputted from the preamplifier PA enters a relay optics R2. The relay optics R2 adjusts a beam width or a diameter of the amplified pulse laser light so that the amplified pulse laser light can enter through the whole amplification region space of the main amplifier MA, which is filled with an excited mixture gas being an amplification agent of a CO2 gas amplifier. Accordingly, the amplified pulse laser light is amplified efficiently by passing through the whole amplifiable region space of the amplification agent in the main amplifier MA, and then outputted from the main amplifier MA.

After that, the amplified pulse laser light outputted from the main amplifier MA is collimated by a relay optics R3, and then, is highly reflected by a HR mirror M3 and an off-axis parabolic mirror M4, and then, enters an EUV chamber 10 of the EUV light generating apparatus via a window 11.

After entering inside the EUV chamber 10, the amplified pulse laser light having highly reflected by the off-axis parabolic mirror M4 passes through an aperture 12 as arranged at a central portion of an EUV collector mirror M5. The amplified pulse laser light having passed through the aperture 12 focuses on a target 13. The target 13 is Sn, typically. The target 13 with focused amplified pulse laser light becomes a plasma. After that, from the plasma (a plasma generation site P10), an EUV light with a 13.5 nm wavelength is generated as having high efficiency (2% to 4% of the laser energy). By the EUV collector mirror M5, an image of the plasma generation site P10 is transcribed into an intermediate focus P20 as an image of an EUV light source. Having focused on the intermediate focus P20, the EUV light then enters an exposure apparatus (not shown) while expanding.

Here, the regenerative amplifier 9 and the preamplifier PA, as with the main amplifier MA, can have an amplifiable region filled with an excited mixture gas being an amplification agent of a $CO_2$ gas amplifier. In this case, at a front of the preamplifier PA, a relay optics for adjusting a width or a diameter of a laser light can be further arranged in order to let the laser light enter through the whole amplifiable region space.

Figure 2:
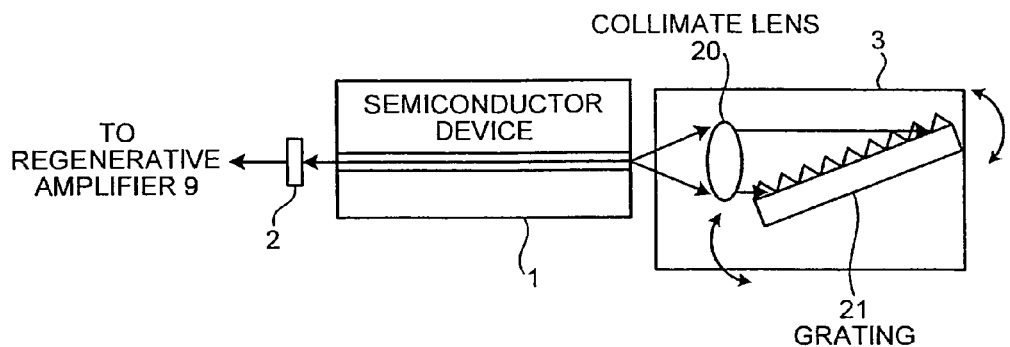
FIG. 2 is a schematic diagram showing an example of a semiconductor laser according to the first embodiment.

The output coupling mirror 2 is a mirror with a partial reflection mirror coat, and outputs a part of the laser light to the exterior while letting a part of the residual laser light return to the optical resonator. The rear module 3, as shown in FIG. 2, has a collimate lens 20 and a grating 21 which is arranged in a Littrow arrangement enabling selection of a wavelength of light. The laser light outputted from a back side of the semiconductor device 1 is collimated by the collimate lens 20, and then, enters the grating 21 as a collimate light. After that, the laser light having entered into the grating is wavelength-selected by the reflective type grating 21, and then returns to the semiconductor device 1 via the collimate lens 20. Thus, it is possible to output a desired single longitudinal mode laser light to a side of the regenerative amplifier 9 from the output coupling mirror 2. Here, a wavelength of the single longitudinal mode laser light outputted from the semiconductor laser 4, as described above, matches with amplification lines of the regenerative amplifier 9, the preamplifier PA and the main amplifier MA due to the wavelength control by the wavelength controller 7a. Furthermore, the wavelength controller 7b controls to make the semiconductor laser 4 output a pulse laser light with a desired pulse shape and a desired pulse oscillation timing by controlling a current pulse shape applied to the semiconductor device 1 of the semiconductor laser 4 via the current control actuator 6. The wavelength controller 7a and the longitudinal mode control actuator 5 function as a wavelength control means, and the wave shape controller 7b and the current control actuator 6 function as a wave shape control means.

Figure 3:
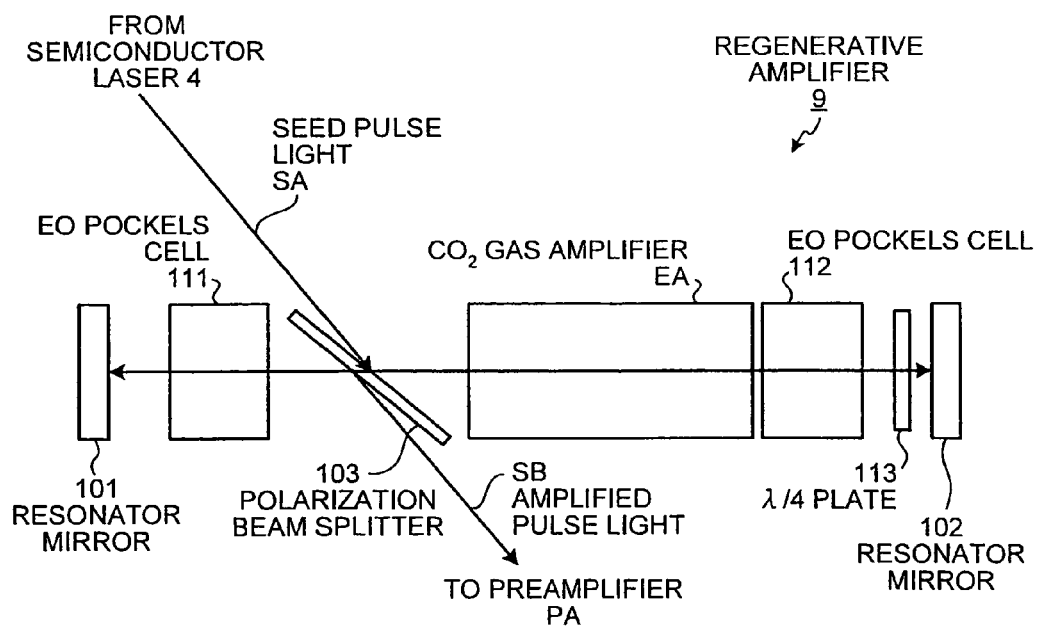
FIG. 3 is a schematic diagram showing a structure of a regenerative amplifier according to the first embodiment.
Figure 4A:
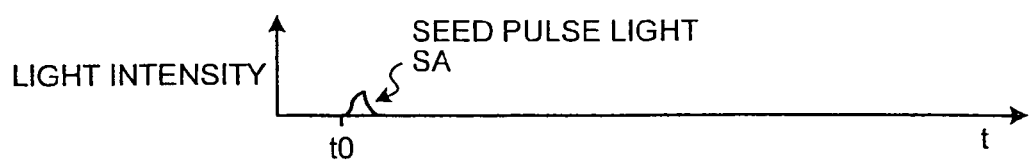
FIG. 4 is a timing chart showing an operation of the regenerative amplifier shown in FIG. 3.
Figure 4B:
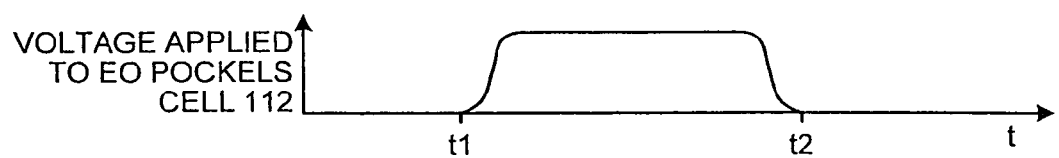
Figure 4C:
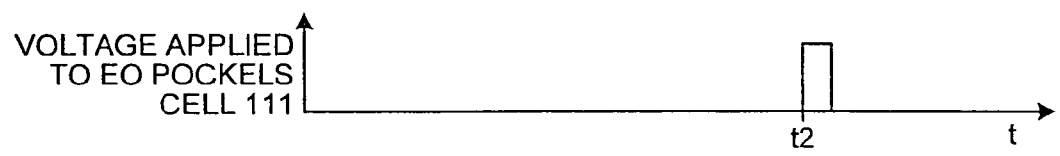
Figure 4D:
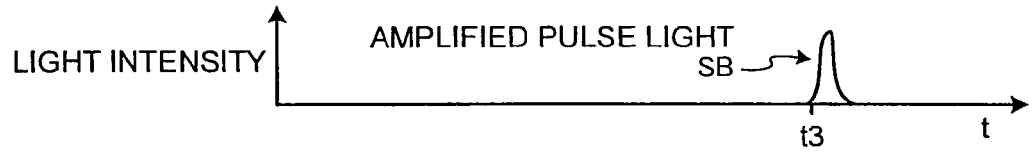

The regenerative amplifier 9 arranged between the semiconductor laser 4 and the preamplifier PA, as described above, executes regeneration-amplification with respect to the laser light outputted from the semiconductor laser 4 and outputs it to the side of the preamplifier PA. As shown in FIG. 3, the regenerative amplifier 9 has a structure in that an EO Pockels cell 111, a polarized beam splitter 103, a $CO_2$ gas amplifier EA, an EO Pockels cell 112 and a $\lambda/4$ plate 113 are arranged in that order between a pair of resonator mirrors 101 and 102. The regenerative amplifier 9 inputs the laser light having outputted from the semiconductor laser 4 via the polarized beam splitter 103 as a seed pulse light SA, amplifies the seed pulse light SA by shuttling it between the resonator mirrors 101 an 102, and then outputs the amplified seed pulse light SA to the side of the preamplifier PA via the polarized beam splitter 103 as an amplified pulse light SB.

Here, an operation of the regenerative amplifier 9 will be described with reference to a timing chart shown in FIG. 4. Firstly, a pulse light from the semiconductor laser 4 having entered the polarized beam splitter 10 at a timing t0 with S polarization as the seed pulse light SA is introduced to the resonator of the regenerative amplifier 9 by being reflected at the polarized beam splitter 103. The introduced laser light is amplified by passing through the amplifiable region of the CO2 gas amplifier EA, passes through the voltage-free EO Pockels cell 112 without being phase-shifted, and then is transformed into a circular polarized laser light by passing through the $\lambda/4$ plate 113. Then, the circular polarized laser light is transformed into a P polarized light by passing through the $\lambda/4$ plate 113 again after being highly reflected at the resonator mirror 102. Furthermore, the P polarized laser light is amplified by passing through the amplifiable region of the $CO_2$ gas amplifier EA. Moreover, the amplified P polarized laser light passes through the polarized beam splitter 103, passes through the voltage-free EO Pockels cell 111 without being phase-shifted, and then is highly reflected at the resonator mirror 101. After that, the highly reflected laser light passes through the EO Pockels cell 111 as being p-polarized without being phase-shifted, passes through the polarized beam splitter 103, and then is amplified again by passing through the amplifiable region of the CO2 gas amplifier EA.

After that, the P polarized laser light is phase-shifted by $\lambda/4$ by passing through the voltage-applied EO Pockels cell 112 at a timing t1. Thereby, the P polarized laser light is transformed into a circular polarized laser light. The circular polarized laser light is transformed into a S polarized laser light by passing through the $\lambda/4$ plate 113. Then, the S polarized laser light is reflected at the resonator mirror 102, and then is transformed into a circular polarized light by passing through the $\lambda/4$ plate 113 again. Furthermore, the circular polarized laser light is transformed into a P polarized light by passing through the voltage-applied EO Pockels cell 112. After that, the P polarized laser light is amplified by passing through the amplifiable region of the $CO_2$ gas amplifier EA, passes through the polarized beam splitter 103, and then passes through the voltage-free EO Pockels cell 111 without being changed. Subsequently, the P polarized laser light is reflected at the resonator mirror 101, passes through the voltage-free EO Pockels cell 111 again, and then passes through the polarized beam splitter 103 as being P-polarized and not being changed. As describe above, the laser light introduced into the regenerative amplifier 9 is amplified by being shuttled between the resonator mirrors 101 and 102 under the state while voltage is applied to the EO Pockels cell 112.

After that, by passing through the voltage-applied EO Pockels cell 111 at a timing t2 for outputting the amplified laser light (the amplified pulse laser light SB) to the external, the P polarized laser light is transformed into a circular polarized light by being phase-shifted by $\lambda/4$. Furthermore, the circular polarized laser light is reflected by the resonator mirror 101, and is transformed into a S polarized light by passing through the voltage-applied EO Pockels cell 111 again. After that, the S polarized laser light is outputted to the side of the external preamplifier PA as the amplified pulse light SB by being highly reflected at the polarized beam splitter 103.

As described above, by using the regenerative amplifier 9, it is possible to efficiently execute regeneration-amplification with respect to a pulse laser light with a small optical output like the semiconductor laser 4. Thereby, it is possible to efficiently pulse-amplify the laser light outputted from the regenerative amplifier 9 using the preamplifier PA and the main amplifier MA.

Figures 5, 6:
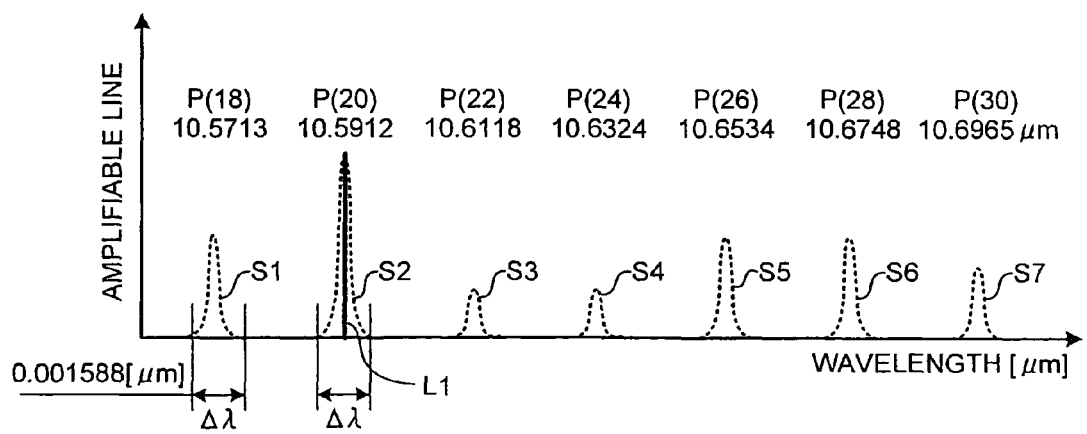
FIG. 5 is an illustration showing a relationship between oscillating bands and wavelengths of a $CO_2$ gas amplifier in the first embodiment.
FIG. 6 is an illustration showing a relationship between a wavelength of each amplifiable line and gain of the $CO_2$ gas amplifier in the first embodiment.
Figure 7A:
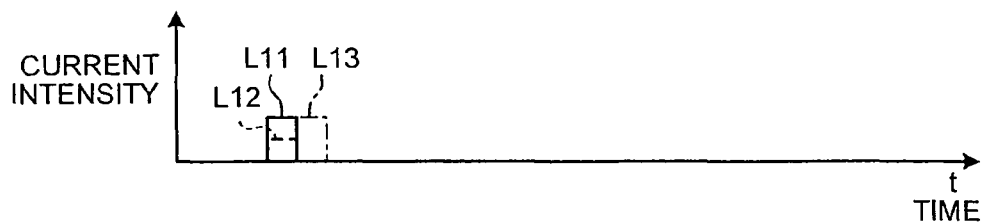
FIG. 7 is a timing chart showing a relationship between a current pulse shape and an amplified output pulse shape in a case where the current pulse shape is changed according to the first embodiment.
Figure 7B:
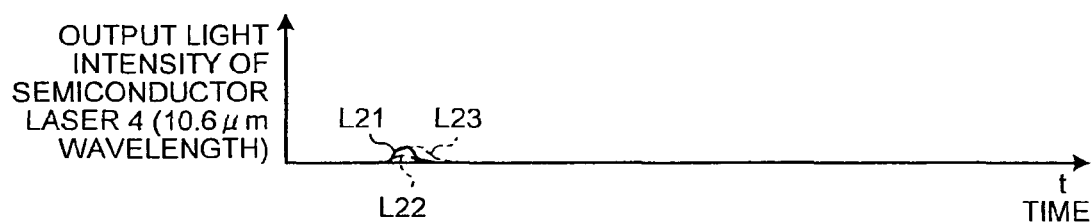
Figure 7C:
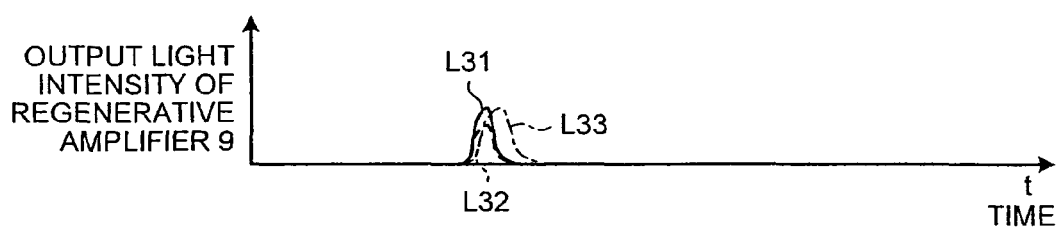
Figure 7D:
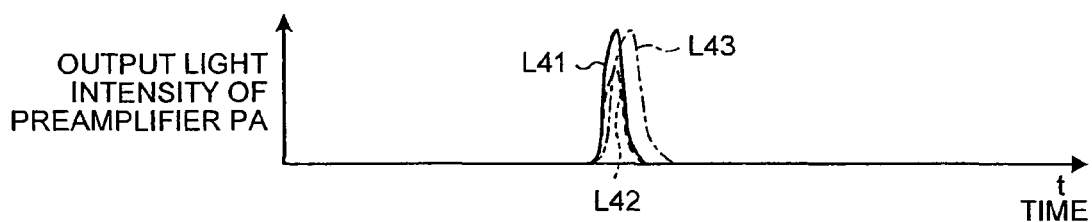
Figure 7E:
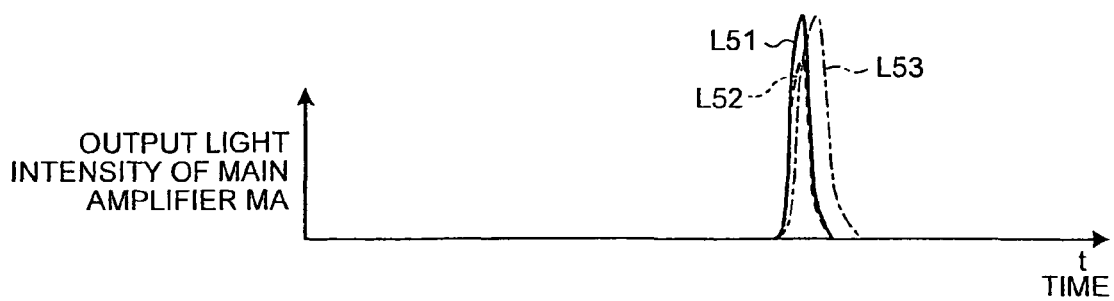

Here, the amplification lines of the regenerative amplifier 9, the preamplifier PA and the main amplifier MA will be explained. Both the preamplifier PA and the main amplifier MA are $CO_2$ gas amplifiers. In wavelength ranges where the $CO_2$ gas amplifier oscillates or amplifies, as shown in FIG. 5, a plurality of rotation bands (transition 00°1 to 10°0 band and transition 00°1 to 02°0 band) exists near 10.6 μm and 9.6 μm wavelengths. That is, when an amplifier adopting a $CO_2$ gas as an amplification agent is used, a plurality of amplification lines exists. Data shown in FIG. 5 are values when a mixture ratio of amplification agent is set to $CO_2:N_2:He=1:1:8$, a pressure is set to 100 torr, and a temperature is set to 450K.

FIG. 6 is a schematic diagram showing a relationship between a wavelength and gain of each amplification line in a CO2 gas amplifier. In FIG. 6, amplifiable regions (amplification lines) of a total of seven bands which are band P(18), P(20), P(22), P(24), P(26) and P(28) near 10.6 μm wavelength are shown in broken lines. The wavelength controller 7a controls the resonator by the output coupling mirror 2 and the rear optical module 3 via the longitudinal mode control actuator 5. Thereby, a single longitudinal mode laser light L1 included in an amplification line Δλ of an amplifiable region S2 of the band P(20) (=Oscillation wavelength of 10.5912 μm) is outputted from the semiconductor laser 4. Especially, a central wavelength of the longitudinal mode laser light L1 is controlled to be adjusted to around a center (10.5912±0.000794 μm) of the amplification line Δλ of the amplifiable region (amplification line) S2. Thereby, the regenerative amplifier 9, the preamplifier PA and the main amplifier MP can efficiently output the high-power amplified pulse laser light. As described above, when a variable wavelength laser is used as the master oscillator, it is easily possible to match the wavelength of the laser light outputted from the master oscillator with the amplification line of the amplifier by only executing wavelength-control of the master oscillator. The wavelength control in this case can be realized by a wavelength selection control that includes a rotation control of the grating 3 and a control of the resonator length.

On the other hand, a wave shape and an oscillation timing of the laser light outputted within a wavelength band of the band P(20) is controlled by the wavelength controller 7b. For instance, as shown in FIGS. 7(a) to 7(e), by changing a current pulse shapes L11, L12 and L13 of the semiconductor laser 4, it is possible to control a pulse shape of the output laser pulse light finally outputted from the main amplifier MA to a desired shape and a output timing. The current pulse shape L12 is a shape with amplitude smaller than the current pulse shape L11, and is amplified by the preamplifier PA and the main amplifier MA into laser lights L22, L32, L42 and L52 sequentially. In this case, because every stage is smaller than any of the laser pulse lights L21, L31, L41 and L51, a final laser pulse light L52 is to be outputted with a pulse energy smaller than the laser pulse light L51 at the same output timing.

In contrast, a pulse width of the current pulse shape L13 is longer than the current pulse shape L11, although the amplitude of the current pulse shape L13 is the same as the current pulse shape L11. In this case, pulse widths of laser pulse lights L23, L33, L43 and L53 as sequentially amplified become longer than the laser pulse lights L21, L31, L41 and L51. Therefore, a pulse width of a final laser pulse light L53 becomes longer than the laser pulse light L51 while amplitudes are both the same. Accordingly, a pulse energy of the final laser pulse light L53 becomes larger.

That is, by controlling the current pulse shape outputted from the current control actuator 6, it is possible to control the pulse energy, pulse width, pulse peak value and pulse output timing.

Figure 8:
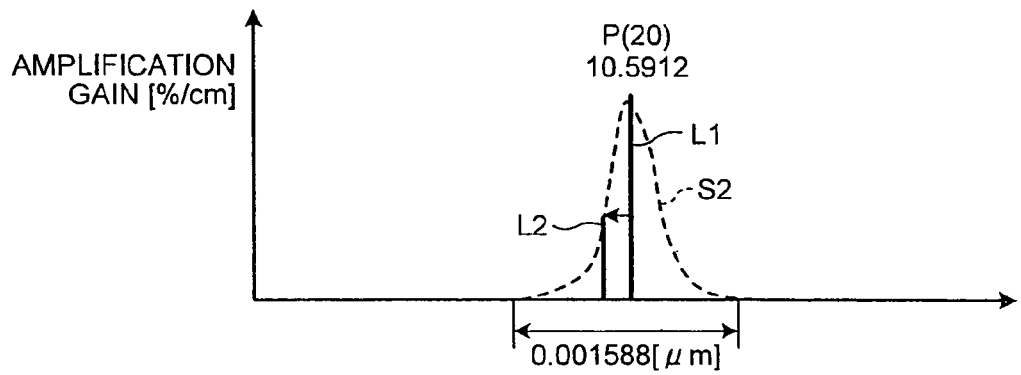
FIG. 8 is an illustration showing a variation of an amplification gain caused by wavelength shift in an amplifiable region, in the first embodiment.
Figure 9A:
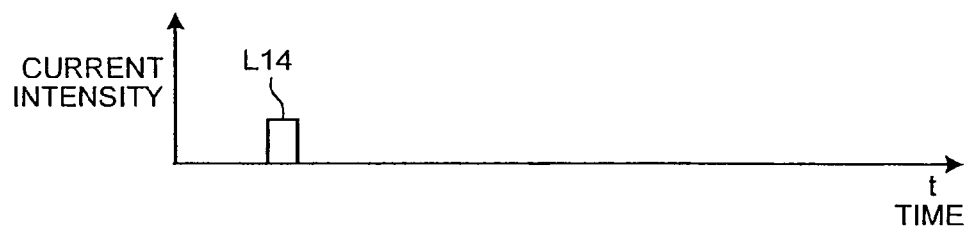
FIG. 9 is a timing chart showing a variation of the amplified output pulse shape when the same current pulse shape is applied between a case where the wavelength shift is executed and a case where the wavelength shift is not executed.
Figure 9B:
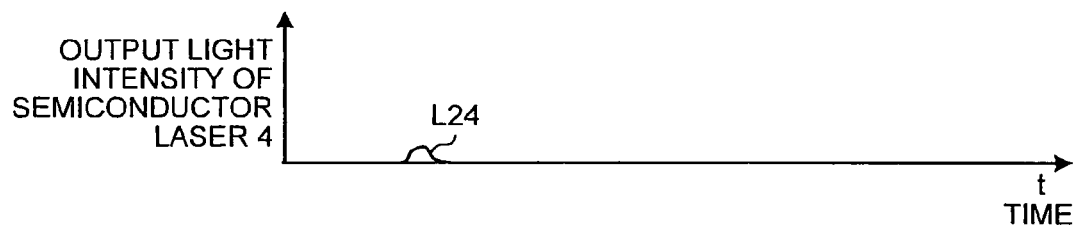
Figure 9C:
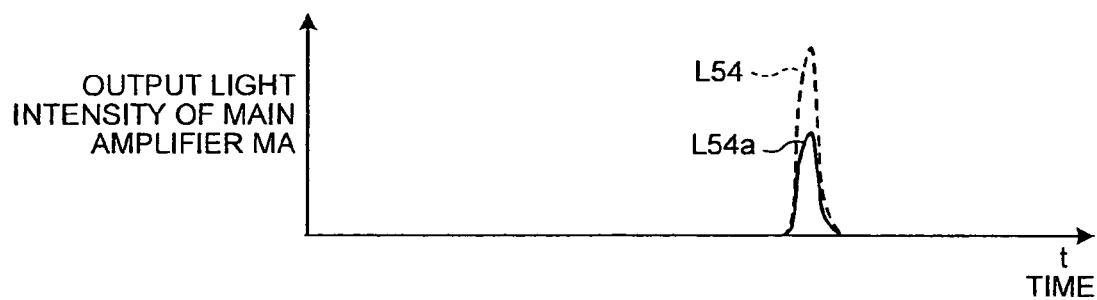

In addition, also by wavelength-controlling by the wavelength controller 7a, it is possible to control the pulse energy. For instance, as shown in FIG. 8, when the wavelength controller 7a shifts the wavelength from an oscillation wavelength L1 of the single longitudinal mode laser light to an oscillation wavelength L2 so that a gain becomes smaller while maintaining in the same amplification line, even if the same current pulse shape L14 is inputted, gains of the regenerative amplifier 9, the preamplifier PA and the main amplifier MA become smaller, and finally, a peak value is suppressed by the wavelength shift, as can be seen in FIG. 9. Accordingly, it is possible to output a laser light with a smaller pulse energy as compared with the laser pulse light L54. Due to executing such wavelength shift control, it is possible to increase a dynamic range in adjustment or control of the final pulse energy to be outputted from the main amplifier PA.

Figure 10:
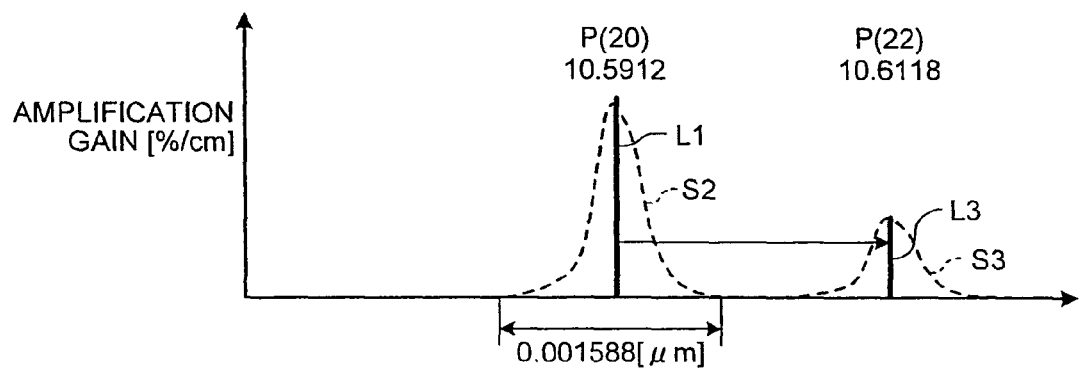
FIG. 10 is an illustration showing a variation of the amplification gain caused by the wavelength shift among amplifiable regions in different amplifiable lines, in the first embodiment.
Figure 11A:
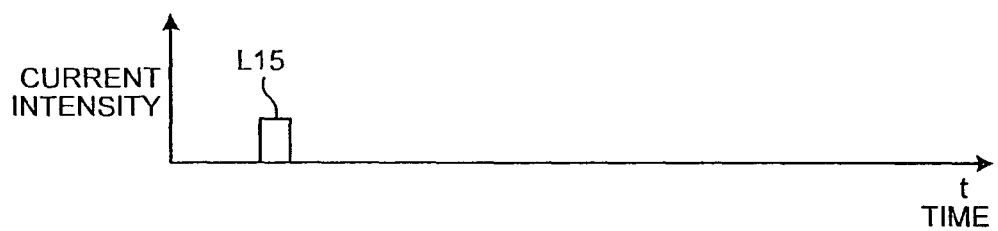
FIG. 11 is a timing chart showing a variation of the amplified output pulse shape when the same current pulse shape is applied between a case where the wavelength shift is executed and a case where the wavelength shift is not executed.
Figure 11B:
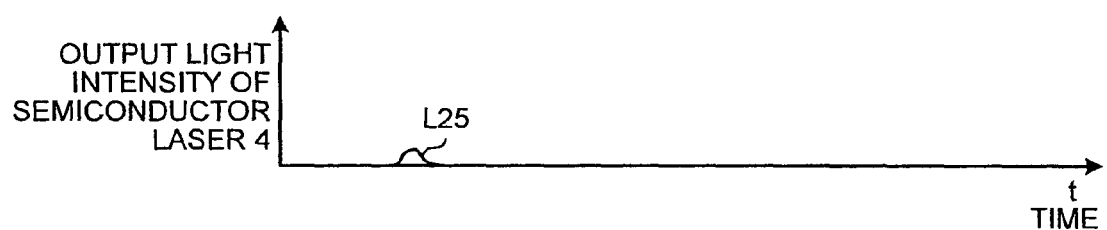
Figure 11C:
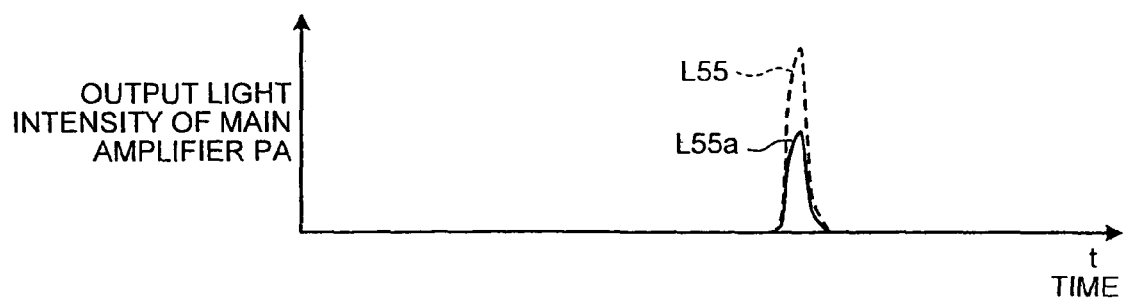

Moreover, as shown in FIG. 10, due to the wavelength controller 7a widely shifting the wavelength from the oscillation wavelength L1 of the amplification line P(20) to the oscillation wavelength L3 of the amplification line P(22) of which gain of the amplification line itself is small, even if the same current pulse shape L15 is inputted, as shown in FIG. 11, it is possible to change the pulse energy. That is, it is possible to output a laser pulse light L55 having outputted from the main amplifier MA as a laser pulse light L55a with a small pulse energy. Also, by executing such wavelength shift control to the amplification lines with different gains, it is possible to increase a dynamic range in adjustment or control of the pulse energy to be finally outputted from the main amplifier MA.

In the first embodiment, by using the semiconductor laser 4 as the master oscillator executing the wavelength control and the wave shape control of the semiconductor laser 4, it is possible to execute the wavelength control and the wave shape control (the pulse energy control, the amplitude control, the pulse width control and the output timing control) of the pulse laser light to be finally outputted from the main amplifier PA. Especially, because the semiconductor laser 4 is a solid device, a high-repetition pulse light with several 100 kHz can be generated by a simple current control as compared with the other gas laser and solid laser, while handling of the semiconductor laser 4 is easy.

As for the wavelength control of the master oscillator, it is not limited to the grating while a wavelength selecting technique using etalon, grating with oblique-incidence arrangement, or the like, can be applied.

In the above-described first embodiment, the semiconductor laser 4 is used as the master oscillator. However, such arrangement is not definite. A molecular gas laser being able to oscillate in the amplification lines of the molecular gas amplifier, which is different from the molecular gas amplifier, can be used.

Second Embodiment

Next, a second embodiment of the present disclosure is described in detail with reference to the accompanying drawings. In the above-described first embodiment, the wavelength control and the wave shape control of the single-longitudinal mode pulse laser light L1 outputted from the single semiconductor laser 4 are executed. On the other hand, in the second embodiment, laser pulse lights outputted from a plurality of single-longitudinal mode semiconductor lasers are combined to change into a multiple lines, and then inputted to the regenerative amplifier 9. Here, with respect to each semiconductor laser with a single-longitudinal mode, a wavelength control and a wave shape control for each of the pulse laser lights are executed. Accordingly, variant desired pulse lights are outputted from the single-longitudinal mode semiconductor lasers.

Figure 12:
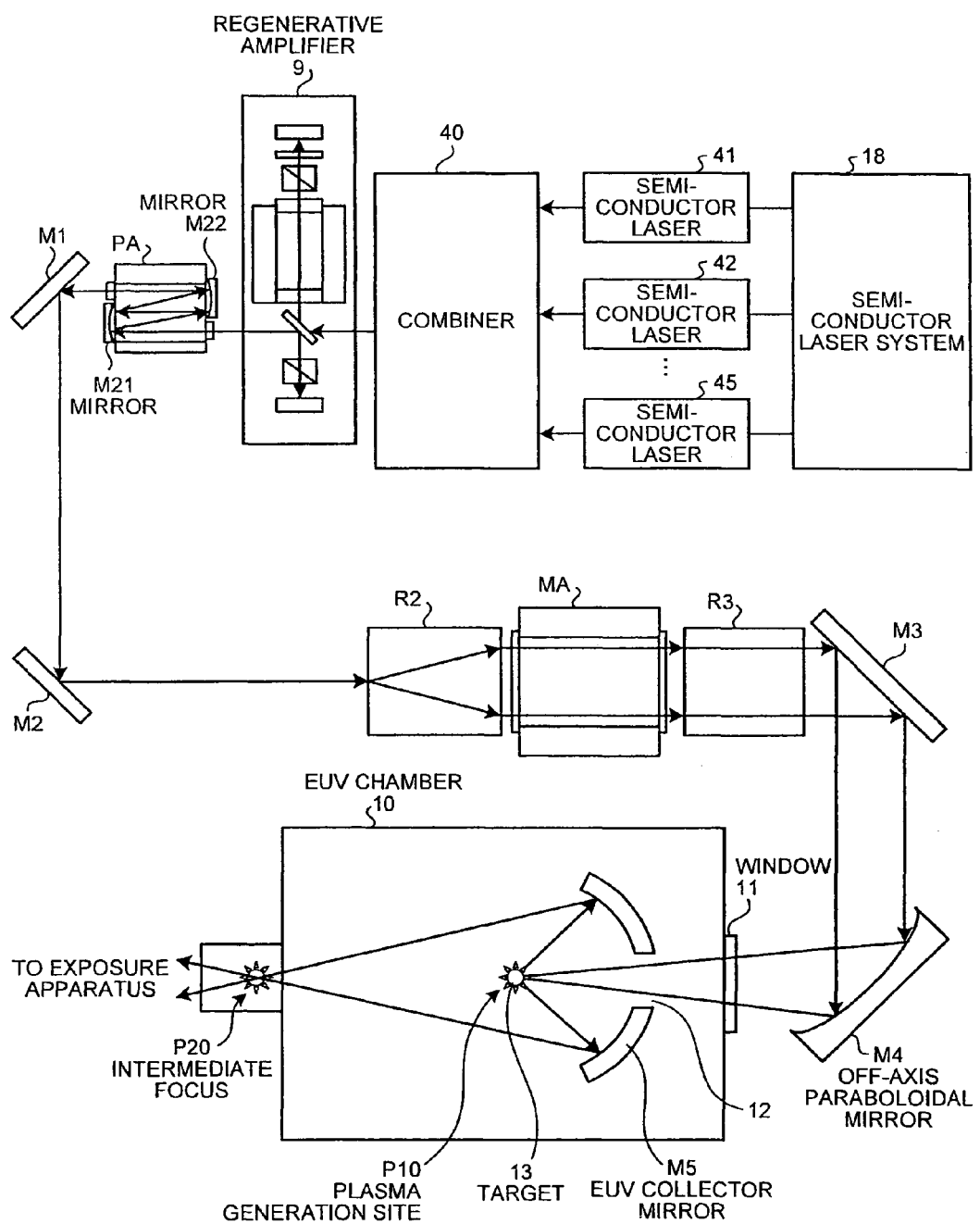
FIG. 12 is a schematic diagram showing a structure of an extreme ultraviolet light source apparatus with a laser apparatus according to a second embodiment of the present disclosure.

FIG. 12 is a schematic diagram showing a structure of an extreme ultraviolet light source apparatus with a laser apparatus according to the second embodiment of the present disclosure. As shown in FIG. 12, the EUV light source apparatus has a plurality of semiconductor lasers 41 to 45 in place of the semiconductor laser 4, and a semiconductor laser system 18 in place of the semiconductor laser system 8. Furthermore, the EUV light source apparatus has a combiner 40 that combines laser lights outputted from each of the semiconductor lasers 41 to 45 and outputs the combined laser lights to the regenerative amplifier 9.

By executing the wavelength control and the wave shape control of each of the semiconductor lasers 41 to 45, the semiconductor laser system 18 amplifies the laser lights outputted from each of the semiconductor lasers 41 to 45 at the multiple lines (a plurality of the amplification lines) of the regenerative amplifier 9, the preamplifier PA and the main amplifier MA. The combiner 40 combines the laser lights with different wavelengths outputted from each of the semiconductor lasers 41 to 45, and outputs the combined laser lights to the regenerative amplifier 9. A structure of each of the semiconductors 41 to 45 is the same as the semiconductor laser 4.

Due to the semiconductor laser system 18 executing the wavelength control and the wave shape control to each of the semiconductor lasers 41 to 45, it is possible to combine and output various pulse laser lights with various pulse shapes. Thereby, compared with the above-described first embodiment, it is possible to further increase the dynamic range. Additionally, by using the multiple-line amplification, it, is possible to increase the amplification efficiency to about 1.3 times the amplification efficiency of a single line.

First Alternate Example of the Second Embodiment

Figure 13A:
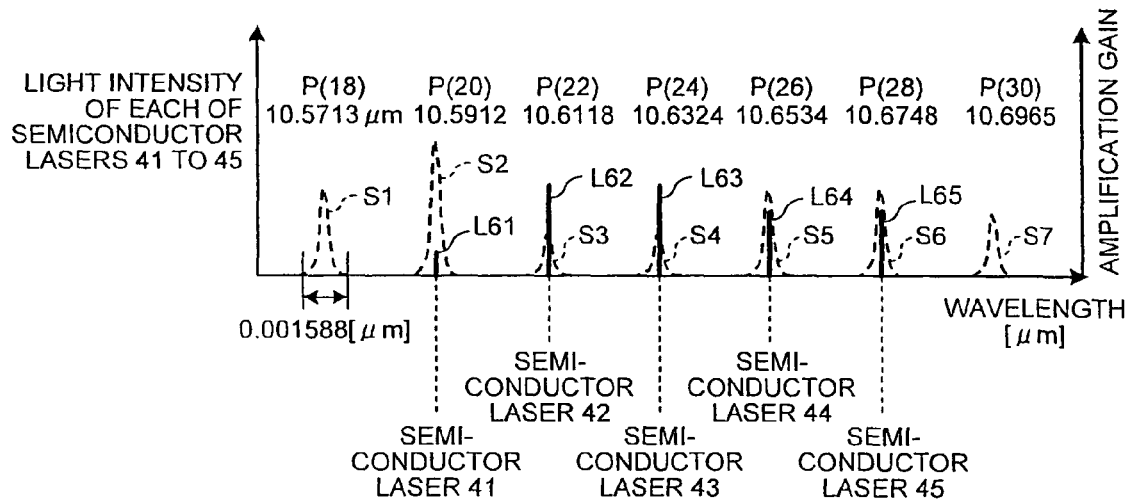
FIG. 13 is an illustration showing a case where light intensities from the main amplifier is made even by adjusting light intensities of oscillation longitudinal modes of semiconductor lasers corresponding to amplifiable regions with different amplification gains in the second embodiment.
Figure 13B:
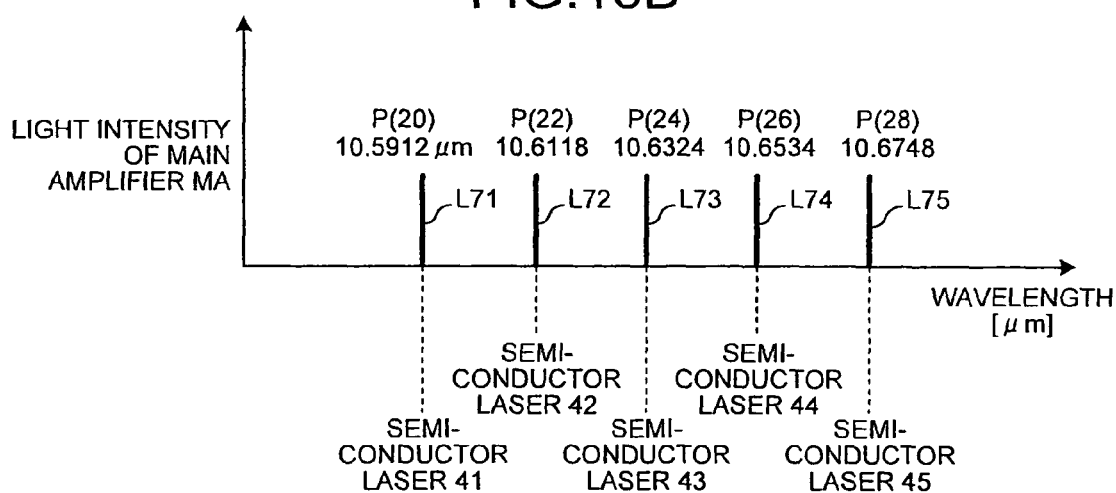

As shown in FIG. 13(a), when wavelengths of the laser lights outputted from the five semiconductor lasers 41 to 45 are distributed to each of the amplification lines S2 to S6 (P(20), P(22), P(24), P(26) and P(28)), a gain of the amplification line S2 is larger than a gain of the amplification line S5 or S6. On the other hand, a gain of the amplification line S3 or S4 is smaller than the gain of the amplification line S5 or S6. Therefore, in the first alternate example of the second embodiment, the semiconductor laser system 18 is arranged to control the semiconductor lasers 41, 44 and 45 using current so that a light intensity of a laser light L61 outputted from the semiconductor laser 41 becomes smaller than the intensity of a laser light L64 or L65 outputted from the semiconductor laser 44 or 45. Moreover, the semiconductor laser system 18 controls the semiconductor lasers 42, 43, 44 and 45 using current so that the light intensity of a laser light L62 or L63 outputted from the semiconductor laser 42 or 43 becomes larger than the light intensity of the laser light L64 or L65 outputted from the semiconductor laser 44 or 45. In other words, the semiconductor laser system 18, as shown in FIG. 13(b), controls the semiconductor lasers 41 to 45 being seed light sources so that light intensities of laser lights L71 to L75 of the amplification lines eventually outputted from the main amplifier MA become approximately equal to one another.

Figure 14A:
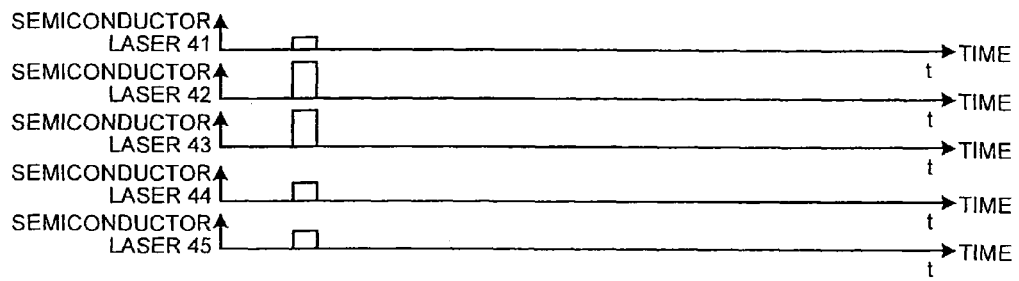
FIG. 14 is a timing chart showing a relationship between current pulse shapes for outputting oscillation longitudinal modes of the semiconductor laser shown in FIG. 13 and output pulse shapes from the main amplifier.

In particular, as shown in FIG. 14(a), by relatively changing an amplitude value of a current pulse shape applied to each of the semiconductor lasers 41 to 45, the semiconductor laser system 18 makes the amplitude values of the current pulse shapes applied to the semiconductor lasers 42 and 43 comparatively smaller than the amplitude values of the current pulse shapes applied to the semiconductor lasers 44 and 45 while making the amplitude value of the current pulse shape applied to the semiconductor laser 41 small.

Figure 14B:
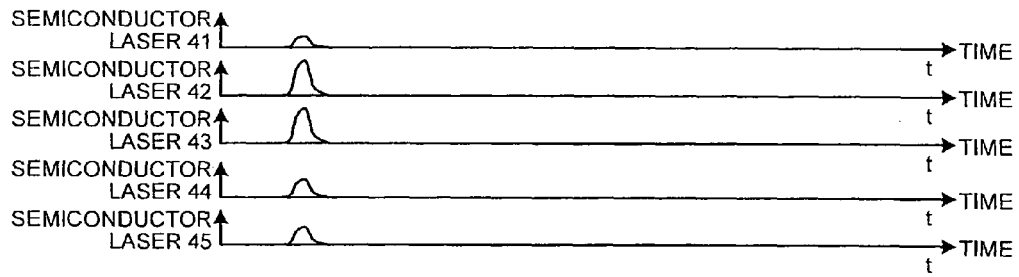
Figure 14C:
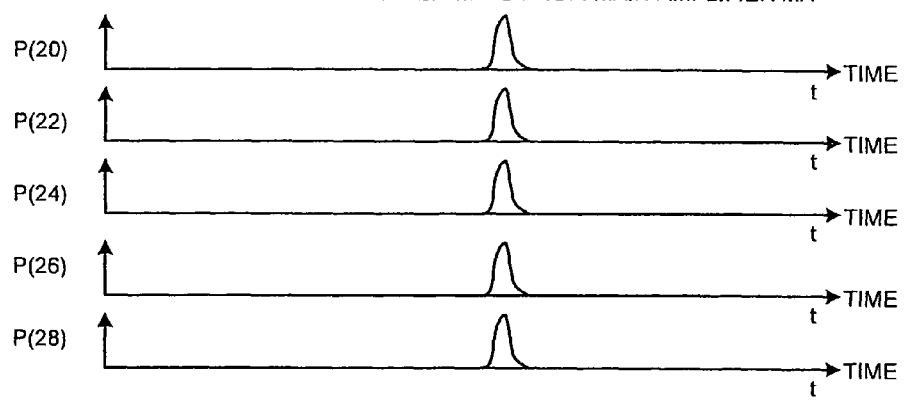
Figure 14D:
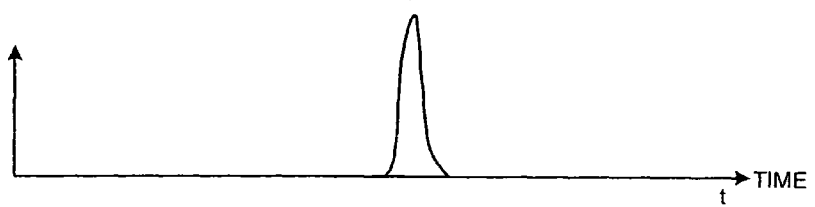

After that, as shown in FIG. 14(b), each of the semiconductor lasers 41 to 45 is outputs a laser light with an output pulse shape of which magnitude depends on the amplitude value of the current pulse shape as inputted to each of the semiconductor lasers 41 to 45. The laser light outputted from each of the semiconductor lasers 41 to 45 is combined by the combiner 40, and then outputted to the side of the regenerative amplifier 9. After that, each laser light is amplified by the preamplifier PA and the main amplifier MA. As a result, as shown in FIG. 14(c), output pulse shapes of the amplification lines from the main amplifier MA are outputted as being approximately the same output pulse shapes. In addition, the pulse laser lights amplified at the amplification lines are outputted from the main amplifier MA synchronously. As a result, as shown in FIG. 14(d), the amplified laser lights L71 to L75 are outputted to the side of the EUV light generation apparatus as an output pulse shape combined in terms of power.

In the first alternate example of the second embodiment, because it is possible to make the intensity of the laser oscillation spectrum of each of the amplification lines in the main amplifier MA approximately even, the amplification efficiency can be improved.

Second Alternate Example of the Second Embodiment

Furthermore, in the second alternate example of the second embodiment, by adjusting the output timing of the pulse laser light to be outputted from each of the amplification lines, it is possible to make the combined output pulse shape of the combined laser light to be finally outputted from the main amplifier MA a desired pulse shape.

Figure 15A:
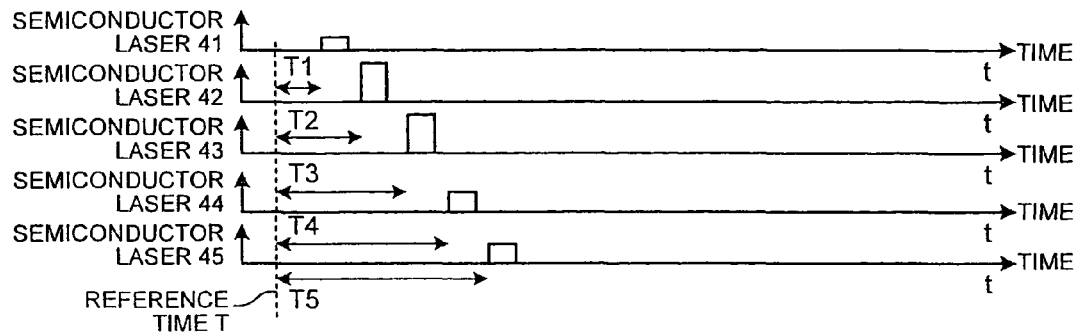
FIG. 15 is a timing chart showing a relationship between a current pulse shape of each of the semiconductor lasers and the output pulse shapes from the main amplifier in a case where an input timing of each of the current pulse shapes to each of the semiconductor lasers is shifted.

That is, as shown in FIG. 15(a), the semiconductor laser system 18 applies a current pulse shape having the same amplitude as in the first alternate example of the second embodiment to the semiconductor lasers 41 to 45. However, in this arrangement, pulse generation timings of the current pulse shapes of each of the semiconductor lasers 41 to 45 are delayed by times T1 to T5 (T1<T2<T3<T4<T5), respectively, from a reference time.

Figure 15B:
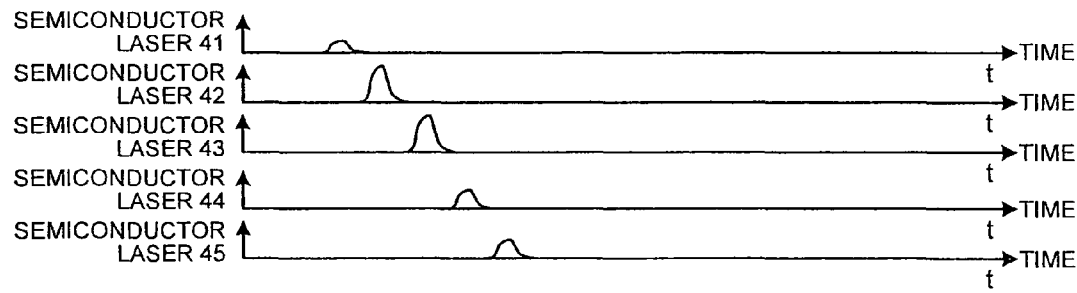
Figure 15C:
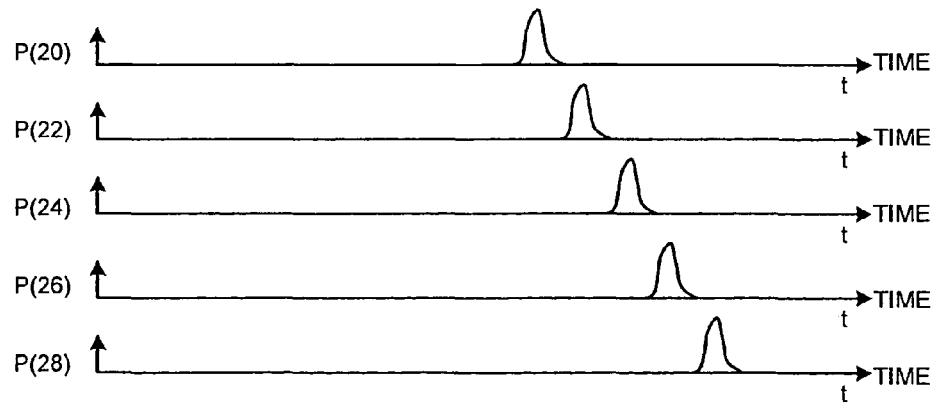

As a result, as shown in FIG. 15(b), the output pulse shapes from each of the semiconductor lasers 41 to 45 are outputted to the side of the regenerative amplifier 9 as being shifted by the times T1 to T5, respectively. After that, each laser light is amplified by the regenerative amplifier 9, the preamplifier PA and the main amplifier MA. Thereby, as shown in FIG. 15(c), the output pulse shapes outputted from each of the amplification lines of the main amplifier MA become output pulse shapes of which output timings are shifted by times T1 to T5, respectively, while being almost the same output pulse shapes. As a result, as shown in FIG. 15(d), the pulse laser lights of each of the amplification lines are outputted to the side of the EUV light generation apparatus as the output pulse shape combined in terms of power on a time axis.

Figure 15D:
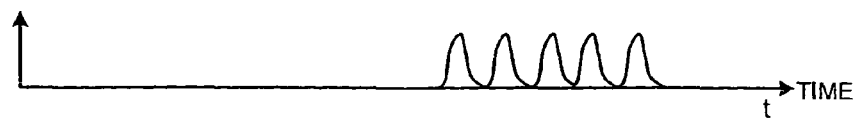
Figure 16A:
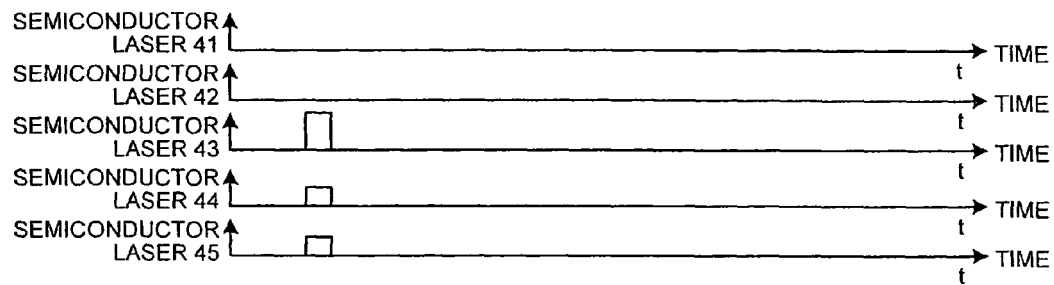
FIG. 16 is a timing chart showing a relationship between each of the current pulse shapes and the output pulse shapes from the main amplifier in a case where a part of oscillation longitudinal modes among oscillation longitudinal modes of the semiconductor lasers shown in FIG. 13 is outputted.
Figure 16B:
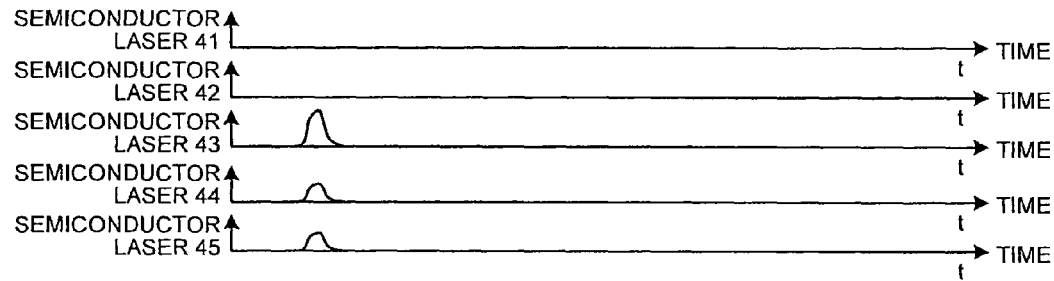
Figure 16C:
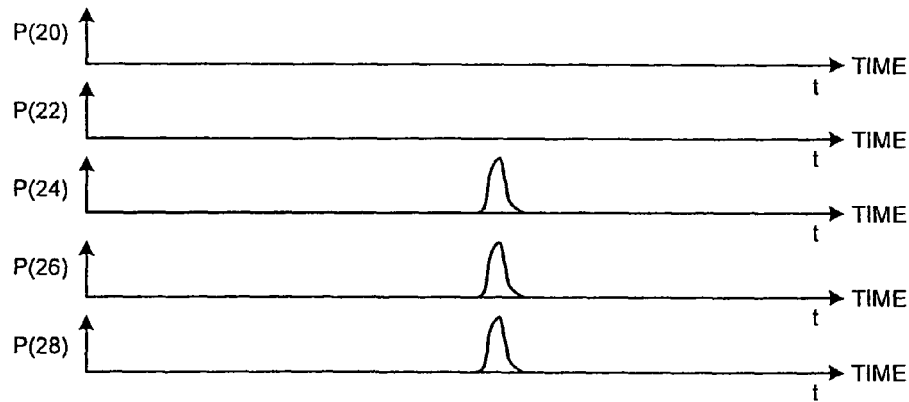
Figure 16D:
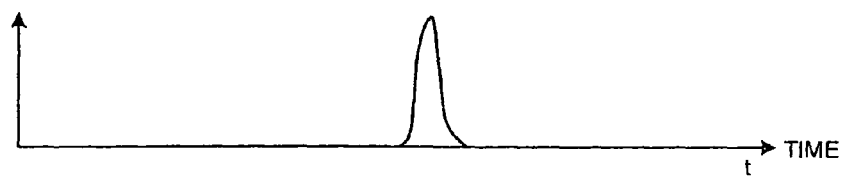

The output pulse shape shown in FIG. 15(d) is the amplified combined output pulse shape outputted from each of the amplification lines with respect to one target irradiation. The combined output pulse shape is a shape showing a plurality of pulses being outputted continuously at desired time intervals. In other words, because the output pulses outputted form each of the amplification lines are pulses that are at extremely highly accurate desired intervals, it is possible to generate a combined output pulse shape where a plurality of the pulses is combined with an extremely high accuracy.

Moreover, by changing the values of the times T1 to T5 or changing the light intensity and the pulse shape of each amplification line, it is possible to generate various combined pulse shapes depending on various purposes. Thus, by using the combined output pulse of which pulse shape can be controlled, it is possible to optimize the luminescence efficiency of the EUV light. Furthermore, by applying the combined laser light with the combined output pulse shape according to the second alternate example to a case where a main pulse is emitted to Sn target after being vaporized or ionized by the prepulse, it is also possible to optimize the luminescence efficiency of the EUV light.

Various combined output pulse shapes outputted from the driver laser are not limited to the EUV light source apparatus but they are also possible to be used for a laser source for laser processing, etc. In this case, because it is possible to generate an optimum combined output pulse suited to various possible irradiation subjects (processing targets), it is possible to improve processing accuracy and processing efficiency.

Third Alternate Example of the Second Embodiment

In the above-described first and second alternate examples of the second embodiment, all of the semiconductor lasers 41 to 45 are arranged to output the laser lights. On the other hand, in a third alternate example of the second embodiment, only some of the semiconductor lasers are used to output a multiple-line pulse laser light. That is, by applying current pulses to some of the semiconductor lasers without applying current pulses to the other semiconductor lasers, the laser pulse lights outputted from some of the semiconductor lasers are amplified by multiple lines. Thereby, it is possible to arbitrarily adjust an energy pulse of a combined output pulse light outputted from the driver laser depending on a purpose.

For instance, as shown in FIG. 16(*a*), current pulse shapes are only applied to the semiconductor lasers 43 to 45 in the first alternate example of the second embodiment. Thereby, as shown in FIG. 16(*b*), a laser light with a combined output pulse shape generated by combining the pulse shapes of the laser lights having outputted from the semiconductor lasers 43 to 45 is outputted to the side of the regenerative amplifier 9. In this situation, as shown in FIG. 16(C), laser pulse lights outputted from respective amplification lines of the main amplifier MA, are synchronous to one other and have almost even output pulse shapes. As a result, as shown in FIG. 16(*d*), the combined output pulse shape becomes a combined output pulse shape where the output pulse shapes outputted from three amplification lines are combined. However, a pulse energy of the combined output pulse light with such combined output pulse shape is smaller than the pulse energy of the combined output pulse light generated by combining the laser lights L61 to L65 outputted from all of the semiconductor lasers 41 to 45 according to the first alternate example of the second embodiment.

As described above, in the third alternate example of the second embodiment, the number of pulse laser lights outputted from each amplification line can be changed. Thereby, in this particular alternate example, it is easily possible to widely change a dynamic range in adjustment or control of energy of a laser light to be finally outputted from the main amplifier MA after being amplified.

Third Embodiment

Next, a third embodiment of the present disclosure will be described in detail with reference to the accompanying drawings. In the above-described first and second embodiments, it is arranged such that the semiconductor laser systems 8 and 18 execute the wavelength control and wave shape control based on previously set control contents, respectively. On the other hand, in the third embodiment, the wavelength control and the wave shape control are feedback-controlled by monitoring the amplified laser light.

Figure 17:
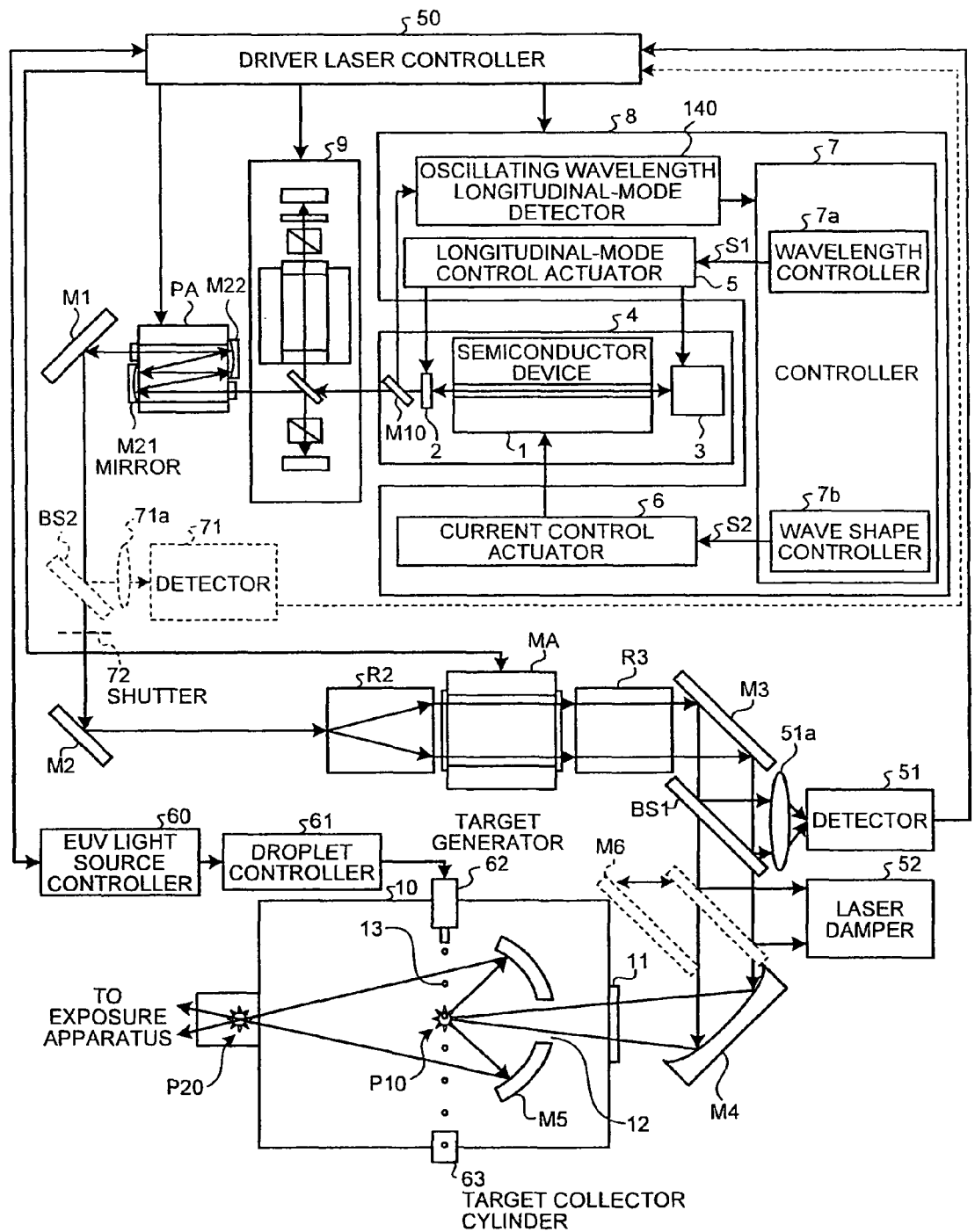
FIG. 17 is a schematic diagram showing a structure of an extreme ultraviolet light source apparatus with a laser apparatus according to a third embodiment of the present disclosure.

FIG. 17 is a schematic diagram showing a structure of an extreme ultraviolet light source apparatus with a laser apparatus according to the third embodiment of the present disclosure. As shown in FIG. 17, the extreme ultraviolet light source apparatus has the same structure as the structure shown in the first embodiment, but further has a driver laser controller 50 which totally controls each of the driver lasers including the semiconductor laser system 8. Moreover, as a structure for monitoring the laser light outputted from the main amplifier MA, the EUV light source apparatus has a beam splitter B Si drawing out a part of the laser light reflected by the HR mirror M3, a focusing lens 51*a* focusing the laser light drawn out by the beam splitter BS1, and a detector 51 detecting a temporal pulse shape and a spectrum shape of the focused laser light. The detection result obtained by the detector 51 is transmitted to the driver laser controller 50. Between the beam splitter BS1 and the off-axis parabolic mirror M4, a HR mirror M6 which is removable in an optical path is arranged while a laser dumper 52 absorbing a laser light reflected by the HR mirror M6 will be arranged on the optical path when the HR mirror M6 is inserted to the optical path. The HR mirror M6 is arranged on the optical path, in order to prevent the laser light outputted from the main amplifier MA from entering the side of the EUV light generation apparatus, Moreover, the semiconductor laser 4 has a beam splitter M10 that draws out a part of an output light. The beam splitter M10 is arranged at a side of the output coupling mirror 2. Moreover, the semiconductor laser system 8 has an oscillation wavelength longitudinal mode detector 140 that detects a longitudinal mode wavelength by detecting a part of the laser light reflected by the beam splitter M10. The detection result obtained by the oscillation wavelength longitudinal mode detector 140 is transmitted to the wavelength controller 7*a* of the controller 7.

Here, it is possible to arrange a beam splitter BS2, a focusing lens 71*a* and a detector 71 at a back stag of the preamplifier PA instead of the beam splitter BS1, the focusing lens 51*a* and the detector 51. In this case, the detection result obtained by the detector 71 is transmitted to the driver laser controller 50. In this structure, the intensity of the laser light outputted from the preamplifier PA is smaller than the intensity of the laser light outputted from the main amplifier MA. Therefore, small optical elements with little resistance can be used. Furthermore, in this structure, because the intensity of the laser light is small, it is possible to replace the structure of the HR mirror M6 and the laser dumper 52 with a simple shutter 72 which can be arranged at a latter stage of the beam splitter BS2.

Although, the case where the output light from the preamplifier PA is to be monitored has been explained as an example in the third embodiment, this example is not definite. For instance, the output light from the regenerative amplifier 9 can also be monitored using the same structure as in the above-described third embodiment. That is, as long as the laser pulse light after being amplified by passing through the amplifier having a $CO_2$ gas as an amplifiable agent can be monitored, any modification of the structure is possible.

As shown in FIG. 17, the EUV light source apparatus has a target generator 62 supplying the target 13, a target collector cylinder 63 collecting residual targets after generation of plasma, a droplet controller 61 driving and controlling the target generator 62, a driver laser controller 50 controlling the driver laser, and an EUV light source controller 60 controlling generation of EUV light by controlling at least the droplet controller 61 and the driver laser controller 50.

Next, with referring to a flowchart shown in FIG. 18, a control process procedure including wavelength control and wave shape control by the driver laser controller 50 and the semiconductor laser system 8 will be described in detail. Firstly, the driver laser controller 50 controls the semiconductor laser system 8 based on the detection result obtained from the oscillation wavelength longitudinal mode detector 140 so that the wavelengths of the semiconductor laser 4 that oscillates a single-longitudinal mode are included in the amplification lines of the regenerative amplifier 9, the preamplifier PA and the main amplifier MA (step S101: wavelength control-and-output process).

After that, the driver laser controller 50 detects a temporal pulse shape and a spectrum shape of a $CO_2$ laser light outputted from the main amplifier MA (step S102: detection process). Furthermore, the driver laser controller 50 calculates a difference $\Delta E$ (=Et−E) between a value of the detection result and a desired value Et (step S103: calculation process).

Then the driver laser controller 50 executes a determination process to determine whether the difference $\Delta E$ is within a desired range $\Delta Er$ ($\Delta Er \geq |\Delta E|$) (step S104). When the difference $\Delta E$ is within the desired range $\Delta Er$ (the step S104, Yes), the driver laser controller 50 executes a feedback control transmitting a control signal to the semiconductor laser system 8 so as to change the detection result E by the difference $\Delta E$ (step S105: control process). After that, the driver laser controller 50 executes a process of emitting a $CO_2$ laser light to the target (step S106), and then progresses to the step S101 and repeats the above-described processes.

On the other hand, when the difference $\Delta E$ is not within the desired range $\Delta Er$ (the step S104, No), the driver laser controller 50 executes a process of preventing the target from being irradiated with the $CO_2$ laser light (step S107), and then executes the feedback control transmitting the control signal to the semiconductor laser system 8 so as to change to be detection result E by the difference ΔE (step S108: control process). After that, the driver laser controller 50 progresses to the step S101 and repeats the above-described processes.

Here, the process in the step S107 is realized by guiding the laser light reflected by the HR mirror M6 to the laser dumper 52 while preventing the laser light from entering the side of the EUV light generation apparatus by inserting the HR mirror M6 to the optical path. However, if the driver laser controller 50 uses the detector 71 in place of the detector 51, it is possible to shut off the optical path by a shutter 72.

Moreover, the driver laser controller 50 can output a target generation disable signal for stopping generation of the target 13 by the target generator 62 via the EUV light source controller 60 and the droplet controller 61. In this case, because the target 13 is not supplied to the plasma generation site P10, the EUV light will not be generated even if the laser light enters from the main amplifier MA to the side of the EUV light generation apparatus. As a result, the EUV light is not outputted to the side of the exposure apparatus.

Alternatively, it is also acceptable to displace the target generation timing by the target generator 62 and the laser pulse irradiation timing of the side of the driver laser in order to prevent the target 13 from being irradiated with the laser light. In this case, either or both of the target generation timing and the laser pulse irradiation timing can be delayed.

Furthermore, it is also possible to displace an optical axis of the laser light outputted from the side of the driver laser in order to prevent the target 13 from being irradiated with the laser light. Moreover, for instance, it is also possible to displace an optical axis of the EUV collector mirror M5 in order to prevent the generated EUV light from being outputted to the side of the exposure apparatus.

Figure 19:
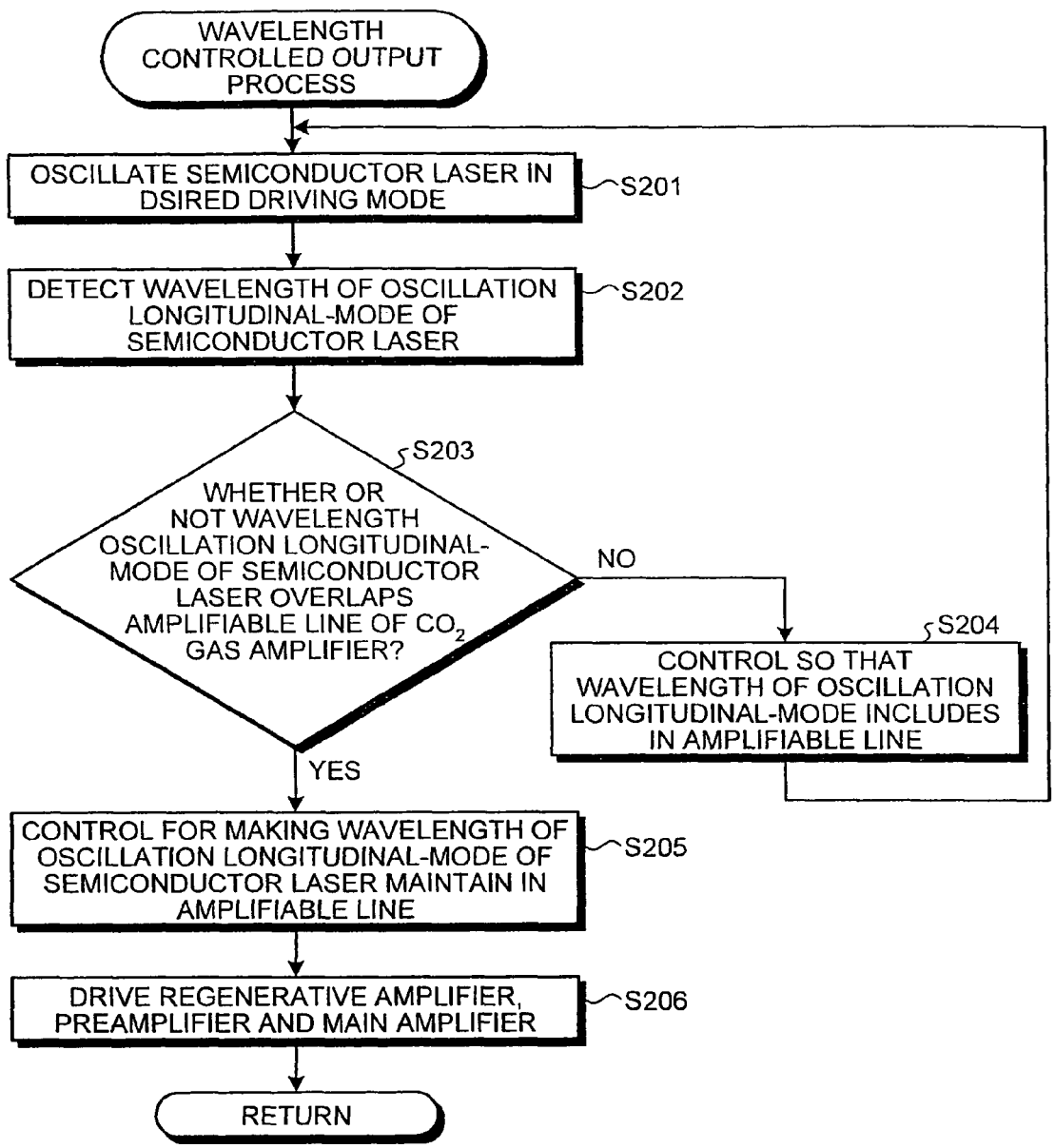
FIG. 19 is a detailed flowchart showing a process procedure of a wavelength control-and-output process shown in FIG. 18.

Here, the wavelength control-and-output process in the step S101 will be described in detail with reference to a flowchart shown in FIG. 19. Firstly, the semiconductor laser system 9 oscillates the semiconductor laser 4 in a previously set driving mode, i.e. with a predetermined pulse shape of which repetition frequency is several 100 kHz, for instance (step S201). In this case, it is preferable to previously set an approximate resonator length of the resonator. Then, the semiconductor laser system 8 detects a current oscillation longitudinal mode wavelength using the oscillation wavelength longitudinal mode detector 140 (step S202). After that, the semiconductor laser system 8 makes the longitudinal mode controller 4 determine whether the oscillation longitudinal mode wavelengths of the semiconductor laser 4 overlap the amplification lines of the regenerative amplifier 9, the preamplifier PA and the main amplifier MA as being $CO_2$ gas amplifiers (step S203).

When the oscillation longitudinal mode wavelengths of the semiconductor laser 4 do not overlap the amplification lines of the regenerative amplifier 9, the preamplifier PA and the main amplifier MA (the step S203, No), the semiconductor laser system 8 fine-tunes the oscillation longitudinal mode wavelength by driving and controlling the optical path length of the laser resonator, the grating 21, and so on, via the longitudinal mode control actuator 5 so that the wavelengths of the oscillation longitudinal mode of the semiconductor laser 4 are included in the amplification lines (step S204), and then progresses to the step S201.

On the other hand, when the oscillation longitudinal mode wavelengths of the semiconductor laser 4 overlap the amplification lines of the regenerative amplifier 9, the preamplifier PA and the main amplifier MA (the step S203, Yes), the semiconductor laser system 8 executes a control for maintaining the current condition where the wavelengths of the oscillation longitudinal mode of the semiconductor laser 4 are included in the amplification lines (step S205). After that, the semiconductor laser 8 drives the regenerative amplifier 9, the preamplifier PA and the main amplifier MA to be amplifiable (step S206), and then returns to the step S101. By this arrangement, it is possible to irradiate the target 13 with an amplified laser light amplified with high efficiency under the condition where the oscillation longitudinal mode wavelengths of the semiconductor laser 4 overlap the amplification lines of the preamplifier PA and the main amplifier MA.

Figure 20:
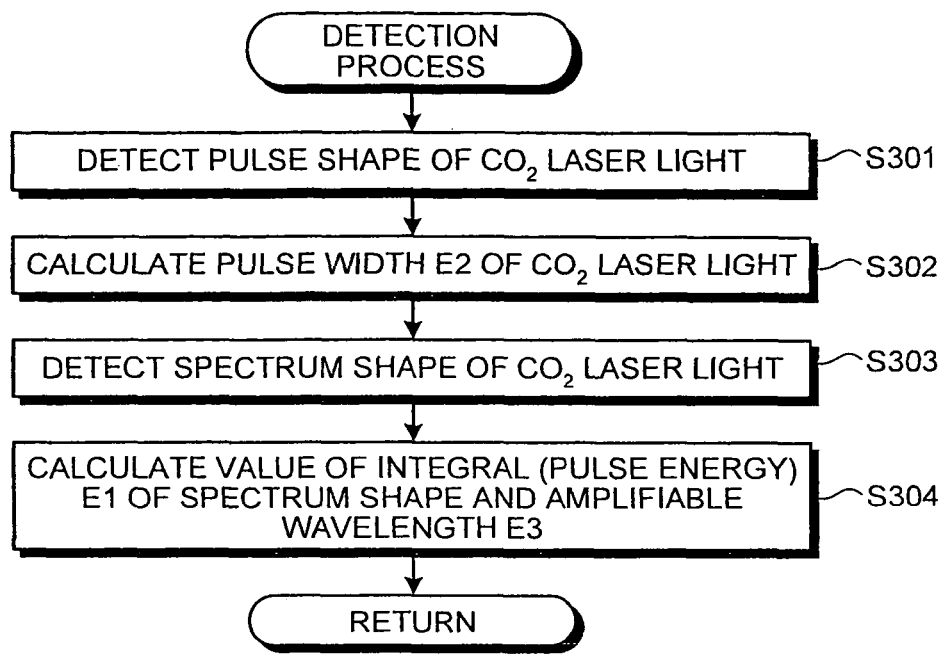
FIG. 20 is a detailed flowchart showing a process procedure of a detection process shown in FIG. 18.

Next, the detection process procedure in the step S102 will be described in detail with reference to a flowchart shown in FIG. 20. Firstly, the detector 51 lets the $CO_2$ laser light outputted from the main amplifier MA enter via the beam splitter BS1 and the focusing lens 51a and detects a time pulse shape of the $CO_2$ laser light (step S301). Then, the detector 51 calculates a pulse width E2 of the $CO_2$ laser light based on the obtained detection result (step S302). Furthermore, the detector 51 detects a spectrum of the $CO_2$ laser light (step S303). Then, the detector 51 calculates a value of integration E1 of the spectrum shape and an amplifiable wavelength E3 from the spectrum shape (step S304), and then returns to the step S102. That is, in the detection process, the pulse energy E1, the pulse width E2 and the amplifiable wavelength E3 are detected.

Depending on the contents of the feedback control, it is also possible to detect at least one or a possible combination among the pulse energy E1, the pulse width E2 and the amplifiable wavelength E3 instead of detecting of them. In the step S304, the pulse energy E1 is obtained from the value of integral of the spectrum shape. However, such arrangement is not definite while it is also possible to obtain the pulse energy E1 directly from a power meter or from a time pulse shape.

Figure 21:
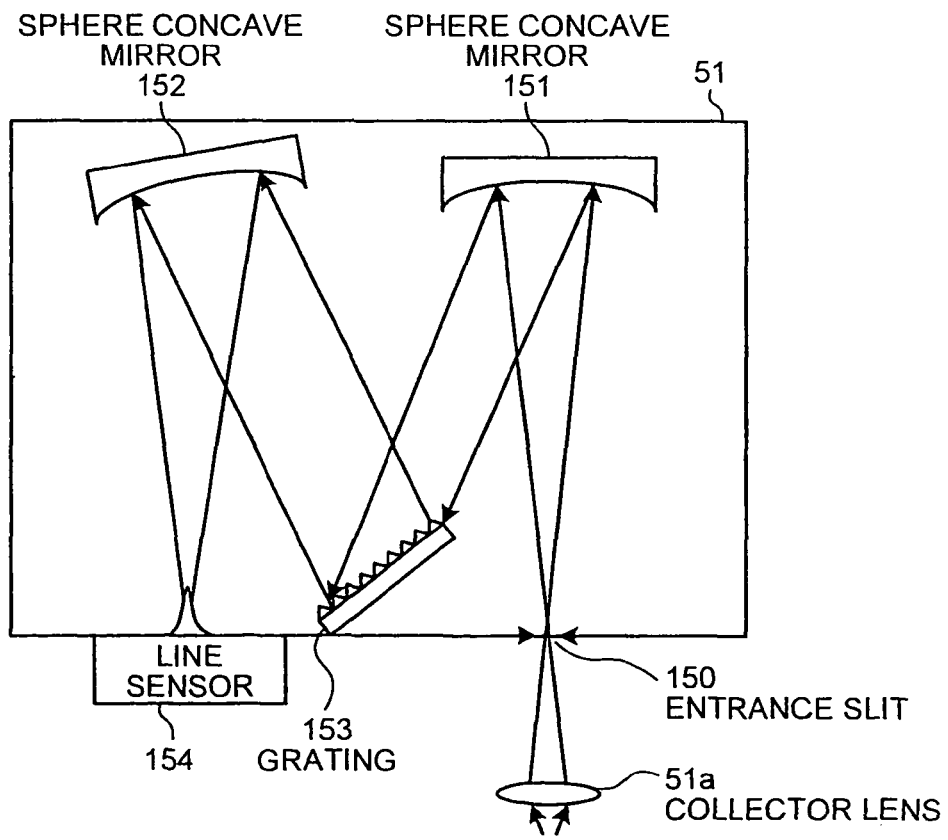
FIG. 21 is a schematic diagram showing a structure of a spectroscope being an example of a detector that detects a spectrum shape, according to the third embodiment.

A structure with which the detector 51 obtains the spectrum shape can be a grating-type spectroscope as shown in FIG. 21. In FIG. 21, the laser light emitted from the focusing lens 51a is inputted to the spectroscope via the entrance slit 150. In the spectroscope, the light passing through the entrance slit 150 is transformed into a collimate light by the sphere concave mirror 151. The collimate light is diffracted by entering the grating 153, and then outputted to the sphere concave mirror 152. The sphere concave mirror 152 focuses the incident light so as to transcribe a diffracted image of the entrance slit 150 on a line sensor 154. A transcript position on the line sensor 154 is in a proportional relation with a wavelength. Therefore, the detector 51 can obtain the amplifiable wavelength E3 and the pulse energy E1 being the value of integral of the spectrum shape.

In the third embodiment, although the example of the spectroscope based on the grating used as the spectrum detector as been shown, it is also possible to detect the spectrum by a spectroscope using an etalon spectroscope or interferometer.

Figure 22:
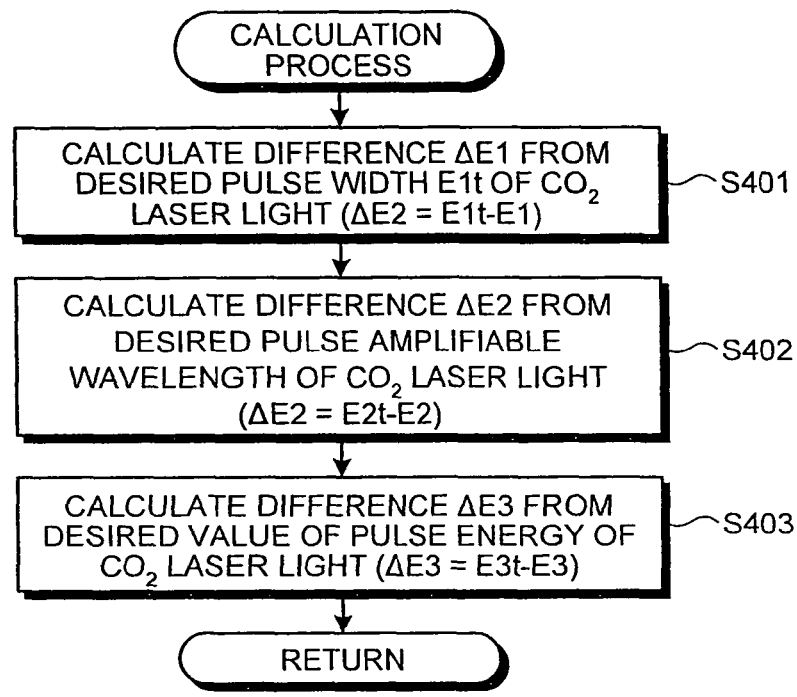
FIG. 22 is a detailed flowchart showing a process procedure of a calculation process shown in FIG. 18.

Furthermore, the calculation process procedure in the step S103 will be described in detail with reference to a flowchart shown in FIG. 22. In the calculation process, the driver laser controller 50, firstly calculates a difference $\Delta E1$ ($=E1t-E1$) between a value of a desired pulse energy $E1t$ of a $CO_2$ laser light and a value of a detected pulse energy E1 (step S401). Furthermore, the driver laser controller 50 calculates a difference $\Delta E2$ ($=E2t-E2$) between a value of a desired pulse width $E2t$ of the $CO_2$ laser light and a value of a detected pulse width E2 (step S402). Furthermore, the driver laser controller 50 calculates a difference $\Delta E3$ ($=E3t-E3$) between a value of a desired amplifiable wavelength $E3t$ of the $CO_2$ laser light and a value of a detected amplifiable wavelength E3 (step S403), and then returns to the step S103).

Figure 23:
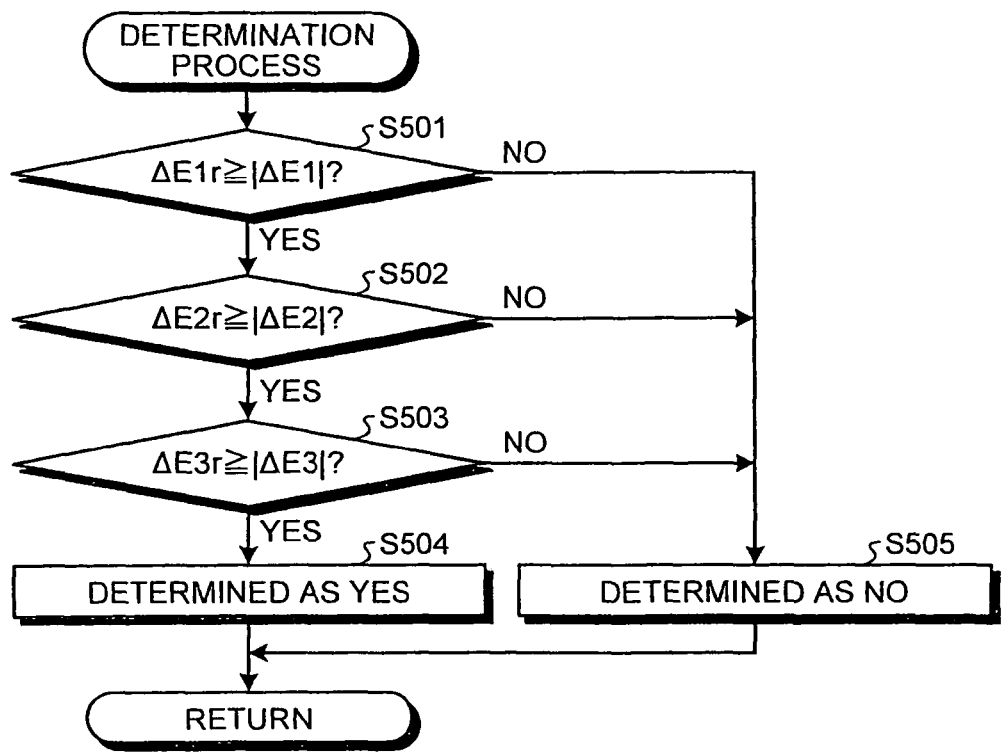
FIG. 23 is a detailed flowchart showing a process procedure of a determination process shown in FIG. 18.

Moreover, the determination process procedure in the step S104 will be described in detail with reference to a flowchart shown in FIG. 23. In FIG. 23, the driver laser controller 50 determines whether an absolute value of the difference $\Delta E1$ calculated in the step S103 is within a desired range $\Delta E1r$ ($\Delta E1r \geq |\Delta E1|$) (step S501). When the absolute value of the difference $\Delta E1$ is within the desired range $\Delta E1r$ (the step S501, Yes), the driver laser controller 50 further determines whether an absolute value of the difference $\Delta E2$ having been calculated in the step S103 is within a desired range $\Delta E2r$ ($\Delta E2r \geq |\Delta E2|$) (step S502). When the absolute value of the difference $\Delta E2$ is within the desired range $\Delta E2r$ (the step S502, Yes), the driver laser controller 50 further determines whether an absolute value of the difference $\Delta E3$ having been calculated in the step S103 is within a desired range $\Delta E3r$ ($\Delta E3r \geq \Delta E3$) (step S503). When the absolute value of the difference $\Delta E3$ is within the desired range $\Delta E3r$ (the step S503, Yes), the driver laser controller 50 determines as "Yes" (step S504), and then returns to the step S104.

On the other hand, in case where the absolute value of the difference $\Delta E1$ is not within the desired range $\Delta E1r$ (the step S501, No), where the absolute value of the difference $\Delta E2$ is not within the desired range $\Delta E2r$ (the step S502, No), or where the absolute value of the difference $\Delta E3$ is not within the desired range $\Delta E3r$ (the step S503, No), the driver laser controller 50 determines as "No" (step S505), and then returns to the step S104. That is, if at least one of the conditions in the steps S501 to S503 is not satisfied, the driver laser controller 50 determines as "No" in the step S505.

Figure 24:
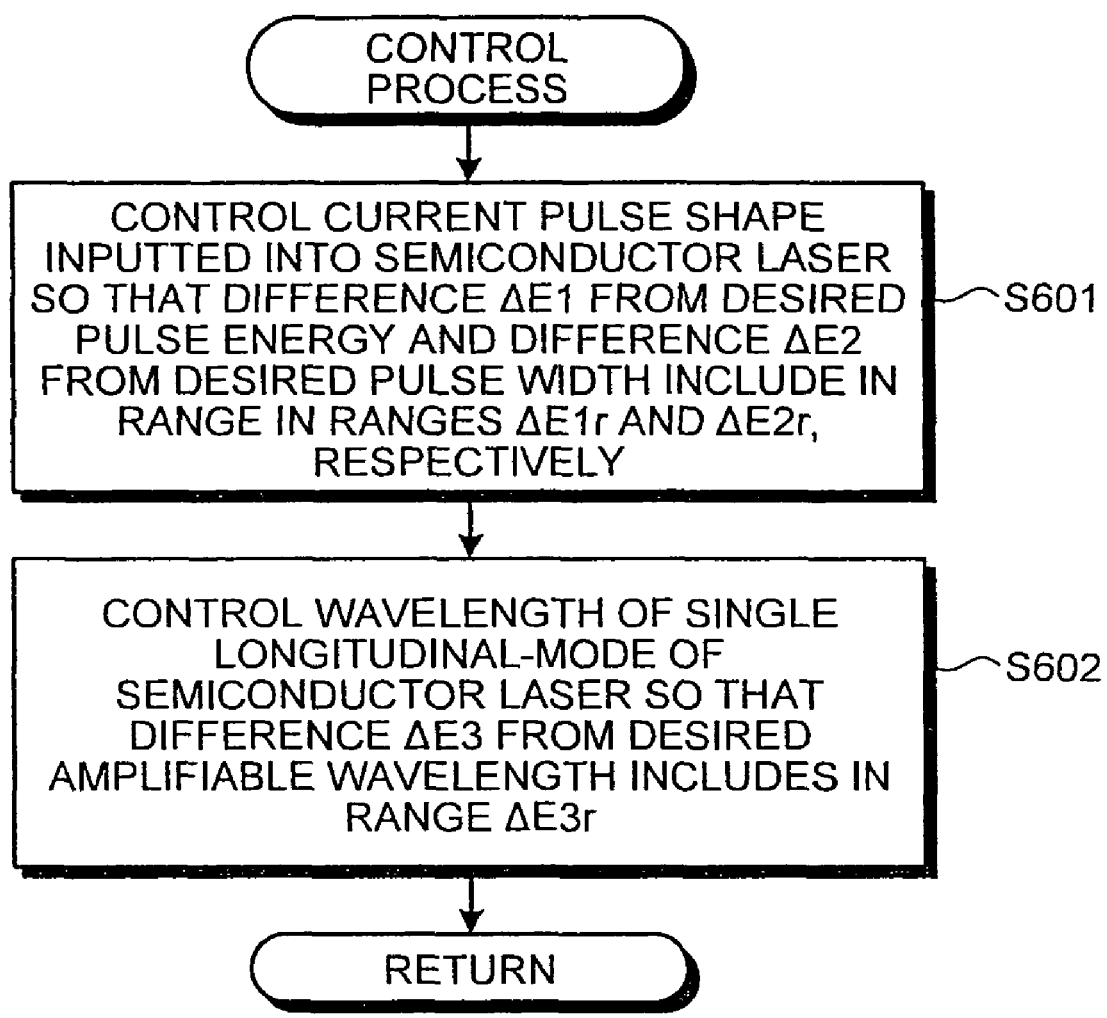
FIG. 24 is a detailed flowchart showing a process procedure of a control process shown in FIG. 18.

Furthermore, the control process procedures in the steps S105 and S108 will be described in detail with reference to a flowchart shown in FIG. 24. As shown in FIG. 24, the semiconductor laser system 8 controls a current pulse shape for the semiconductor laser 4 based on the control signal inputted from the driver laser controller 50 so that the difference $\Delta E1$ between the detected pulse energy E1 and the desired pulse energy E1t becomes within $\Delta E1r$ and the difference $\Delta E2$ between the detected pulse width E2 and the desired pulse width E2t becomes within $\Delta E2r$ (step S601). Furthermore, the semiconductor laser system 8 controls a wavelength of the single-longitudinal mode of the semiconductor laser 4 so that the detected difference $\Delta E3$ between the amplifiable wavelength E3 becomes within $\Delta E3r$ (step S602), and then, returns to the step S105 or the step S108. This control process is substantially a feedback control process.

Alternate Example of the Third Embodiment

Figure 25:
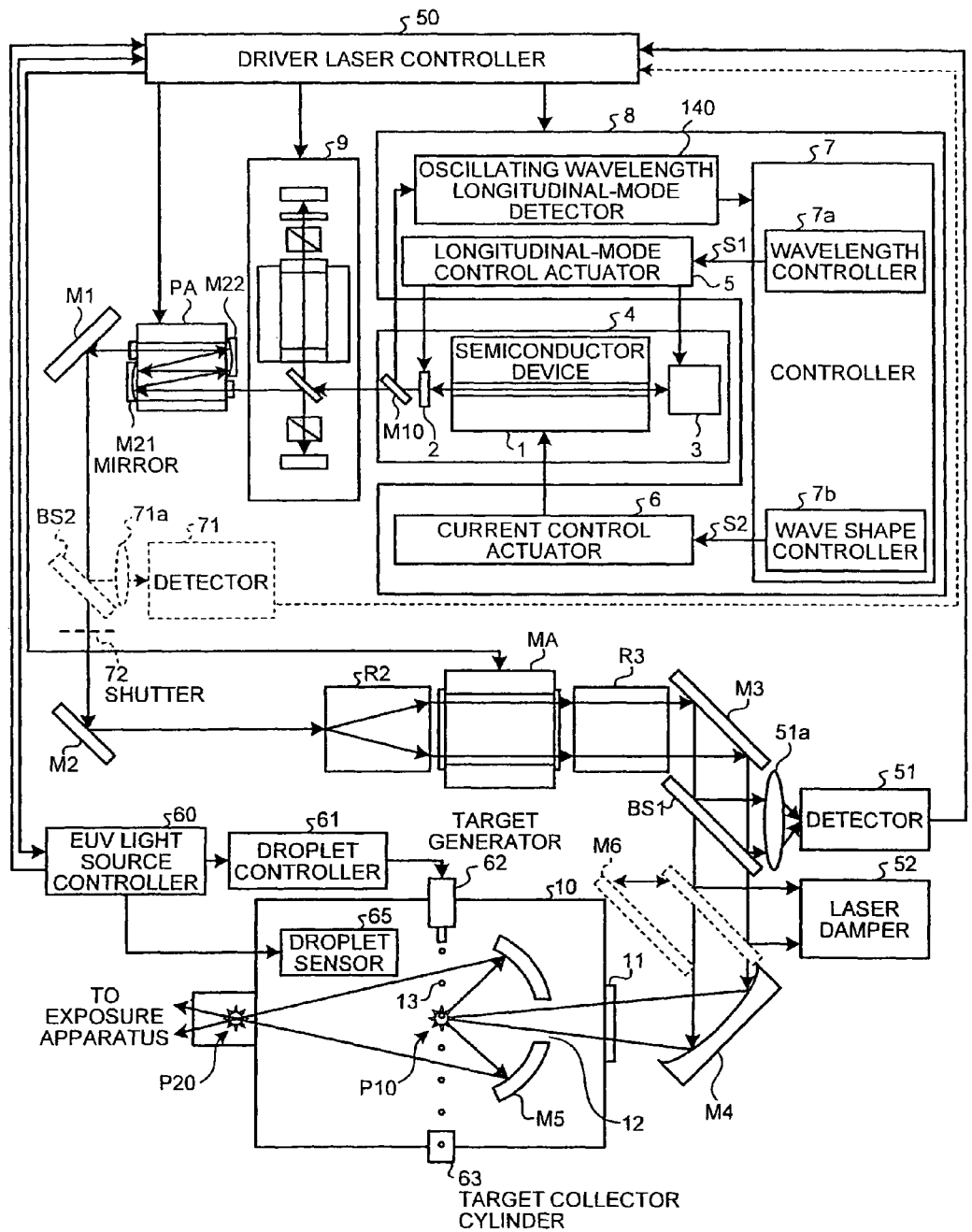
FIG. 25 is a schematic diagram showing a structure of an extreme ultraviolet light source apparatus with a laser apparatus according to an alternate example of the third embodiment.
Figure 26A:
FIG. 26 is a timing chart showing a relationship among an oscillation trigger, a current pulse shape and an amplified output pulse shape in a case where a current pulse shape is changed, according to the third embodiment.
Figure 26B:
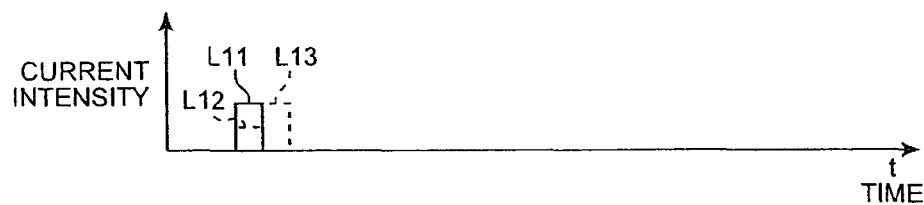
Figure 26C:
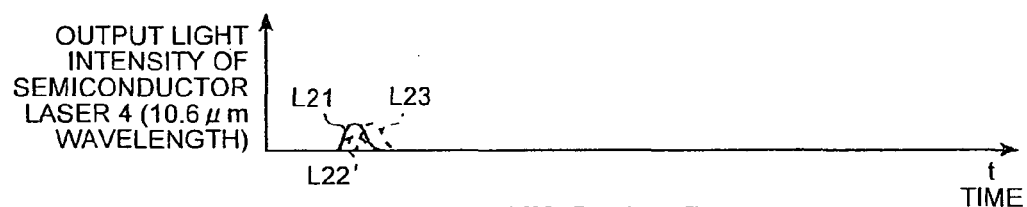
Figure 26D:
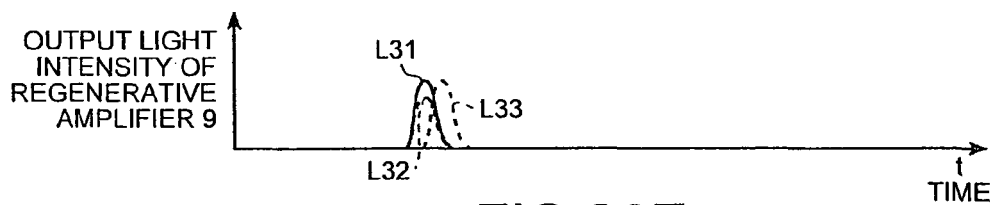
Figure 26E:
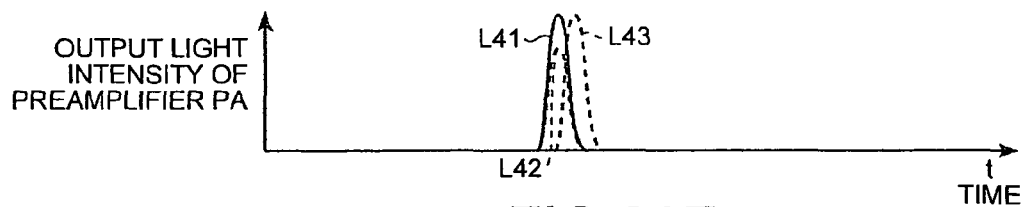
Figure 26F:
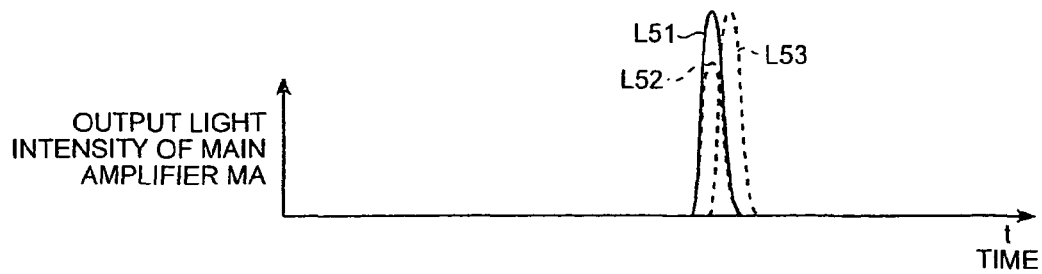

In the above-described third embodiment, the timing when the wavelength controller 7b makes the current actuator 6 oscillate the current pulse can be inputted from external. In this case, in the EUV chamber 10, as shown in FIG. 25, for instance, in addition to the structure shown in FIG. 17, a droplet sensor 65 detecting an output timing and a speed of the droplet 13 outputted from the droplet generator 62 is arranged. The output timing and the speed detected by the droplet sensor 65 are inputted to the driver laser controller 50 via the EUV light source controller 60. The driver laser controller 50, as shown in FIG. 26(a), for instance, inputs an oscillation trigger into the controller 7 at a timing of making the semiconductor laser 4 oscillate the longitudinal mode pulse laser light. The wavelength controller 7b in the controller 7, as shown in FIG. 26(b), controls the current control actuator 6 so that a current pulse is inputted to the semiconductor laser 4 at the timing of the oscillation trigger is inputted from the external. Thereby, the seed pulse laser light of which current pulse shapes L11, L12 and L13 are controlled by the current magnitude is outputted at the timing controlled by the oscillation trigger from the external. Since FIGS. 26(c) to 26(f) are the same as FIGS. 7(b) to 7(e), redundant explanations thereof will be omitted herein.

Figure 18:
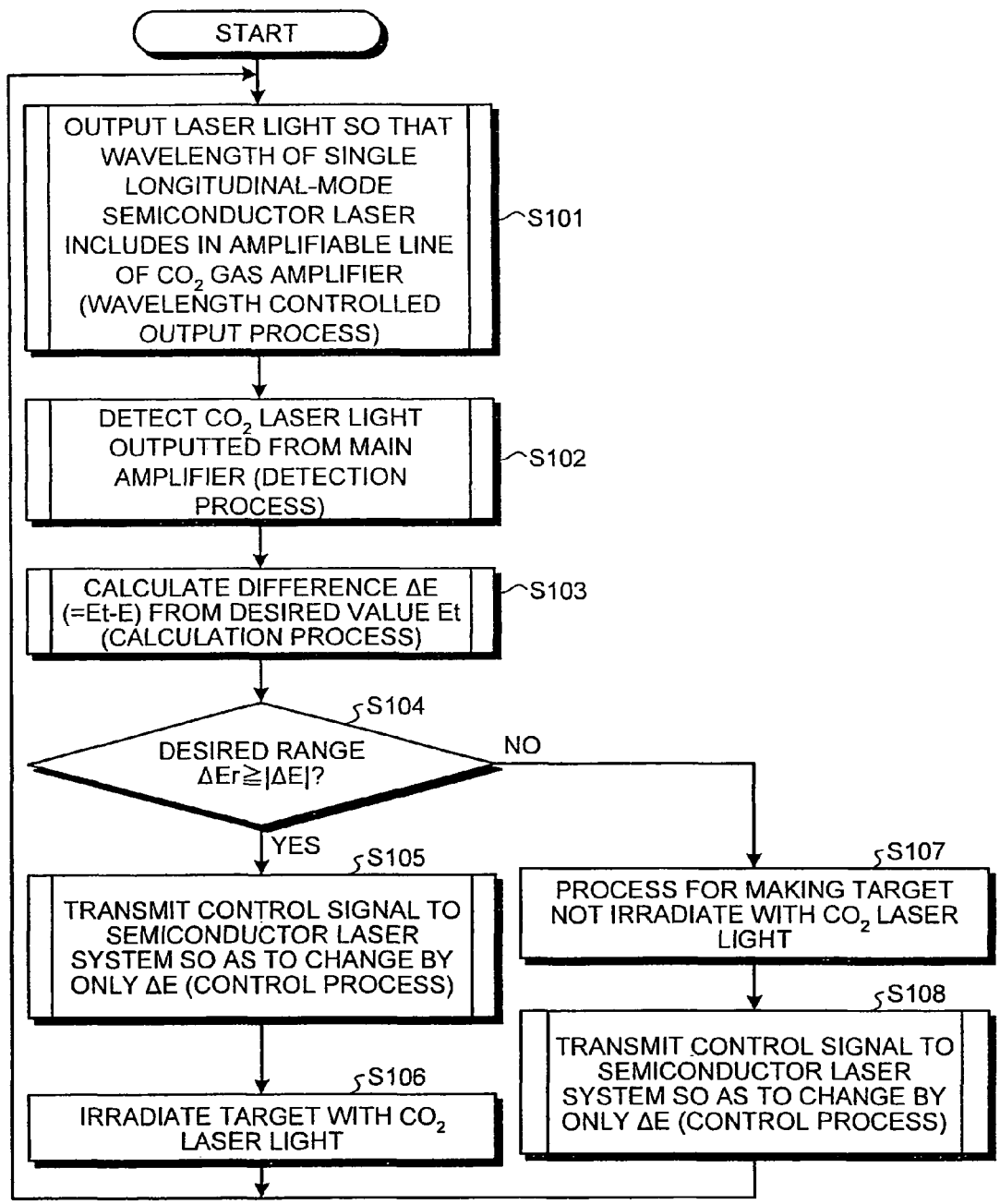
FIG. 18 is an overall flowchart showing a control process procedure by a driver laser controller and a semiconductor laser system shown in FIG. 17.
Figure 27:
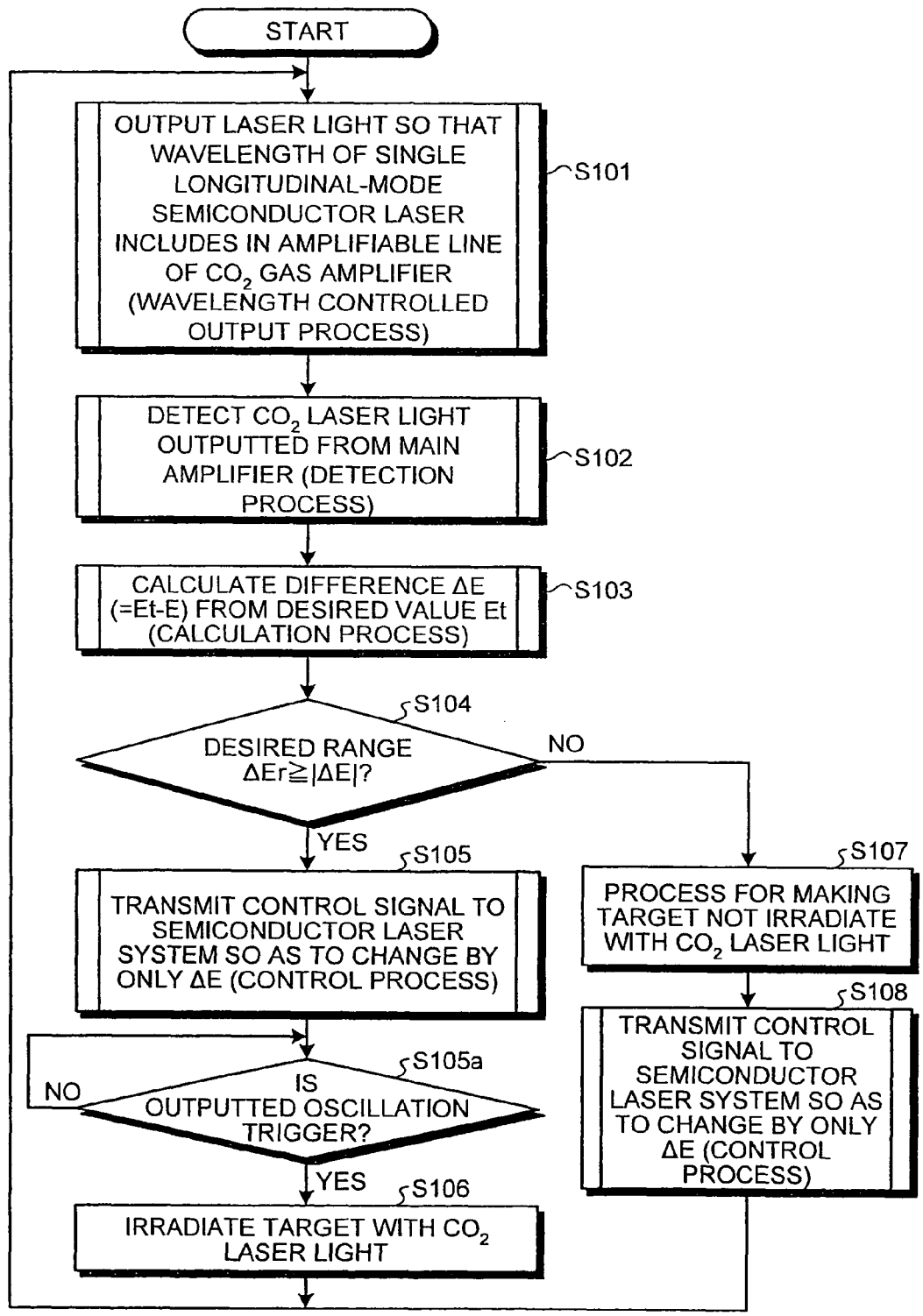
FIG. 27 is an overall flowchart showing a control process procedure by a driver laser controller and a semiconductor laser system shown in FIG. 25.

Furthermore, in the control process procedure including the wavelength control and the wave shape control by the driver laser controller 50 and the semiconductor laser system 8, as shown in FIG. 27, in the same procedure as the procedure shown in FIG. 18, a step of determining whether the driver laser controller 50 outputs the oscillation trigger is arranged (step S105a) after the control process of the step S105. By this arrangement, it is possible to realize a structure within the current actuator 6 is made of oscillate the current pulse based on the timing received from the external (the driver laser controller 50, for instance).

Fourth Embodiment

Next, a fourth embodiment of the present disclosure will be described in detail with reference to the accompanying drawings. The fourth embodiment is a case combining the multiple line amplification shown in the second embodiment and the feedback control shown in the third embodiment.

Figure 28:
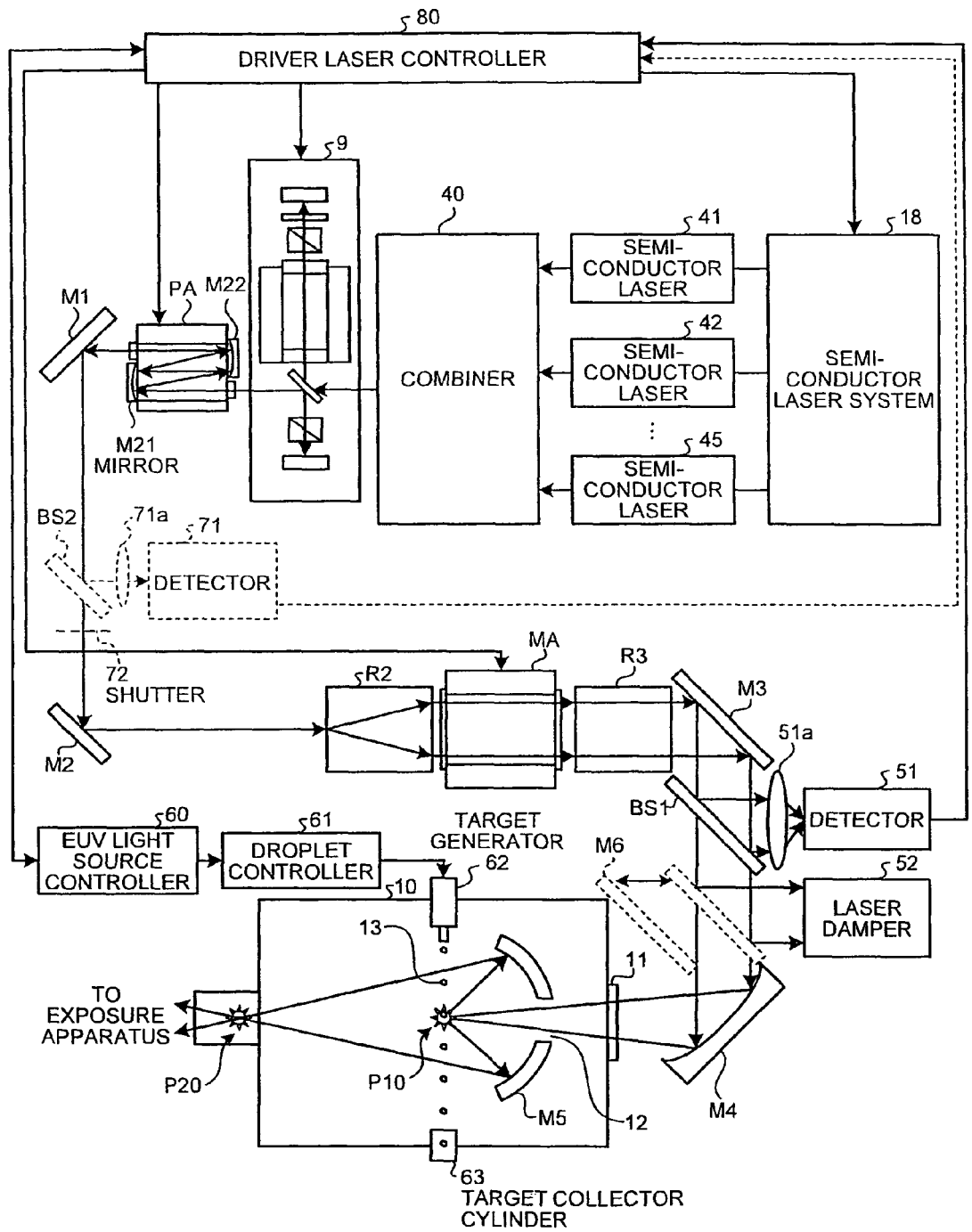
FIG. 28 is a schematic diagram showing a structure of an extreme ultraviolet light source apparatus with a laser apparatus according to a fourth embodiment of the present disclosure.

FIG. 28 is a schematic diagram showing a structure of an extreme ultraviolet light source apparatus with a laser apparatus according to the fourth embodiment of the present disclosure. As shown in FIG. 28, the EUV light source apparatus, as in the case of the second embodiment, has a plurality of semiconductor lasers 41 to 45 in place of the semiconductor laser 4 in the structure of the third embodiment, the semiconductor laser system 18 in place of the semiconductor laser system 8, and further has the combiner 40 which combines the laser lights outputted from each of the semiconductor lasers 41 to 45 and outputs the combined laser light to the regenerative amplifier 9. In other words, the driver laser controller 80, which corresponds to the driver laser controller 50, controls the semiconductor laser system 18 in order to feedback-control the wavelength control and the wave shape control by the semiconductor laser system 18 with respect to an amplifiable multiple line outputted from each of the semiconductor lasers 41 to 45. Since the rest of the structures are the same as in the above-described third embodiment, detailed descriptions thereof will be omitted.

Figure 29:
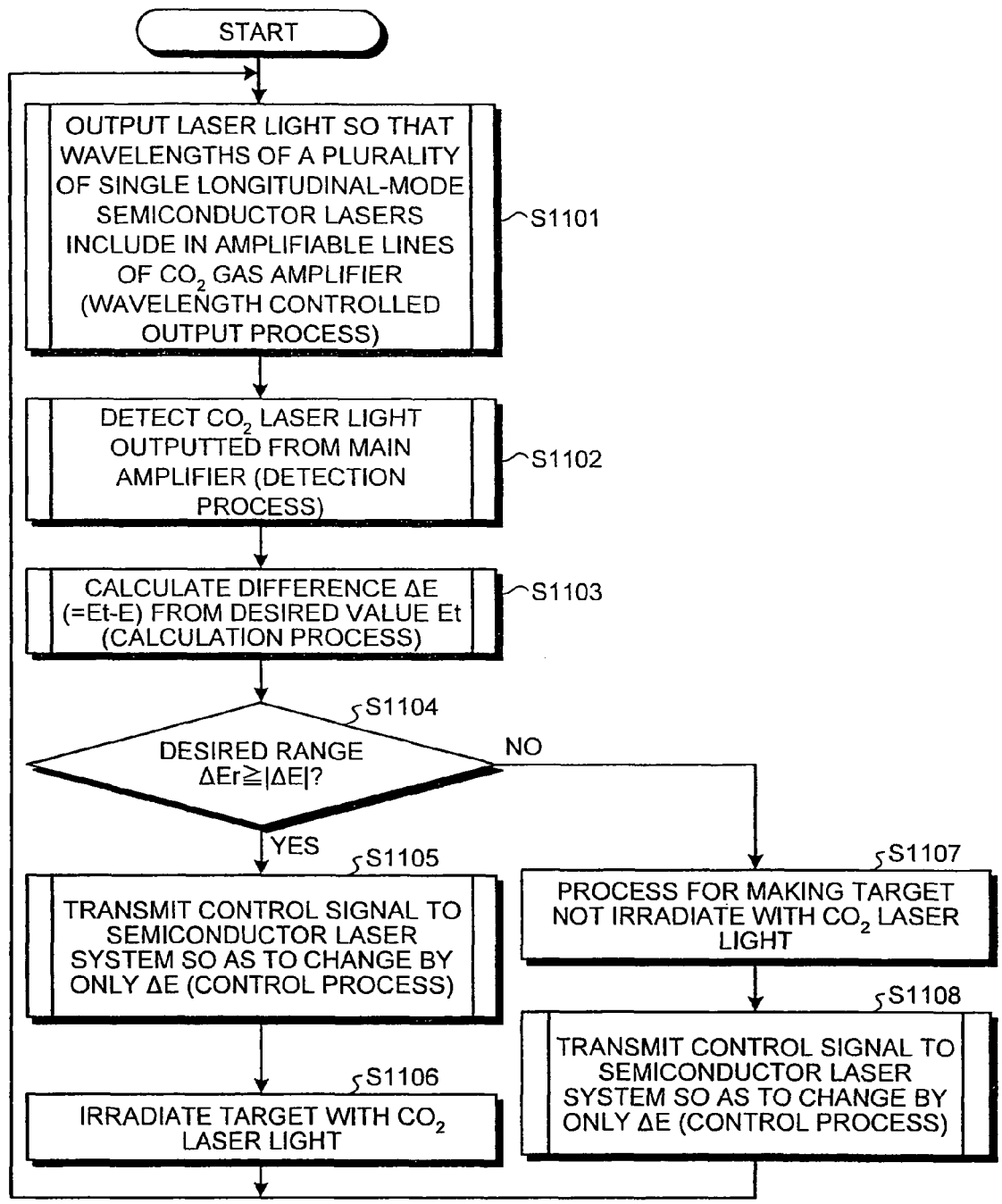
FIG. 29 is an overall flowchart showing a control process procedure by a driver laser controller and a semiconductor laser system shown in FIG. 28.

FIG. 29 is a flowchart showing a control process procedure including the wavelength control and the wave shape control by the driver laser controller 80 and the semiconductor laser system 18. This process is similar to the process of the flowchart shown in FIG. 18. However, in step S1101 corresponding to the step S101, the semiconductor laser system 18 does not execute the wavelength control of a single-longitudinal mode but executes wavelength control of a plurality of single-longitudinal modes from each of the semiconductor lasers 41 to 45. Additionally, steps S1102 to S1108 are similar to the steps S102 to S108 except that each process is executed for the plurality of the single-longitudinal mode semiconductor lasers.

Figure 30:
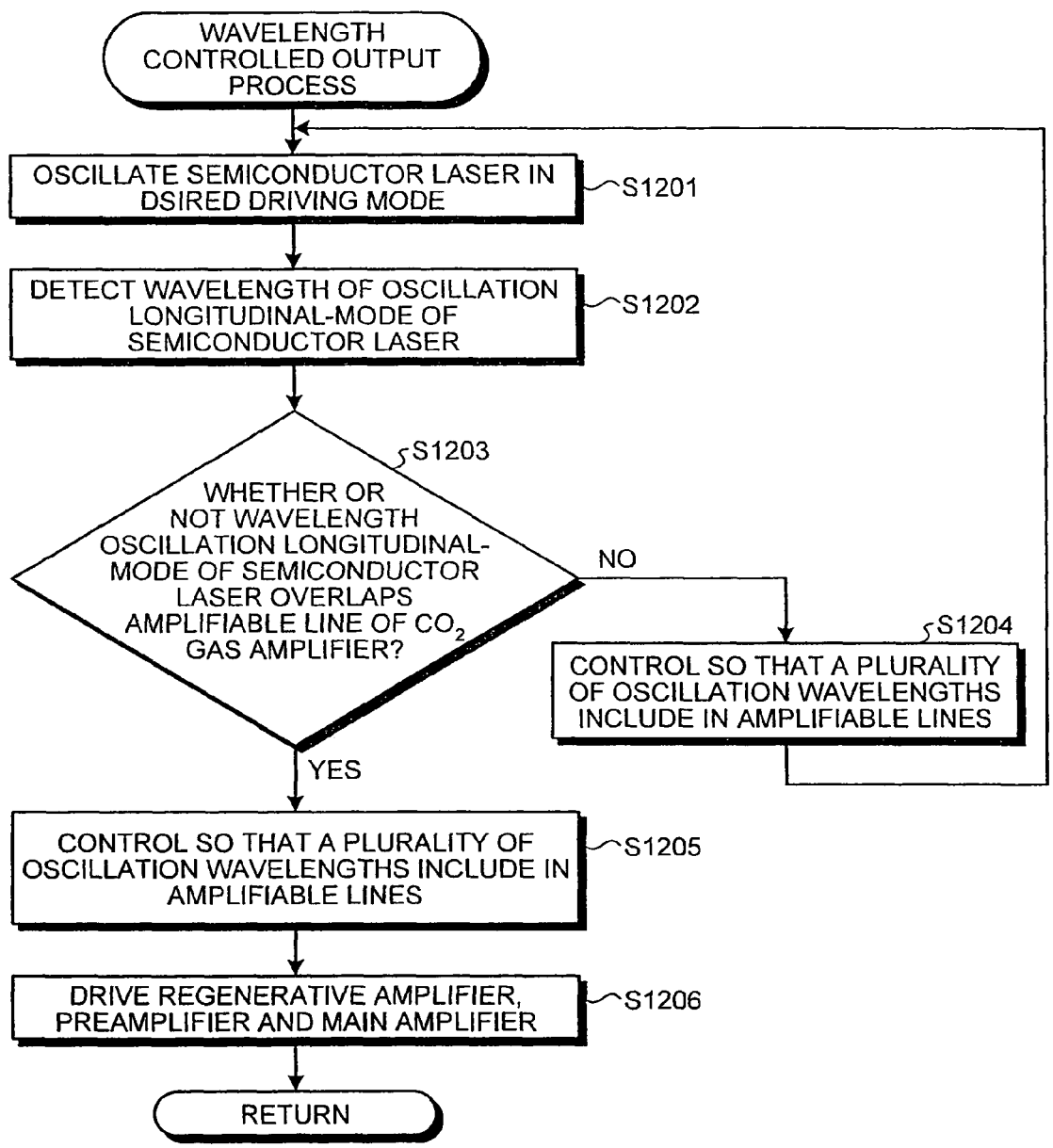
FIG. 30 is a detailed flowchart showing a process procedure of a wavelength control-and-output process shown in FIG. 29.

FIG. 30 is a flowchart showing a wavelength control-and-output process procedure in the step S1101. This process corresponds to the process shown in FIG. 19. However, what is different is that a plurality of oscillation wavelengths is controlled so as to be within the amplifiable wavelength band.

Figure 31:
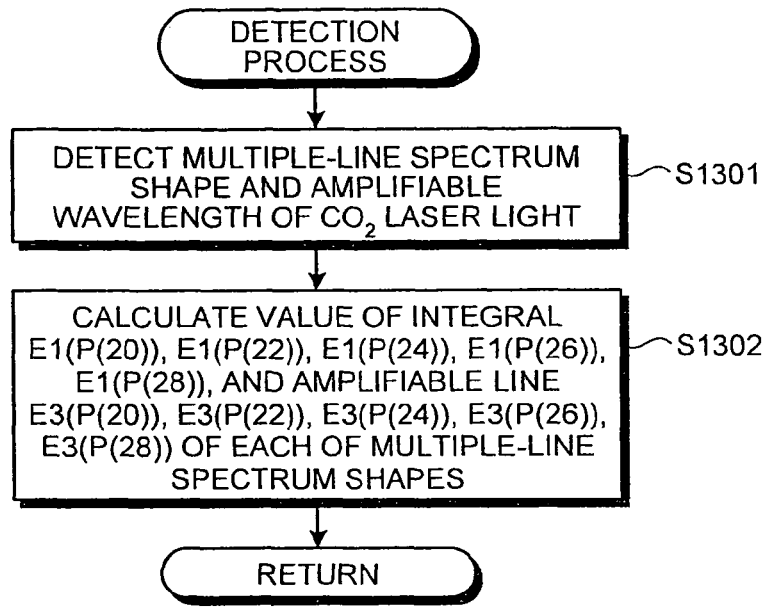
FIG. 31 is a detailed flowchart showing a process procedure of a detection process shown in FIG. 29.

FIG. 31 is a flowchart showing a detection process procedure in step S1102. In the detection process, the pulse energy E1 and the amplifiable wavelength E3 are detected, but the pulse width E2 is not. However, as in the case of the third embodiment, a pulse width E2 of each amplification line can be acquired as well. In FIG. 31, firstly, the detector 51 detects the spectrum shape and the amplifiable wavelength of the multiple line $CO_2$ laser light (step S1301). After that, the detector 51 calculates pulse energies E1(P(20)), E1(P(22)), E1(P(24)), E1(P(26)) and E1(P(28)), each of which is a value of integral of the spectrum shape of each multiple line, and amplifiable wavelengths E3(P(20)), E3(P(22)), E3(P(24)), E3(P(26)) and E3(P(28)) (step S1302), and then returns to the step S1102.

Figure 32:
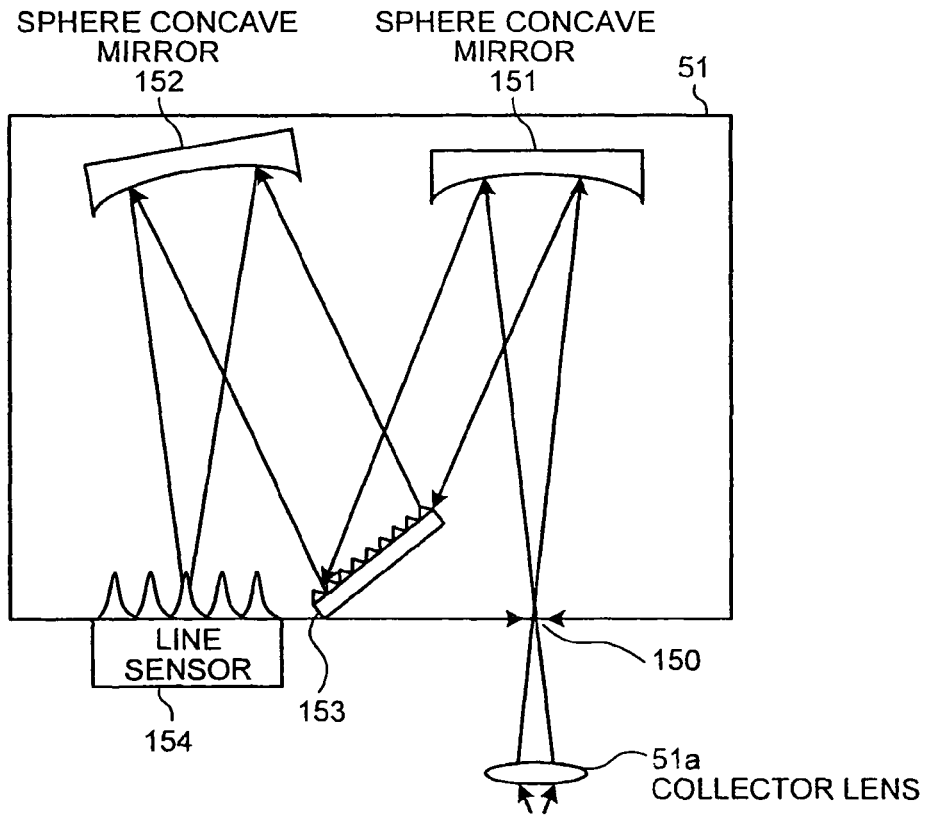
FIG. 32 is a schematic diagram showing a structure of spectroscope being an example of a detector that detects a spectrum shape, according to the fourth embodiment.

Here, the spectrum shape of the multiple lines can be obtained using the spectroscope corresponding to FIG. 21. In FIG. 32, a spectrum shape of the multiple lines is being obtained on the line sensor 154. The spectrum shape corresponds to the case where the multiple-line control shown in FIG. 15 is executed.

Figure 33:
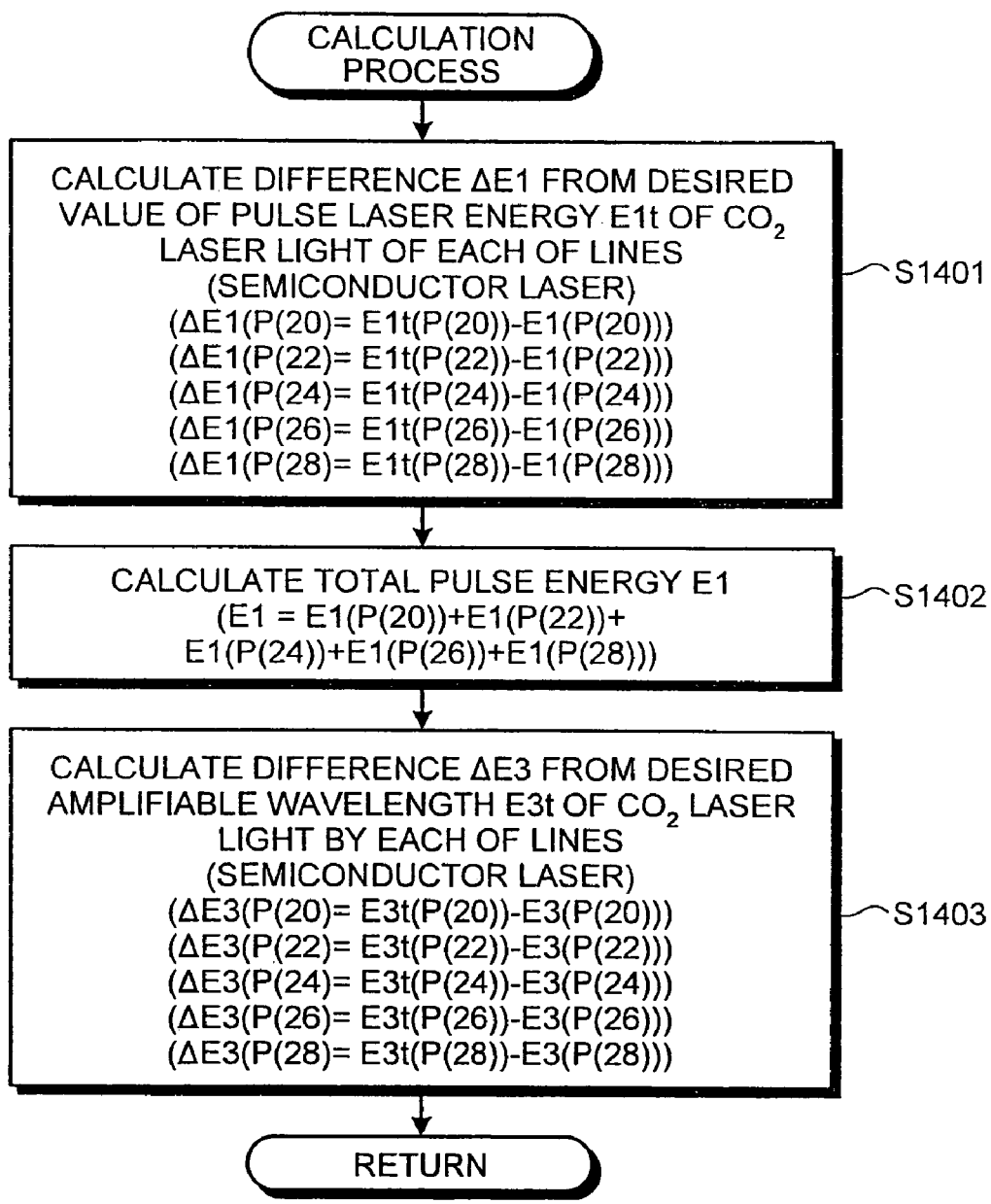
FIG. 33 is a detailed flowchart showing a process procedure of a calculation process shown in FIG. 29.

FIG. 33 is a flowchart showing a calculation process procedure in step S1103. In the calculation process, firstly, the driver laser controller 80 calculates the difference $\Delta E1$ between the value of the desired energy $E1t$ of the $CO_2$ laser light of each multiple line and the value of the detected energy $E1$ of each multiple line from the following formulae 1 to 5 (step S1401).

$$\Delta E1(P(20))=E1t(P(20))-E1(P(20)) \quad \text{(formula 1)}$$

$$\Delta E1(P(22))=E1t(P(22))-E1(P(22)) \quad \text{(formula 2)}$$

$$\Delta E1(P(24))=E1t(P(24))-E1(P(24)) \quad \text{(formula 3)}$$

$$\Delta E1(P(26))=E1t(P(26))-E1(P(26)) \quad \text{(formula 4)}$$

$$\Delta E1(P(28))=E1t(P(28))-E1(P(28)) \quad \text{(formula 5)}$$

After that, the driver laser controller 80 calculates a total pulse energy E1 using the following formula 6 (step S1402).

$$E1=E1(P(20))+E1(P(22))+E1(P(24))+E1(P(26))+E1(P(28)) \quad \text{(formula 5)}$$

This process can be omitted if it is not necessary in the feedback control of the pulse energy E1. The case requiring this process, as shown in FIG. 14, for instance, is a case where the control of pulse energy of the single-longitudinal mode semiconductor laser corresponding to each amplification line is executed.

Furthermore, the driver laser controller 80 calculates the difference $\Delta E3$ between the desired amplifiable wavelength $E3t$ of the $CO_2$ laser light in each multiple line and the detected amplifiable wavelength E3 of each multiple line using the following formulae 7 to 11 (step S1403), and then returns to the step S1103.

$$\Delta E3(P(20))=E3t(P(20))-E3(P(20)) \quad \text{(formula 7)}$$

$$\Delta E3(P(22))=E3t(P(22))-E3(P(22)) \quad \text{(formula 8)}$$

$$\Delta E3(P(24))=E3t(P(24))-E3(P(24)) \quad \text{(formula 9)}$$

$$\Delta E3(P(26))=E3t(P(26))-E3(P(26)) \quad \text{(formula 10)}$$

$$\Delta E3(P(28))=E3t(P(28))-E3(P(28)) \quad \text{(formula 11)}$$

Figure 34:
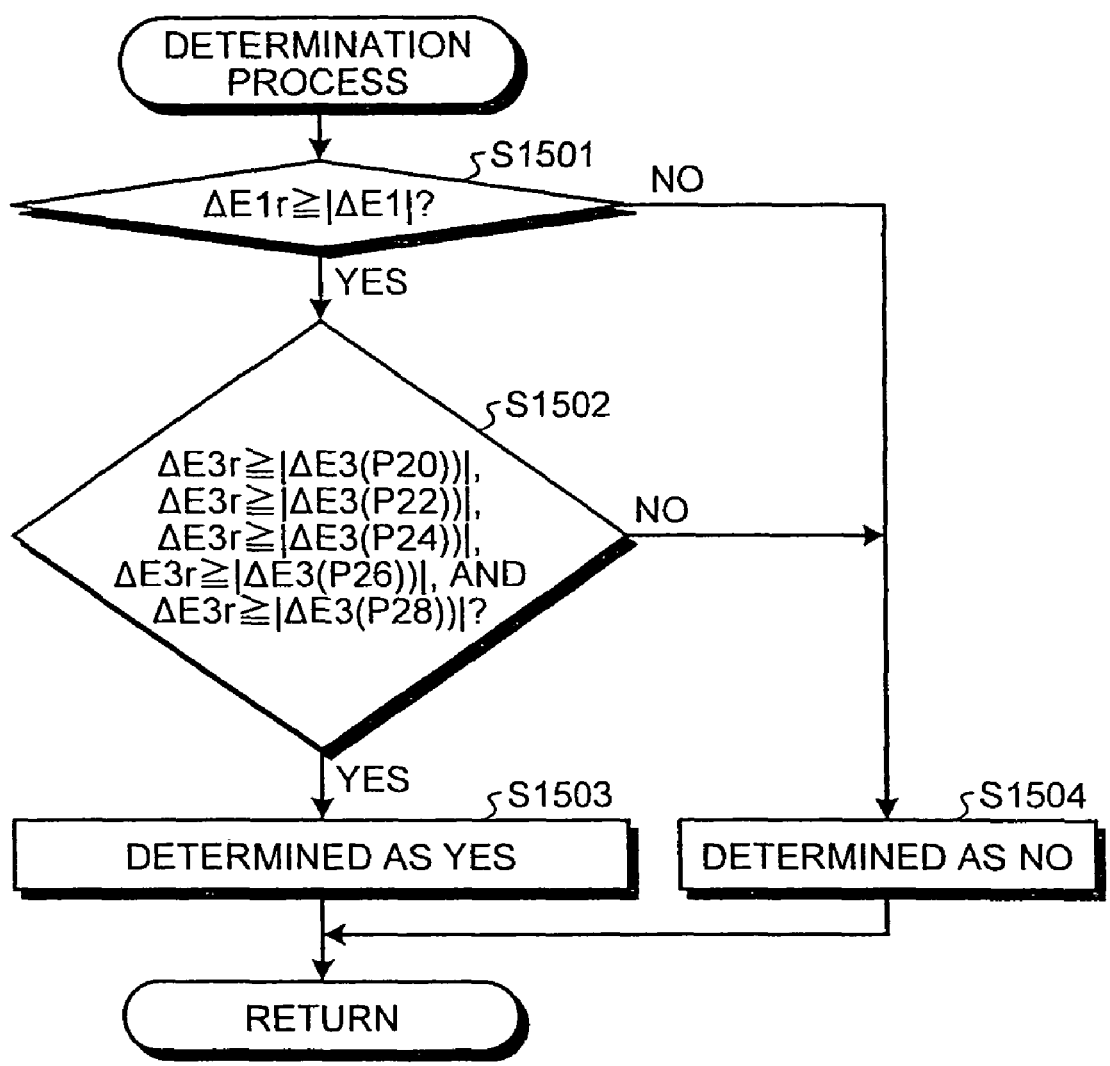
FIG. 34 is a detailed flowchart showing a process procedure of a determination process shown in FIG. 29.

FIG. 34 is a flowchart showing a determination process procedure in the step S1104. In FIG. 34, firstly, the driver laser controller 80 determines whether the difference $\Delta E1$ of the total pulse energy in each multiple line is within the desired range $\Delta E1r$ of the total pulse energy in each multiple line (step S1501). In the process in this case, as shown in FIG. 15, when the pulse shapes of each of the multiple lines are approximately equal to one another, an energy range at a case where $\Delta E1r$ is common among the multiple lines becomes $\Delta E1r/5$.

When the difference $\Delta E1r$ of the total pulse energy of each multiple line is within the desired range $\Delta E1r$ of the total pulse energy of each multiple line (the step S1501, Yes), the driver laser controller 80 further determines whether the difference $\Delta E3$ of the amplifiable line of each multiple line is within the desired range $\Delta E3r$ of each multiple line with respect to all of the multiple lines. When the differences $\Delta E3$ are within the desired ranges $\Delta E3r$ in all of the multiple lines (the step S1502, Yes), the driver laser controller 80 determines as "Yes" (step S1503), and then, returns to the step S1104.

On the other hand, when the difference $\Delta E1$ of the pulse energy of each multiple line is not within the desired range $\Delta E1r$ of each multiple line (the step S1501, No), or when all of the differences $\Delta E3(P(20))$, $\Delta E3(P(22))$, $\Delta E3(P(24))$, $\Delta E3(P(26))$ and $\Delta E3(P(28))$ of the amplifiable line of each multiple line are not within the desired ranges $\Delta E3r$ with respect to all of the multiple lines (the step S1502, No), the driver laser controller 80 determines as "No", and then returns to the step S1104.

Figure 35:
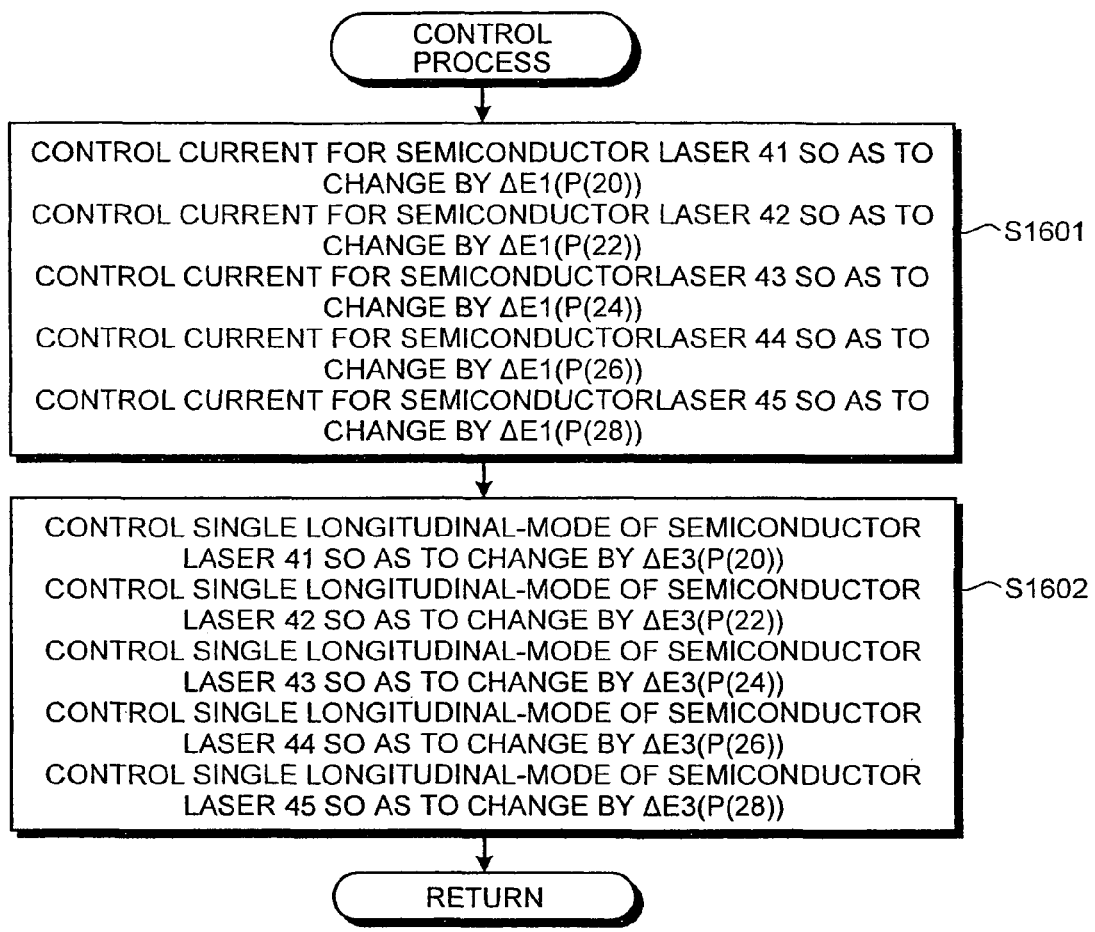
FIG. 35 is a detailed flowchart showing a process procedure of a control process shown in FIG. 29.

FIG. 35 is a flowchart showing a control process procedure in the steps S1105 and S1108. In this control process, the semiconductor laser system 18 controls current for the semiconductor lasers 41 to 45 so as to change the pulse energies by $\Delta E1(P(20))$, $\Delta E1(P(22))$, $\Delta E1(P(24))$, $\Delta E1(P(26))$ and $\Delta E1(P(28))$, respectively. Furthermore, the semiconductor laser system 18 executes the wavelength control of the single-longitudinal mode of the semiconductor lasers 41 to 45 so as to change the pulse widths by $\Delta E3(P(20))$, $\Delta E3(P(22))$, $\Delta E3(P(24))$, $\Delta E3(P(26))$ and $\Delta E3(P(28))$, respectively, and then returns to the step S1105 or S1108.

Fifth Embodiment

Next, a fifth embodiment of the present disclosure will be described in detail with reference to the accompanying drawings. In the above-described third and fourth embodiments, the feedback control of the wavelength control and the wave shape control is executed by monitoring the amplified laser light. On the other hand, in the fifth embodiment, a feedback control of the wavelength control and the wave shape control is executed based on a detection result by the EUV light detector that detects a light intensity of the EUV light.

Figure 36:
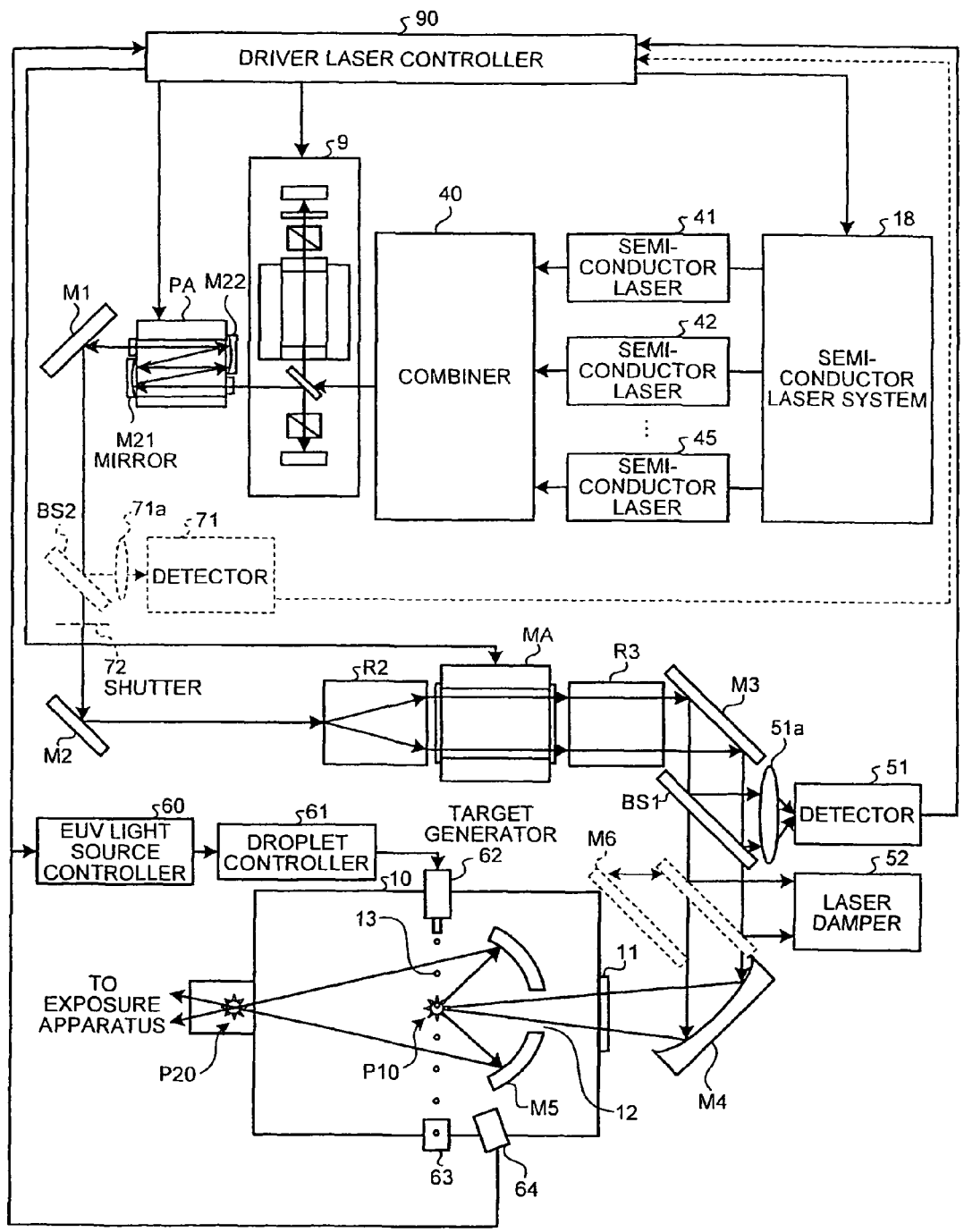
FIG. 36 is a schematic diagram showing a structure of an extreme ultraviolet light source apparatus according to a fifth embodiment of the present disclosure.

FIG. 36 is a schematic diagram showing a structure of an extreme ultraviolet light source apparatus according to the fifth embodiment of the present disclosure. As shown in FIG. 36, the EUV light source apparatus has an EUV light detector 64 detecting an intensity of the EUV light generated inside the EUV chamber 10 of the EUV light generation apparatus. A detection result by the EUV light detector 64 is transmitted to a driver laser controller 90 corresponding to the EUV light source controller 60 and the driver laser controller 80. The driver laser controller 90 executes the feedback control of the wavelength control and the wave shape control of the amplified laser light by controlling the semiconductor laser system 18 based on the detection result by the EUV light detector 64. The rest of the structures are the same as in the above-described fourth embodiment, and therefore redundant explanations will be omitted herein. The EUV light detector 64 can be arranged at the side of the exposure apparatus (not shown).

Figure 37:
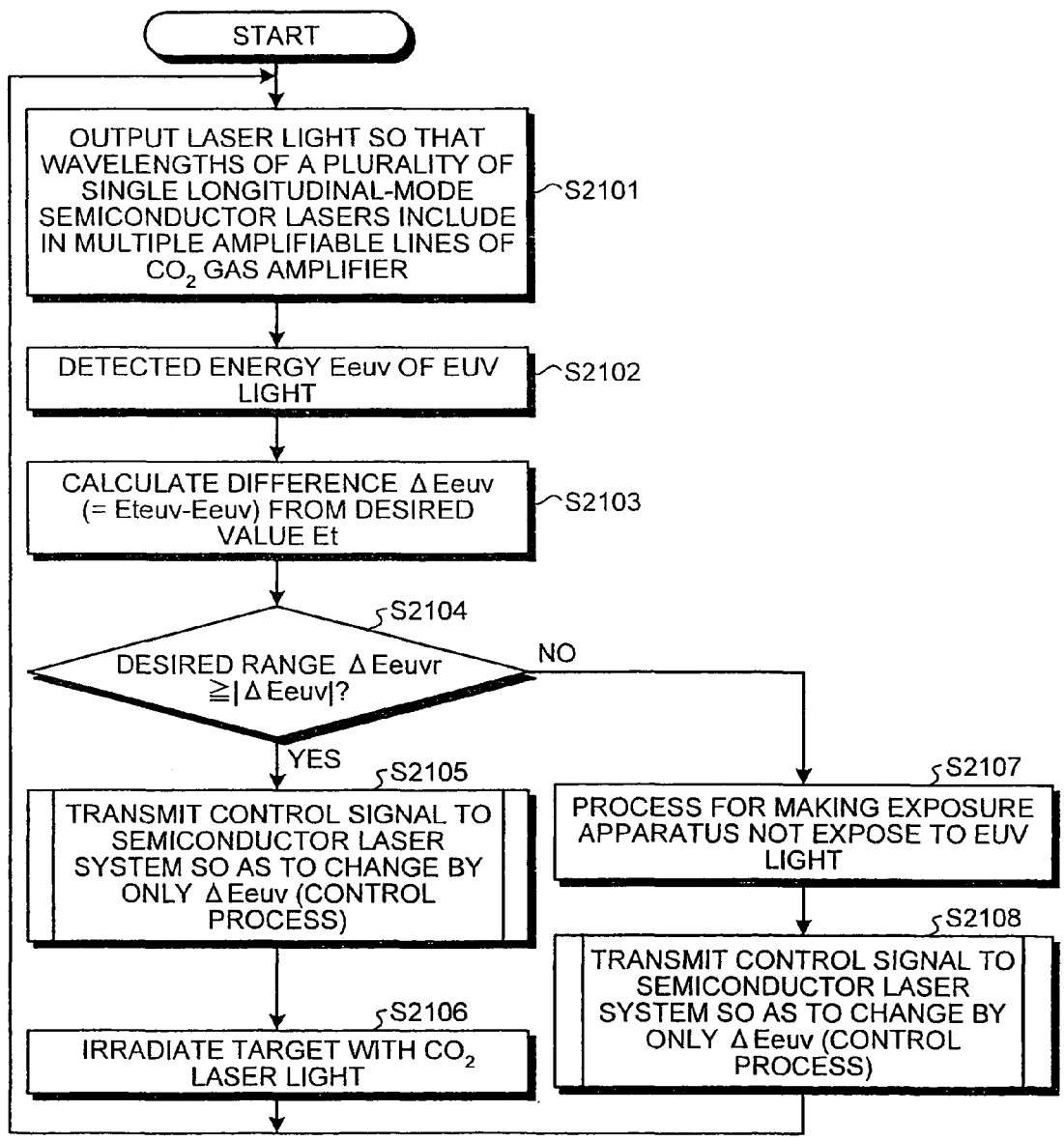
FIG. 37 is an overall flowchart showing a control process procedure by a driver laser controller and a semiconductor laser system shown in FIG. 36.

FIG. 37 is a flowchart showing a feedback control process procedure including the wavelength control and the wave shape control by the driver laser controller 90 and the semiconductor laser system 18. In FIG. 37, firstly, the driver laser controller 90 makes each wavelength of the semiconductor lasers 41 to 45 oscillating a plurality of the single-longitudinal mode enter the amplification lines of the regenerative amplifier 9, the preamplifier PA and the main amplifier MA (step S2101).

After that, the driver laser controller 90 detects an energy Eeuv of the EUV light by the EUV light detector 64 (step S2102). Furthermore, the driver laser controller 90 calculates a difference $\Delta$Eeuv (=Eteuv−Eeuv) between a value of the detection result Eeuv and a desired value Eteuv (step S2103).

After that, the driver laser controller 90 executes a determination process of determining whether the difference $\Delta$Eeuv is within a $\Delta$Eeuvr ($\Delta$Eeuv≧$\Delta$Eeuvr) (step S2104). When the difference $\Delta$Eeuv is within the desired range $\Delta$Eeuvr (the step S2104, Yes), the driver laser controller 90 executes a feedback control transmitting a control signal to the semiconductor laser system 18 so as to change the intensity by the difference $\Delta$Eeuv (step S2105). After that, the driver laser controller 90 executes a process of irradiating the target with the $CO_2$ laser light (step S2106), and then progresses to the step S2101 and repeats the above-described processes.

On the other hand, when the difference $\Delta$Eeuv is not within the desired range $\Delta$Eeuvr (the step 2104, No), the driver laser controller 90, as with the step S107, executes the process of preventing the EUV light from entering into the exposure apparatus (step S2107), and then, executes the feedback control transmitting the control signal to the semiconductor laser system 8 so as to change the detection result by the difference $\Delta$Eeuv (step S2108). After that, the driver laser controller 90 progresses to the step S2101 and repeats the above-described processes.

Figure 38:
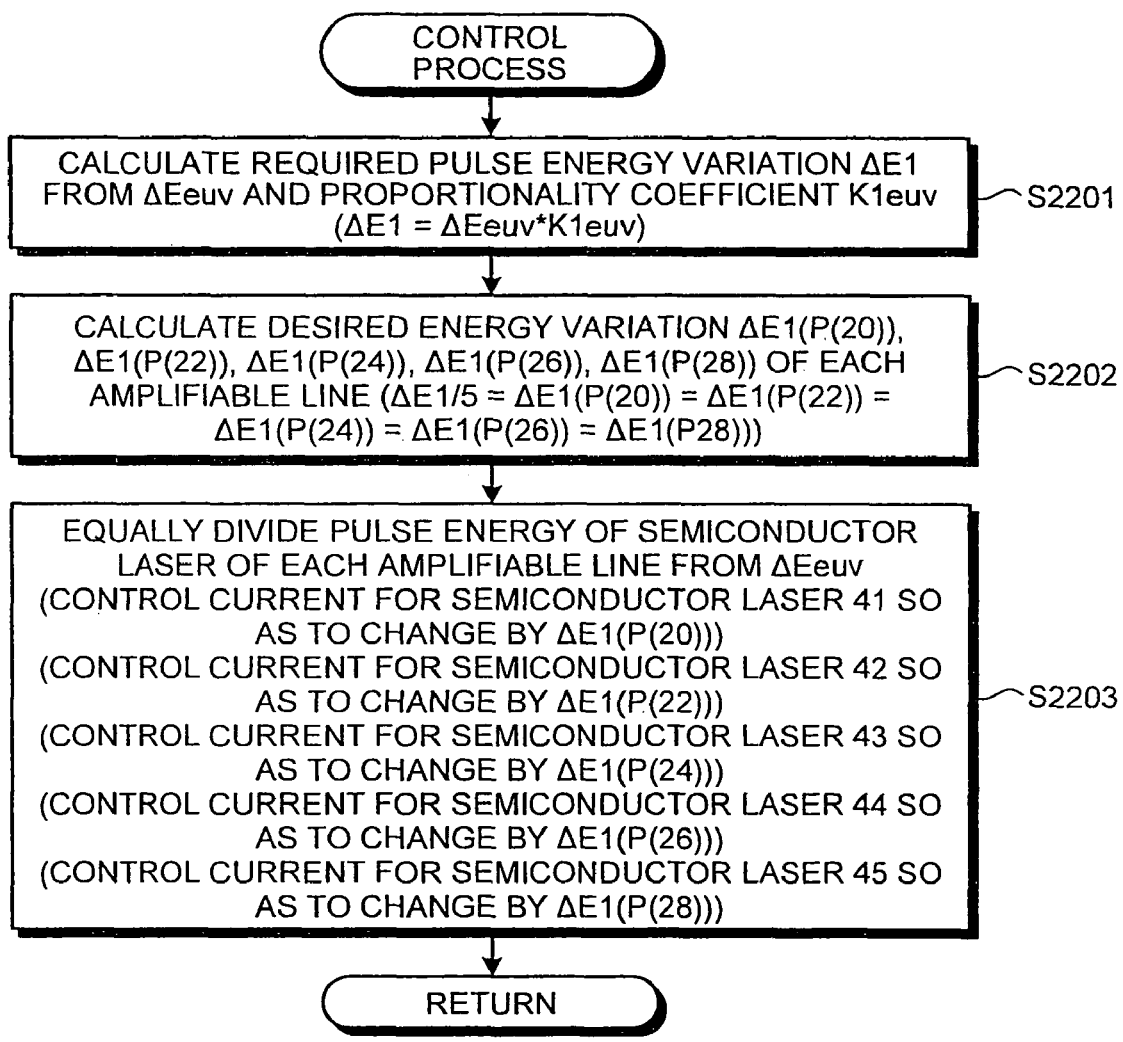
FIG. 38 is a detailed flowchart showing an energy control process procedure in a case where the control process shown in FIG. 37 is applied to a plurality of amplifiable lines.

Here, an example of the control process procedure in the steps S2105 and S2108 will be described in detail with reference to a flowchart shown in FIG. 38. In FIG. 38, firstly, the semiconductor laser system 18 calculates a required variation $\Delta$E1 (=$\Delta$Eeuv*Kleuv) of pulse energy from $\Delta$Eeuv and a proportional coefficient Kleuv (step S2201). After that, the semiconductor laser system 18 calculates desired energy variations $\Delta$E1(P(20)), $\Delta$E1(P(22)), $\Delta$E1(P(24)), $\Delta$E1(P(26)) and $\Delta$E1(P(28)) of each amplifiable line (step S2202). Here, a formula $\Delta$E1/5=$\Delta$E1(P(20))=$\Delta$E1(P(22))=$\Delta$E1(P(24))=$\Delta$E1(P(26))=$\Delta$E1(P(28)) can be established. Then, the semiconductor laser system 18 executes a current control of the semiconductor lasers 41 to 45 so as to change the pulse energies by $\Delta$E1(P(20)), $\Delta$E1(P(22)), $\Delta$E1(P(24)), $\Delta$E1(P(26)) and $\Delta$E1(P(28)), respectively. That is, the semiconductor laser system 18 executes a process of evenly distributing the light intensity of the semiconductor laser of each amplification line. After that, the semiconductor laser 18 returns to the step S2105 or the step S2108. In this process, the energy difference $\Delta$E1 corresponding to the difference $\Delta$Eeuv is evenly distributed among a number of lines of each amplification line.

Figure 39:
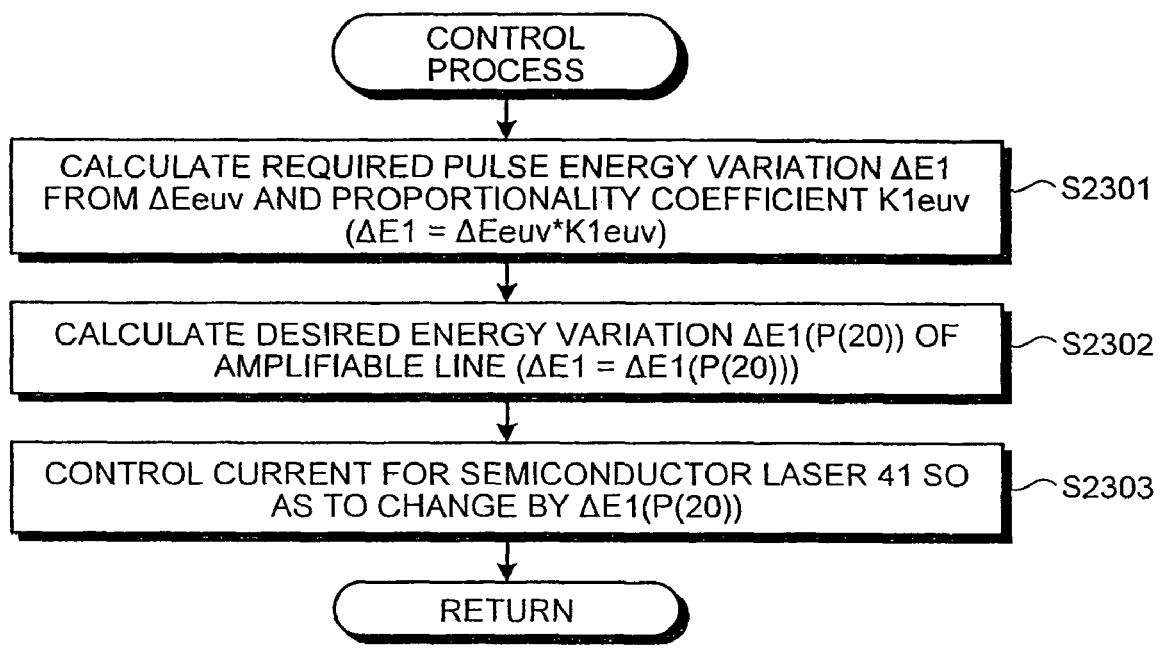
FIG. 39 is a detailed flowchart showing an energy control process procedure in a case where the control process shown in FIG. 37 is applied to a single amplifiable line.

As shown in FIG. 39, it is possible to have a feedback control executed for the specific amplification line P(20). In this case, the semiconductor laser system 18 calculates a required variation $\Delta$E1 (=$\Delta$Eeuv*Kleuv) of pulse energy from $\Delta$Eeuv and the proportional coefficient Kleuv (step S2301). After that, the semiconductor laser system 18 calculates the desired energy variation $\Delta$E1(P(20)) of the amplification line P(20) (step 2302). Then the semiconductor laser 18 executes a current control of the semiconductor laser 41 so as to change the pulse energy by $\Delta$E1(P(20)) (step 2303), and returns to the step S2105 or the step S2108.

Figure 40:
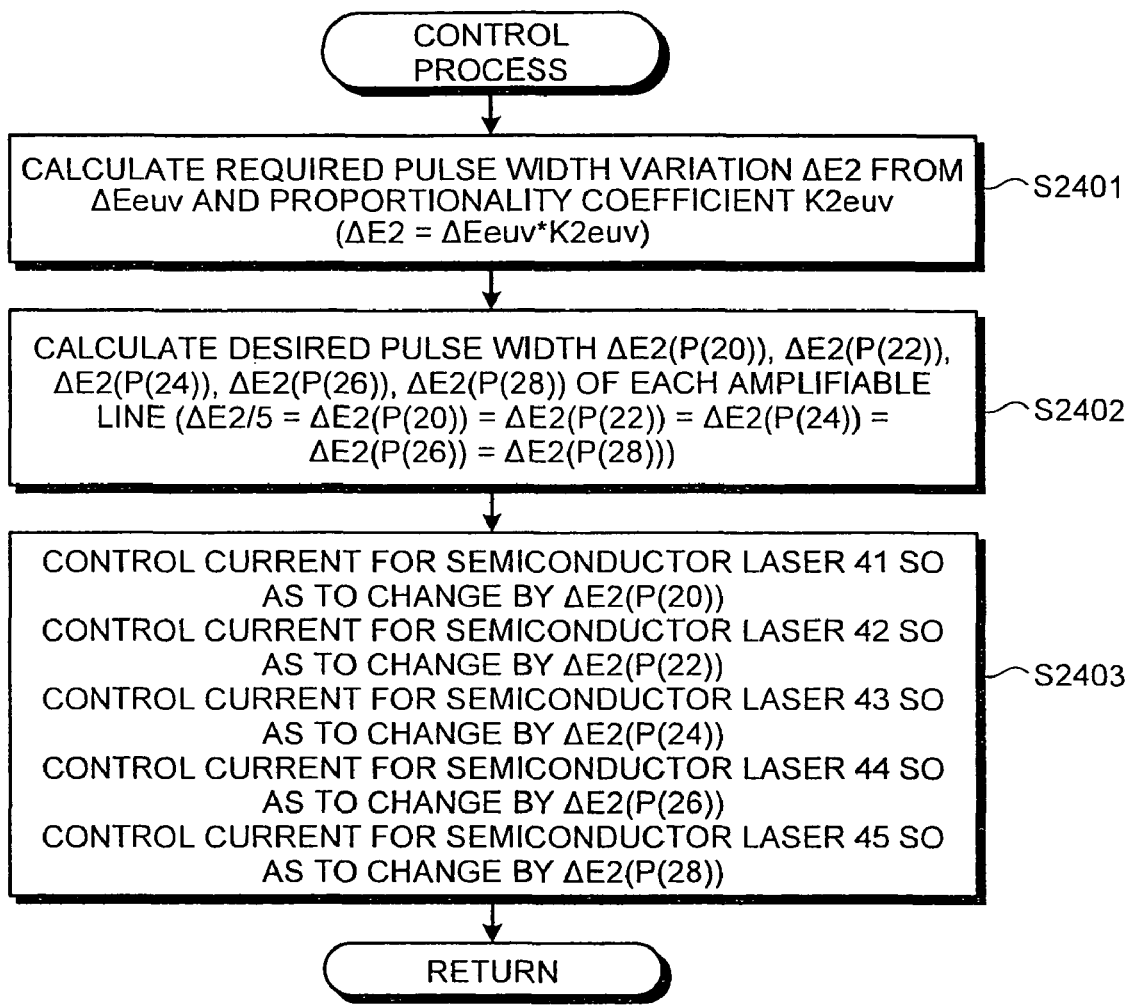
FIG. 40 is a detailed flowchart showing a pulse width control process procedure in a case where the control process shown in FIG. 37 is applied to a plurality of amplifiable lines.

Another example of the control process procedure in the steps S2105 and S2108 will be described in detail with reference to a flowchart shown in FIG. 40. In this process, a control of pulse width is executed. In FIG. 40, firstly, the semiconductor laser system 18 calculates a required variation $\Delta$E2 (=$\Delta$Eeuv*K2euv) of pulse width from $\Delta$Eeuv and a proportional coefficient K2euv (step S2401). After that, the semiconductor laser system 18 calculates desired pulse width variations $\Delta$E2(P(20)), $\Delta$E2(P(22)), $\Delta$E2(P(24)), $\Delta$E2(P(26)) and $\Delta$E2(P(28)) of each amplification line (step S2402). Here, a formula $\Delta$E2/5=$\Delta$E2(P(20))=$\Delta$E2(P(22))=$\Delta$E2(P(24))=$\Delta$E2(P(26))=$\Delta$E2(P(28)) can be established. Accordingly, the semiconductor laser system 18 executes a current control of the semiconductor lasers 41 to 45 so as to change the pulse width by $\Delta$E2(P(20)), $\Delta$E2(P(22)), $\Delta$E2(P(24)), $\Delta$E2(P(26)) and $\Delta$E2(P(28)), respectively. That is, the semiconductor laser system 18 executes a process of evenly distributing the pulse width of the semiconductor laser of each amplification line. After that, the semiconductor laser 18 returns to the step S2105 or the step S2108. In this process, the pulse width variation $\Delta$E2 corresponding to the difference $\Delta$Eeuv is evenly distributed among a number of lines of each amplification line.

Figure 41:
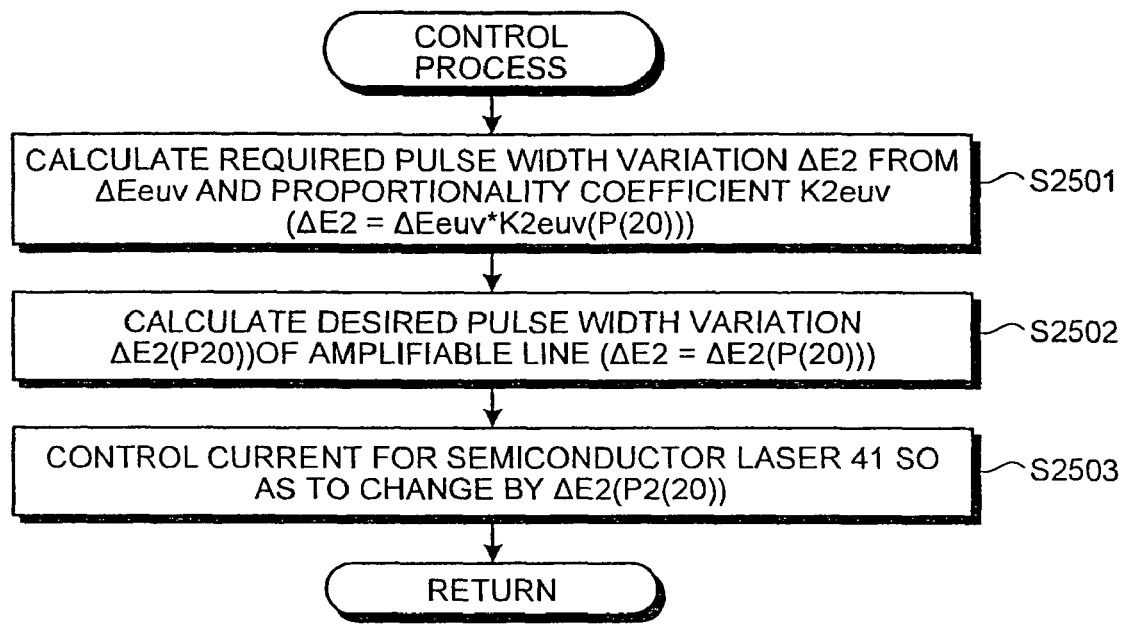
FIG. 41 is a detailed flowchart showing a pulse width control process procedure in a case where the control process shown in FIG. 37 is applied to a single amplifiable line.

As shown in FIG. 41, it is possible to have a feedback control executed for the specific amplification line P(20). In this case, the semiconductor laser system 18 calculates a required variation $\Delta$E2 (=$\Delta$Eeuv*K2euv) of pulse energy from $\Delta$Eeuv and the proportional coefficient K2euv (step S2501). After that, the semiconductor laser system 18 calculates the desired energy variation $\Delta$E2(P(20)) of the amplification line P(20) (step S2502). Then the semiconductor laser 18 executes a current control of the semiconductor laser 41 so as to change the pulse width by $\Delta$E2(P(20)) (step 2503), and returns to the step S2105 or the step S2108.

Figure 42:
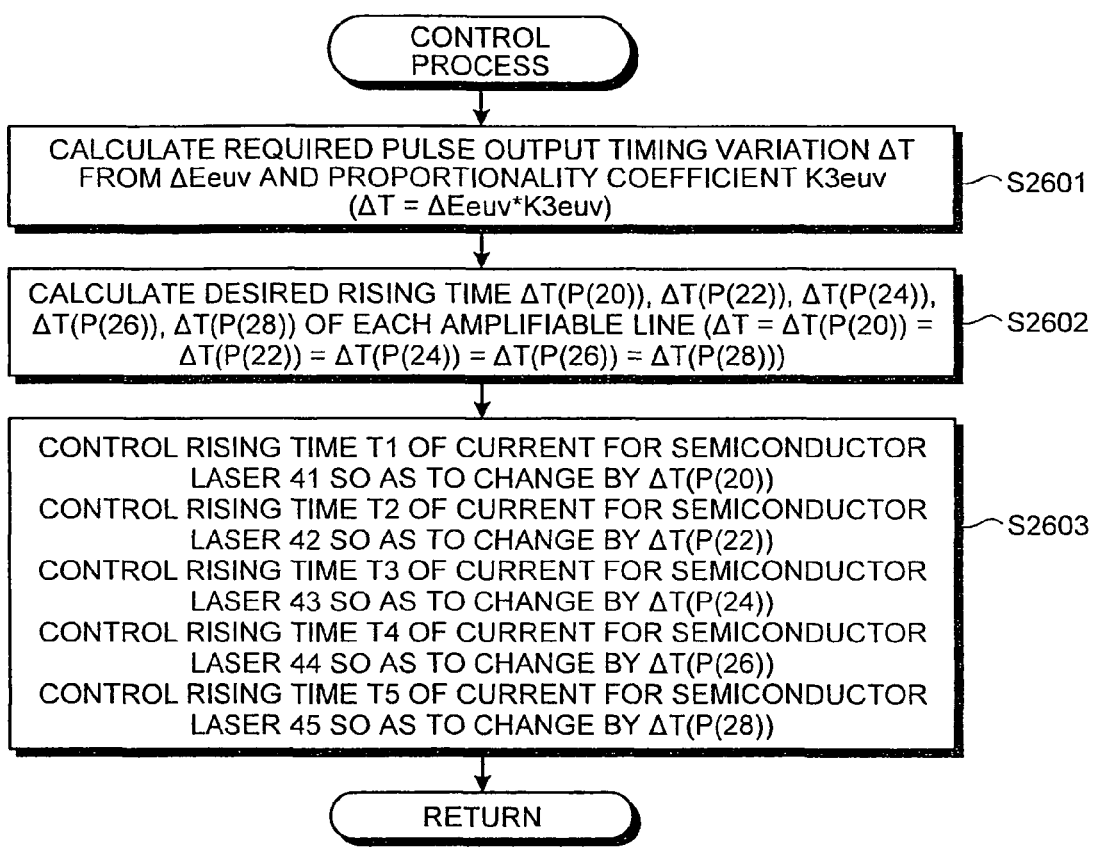
FIG. 42 is a detailed flowchart showing a pulse output timing control process procedure in a case where the control process shown in FIG. 37 is applied to a plurality of amplifiable lines.

Still another example of the control process procedure in the steps S2105 and S2108 will be described in detail with reference to a flowchart shown in FIG. 42. In this process, a control of pulse rising time is executed. In FIG. 42, firstly, the semiconductor laser system 18 calculates a required variation $\Delta$E3 (=$\Delta$Eeuv*K3euv) of pulse width from $\Delta$Eeuv and a proportional coefficient K2euv (step S2601). After that, the semiconductor laser system 18 calculates desired pulse rising time variations $\Delta$T(P(20)), $\Delta$T(P(22)), $\Delta$T(P(24)), $\Delta$T(P(26)) and $\Delta$T(P(28)) of each amplification line (step S2602). Here, a formula $\Delta$T/5=$\Delta$T(P(20))=$\Delta$T(P(22))=$\Delta$T(P(24))=$\Delta$T(P(26))=$\Delta$T(P(28)) can be established. Accordingly, the semiconductor laser system 18 executes a current control of the semiconductor lasers 41 to 45 so as to change the pulse rising time by $\Delta$T(P(20)), $\Delta$T(P(22)), $\Delta$T(P(24)), $\Delta$T(P(26)) and $\Delta$T(P(28)), respectively.

Figure 43A:
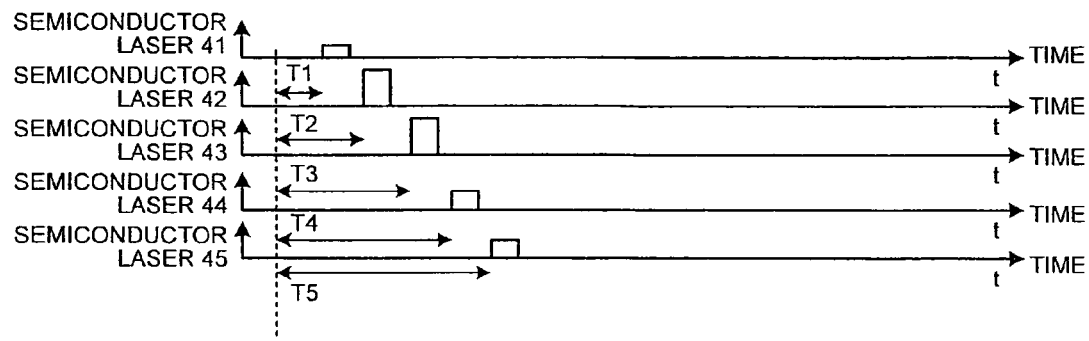
FIG. 43 is a timing chart showing an example in a case where the control process shown in FIG. 42 is applied.
Figure 43B:
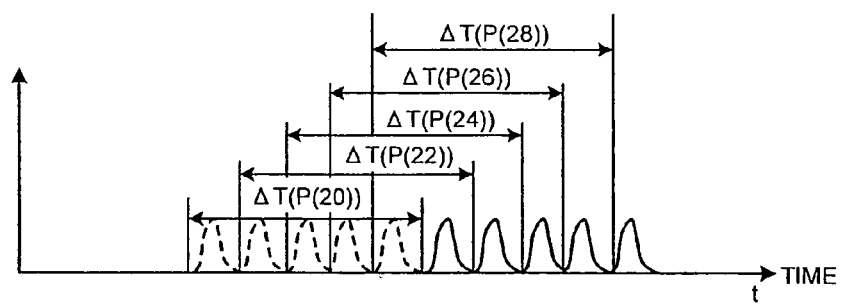

For instance, as shown in FIG. 43, when the semiconductor lasers 41 to 45 output laser lights of a combined pulse shape forming continuous five pulses from each multiple line, the same variations $\Delta$T (=$\Delta$T(P(20))=$\Delta$T(P(22))=$\Delta$T(P(24))=$\Delta$T(P(26))=$\Delta$T(P(28))) of pulse output timing evenly distributed to each multiple line are applied to the semiconductor lasers 41 to 45, respectively. Thereby, it is possible to shift the combined pulse shape by $\Delta$T. Obviously, such arrangement can also be applied to the case in which combined pulse shape is the shape shown in FIG. 14.

In the fifth embodiment, because the feedback control is executed by directly monitoring the EUV light, it is possible to increase the finally desired luminescence efficiency of the EUV light.

In FIGS. 38 and 42, the calculation is executed under the assumption that a pulse energy of the EUV light is proportional to an energy and a pulse width of the driver laser. However, such example is not definite. In order to obtain high accuracy, it is possible to calculate the pulse energy of the EUV light using a fitted curve based on an experimental value or a theoretical value.

Sixth Embodiment

Next, a sixth embodiment of the present disclosure will be described in detail with reference to the accompanying drawings. In the sixth embodiment, lights from a plurality of semiconductor lasers 4-1 to 4-n each of which oscillates a single-longitudinal mode light with a wavelength matching with the amplification line of the preamplifier PA and the main amplifier MA are combined and outputted.

Figure 44:
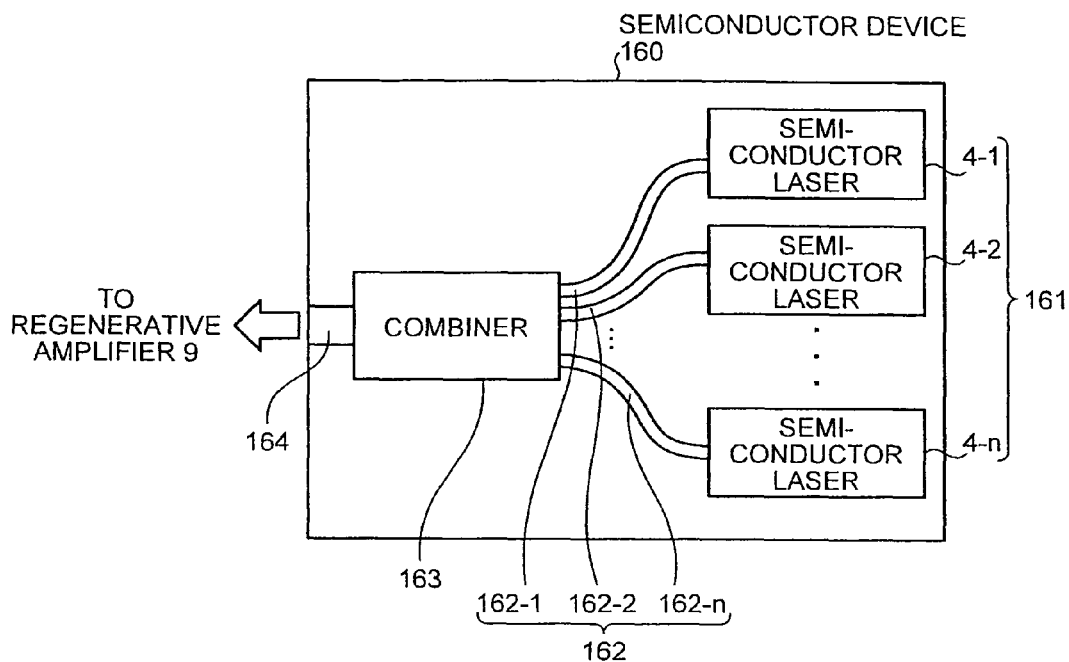
FIG. 44 is a schematic diagram showing a structure in a case where a plurality of semiconductor lasers and an optical combiner are integrated according to a sixth embodiment of the present disclosure.

FIG. 44 is a schematic diagram showing a structure of a semiconductor laser used for a master oscillator arranged on a driver laser of an extreme ultraviolet light source apparatus according to the sixth embodiment of the present disclosure. The semiconductor device 160 is constructed from the above-described single-longitudinal mode semiconductor lasers. Moreover, the semiconductor device 160 has a plurality of the semiconductor lasers 4-1 to 4-n each of which oscillates the light with the wavelength of the amplification line of the regenerative amplifier 9, the preamplifier PA and the main amplifier MA, and a combiner 161 combining laser lights outputted from each semiconductor laser 161. Between each semiconductor laser 161 and the combiner 163, a waveguide 162 (162-1 to 162-n) is arranged. Moreover, at an end of the combiner 163, an output waveguide 164 is formed. The semiconductor lasers 4-1 to 4-n (161), the combiner 163, the waveguides 162 (162-1 to 162-n) and the output waveguide 164 are formed at a single semiconductor substrate, for instance.

Wavelengths of the laser lights outputted from the semiconductor lasers 161 correspond approximately to wavelengths of the amplification lines of the regenerative amplifier 9, the preamplifier PA and the main amplifier MA, respectively. However, when a refractive index changes depending on a temperature variation, or the like, the wavelength of the output laser light will change. Thus, each of the longitudinal mode controllers 4 (not shown) arranged on each of the semiconductor lasers 4-1 to 4-n executes an independent wavelength control based on temperature regulation, respectively. In this case, it is possible to execute the above-described feedback control in each of the semiconductor lasers 4-1 to 4-n.

Figure 45:
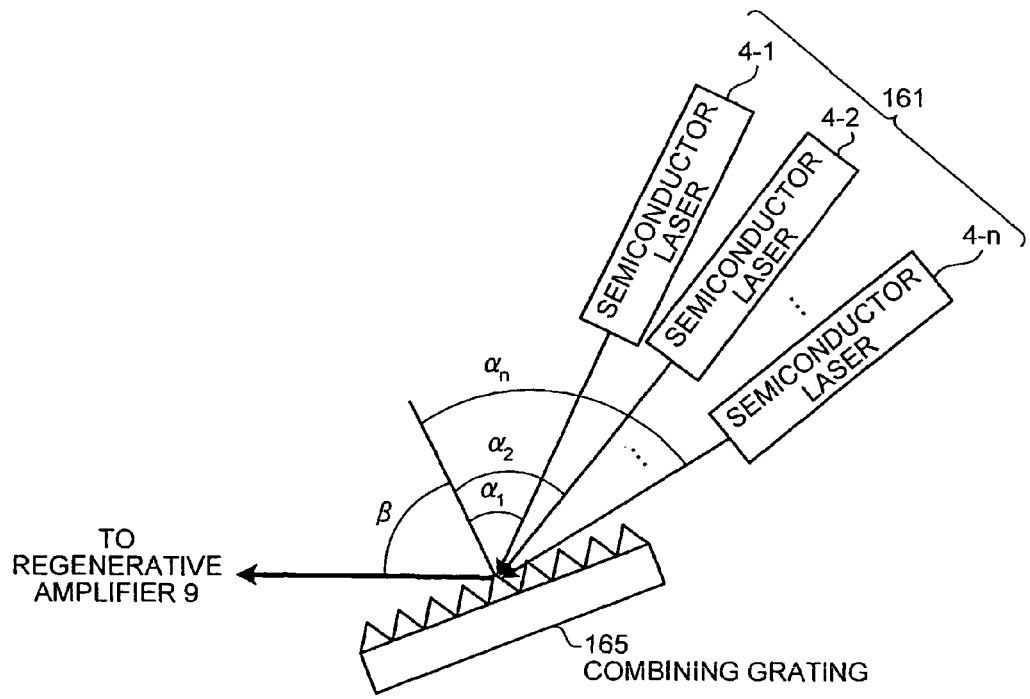
FIG. 45 is a schematic diagram showing an example of a structure of an optical combiner according to an alternate example of the sixth embodiment.

FIG. 45 is a schematic diagram showing an example of a structure of a combiner used for an extreme ultraviolet light source apparatus according to an alternate example of the sixth embodiment of the present disclosure. The semiconductor lasers according to this alternate example is different from the semiconductor laser 161 in that a combining grating 165 is used for an optical element to function as the combiner 163.

In dispersion in the grating, the following formula 12 is established between an incident angle $\alpha$ and a diffraction angle $\beta$. Here, m is a degree, $\lambda$ is a wavelength, and a is a grating space.

$$m\lambda = a^*(\sin\alpha \pm \sin\beta) \quad \text{(formula 12)}$$

In FIG. 45, a plurality of the semiconductor lasers 4-1 to 4-n (161) oscillates laser lights each of which is a single-longitudinal mode and has a wavelength corresponding to a plurality of the amplification lines of the regenerative amplifier 9, the preamplifier PA and the main amplifier MA. The laser lights outputted from each of the semiconductor lasers 4-1 to 4-n (161) enter into the combining grating 165 with incident angles $\alpha_1, \alpha_2, \ldots, \alpha_n$, respectively. The combining grating 165 outputs the lasers received from each of the semiconductor lasers 161 with the same diffraction angle. Thereby, the lasers from a plurality of the semiconductor lasers 161 are combined.

Here, by arranging the incident angles $\alpha_1, \alpha_2, \ldots, \alpha_n$ and the diffraction angles $\beta$ which enables to establish the formula 12 and the following n number of formulae 13-1, 13-2, ..., 13-n, it is possible to combine the laser lights from a plurality of the semiconductor lasers 161.

$$m\lambda_1 = a^*(\sin\alpha_1 \pm \sin\beta) \quad \text{(formula 13-1)}$$

$$m\lambda_2 = a^*(\sin\alpha_2 \pm \sin\beta) \quad \text{(formula 13-2)}$$

...

$$m\lambda_n = a^*(\sin\alpha_n \pm \sin\beta) \quad \text{(formula 13-n)}$$

Here, any of the oscillation wavelengths $\lambda_1, \lambda_2, \ldots, \lambda_n$ which are the wavelengths of the amplification lines of the $CO_2$ gas amplifier shown in FIG. 5 can be applied.

Figure 46:
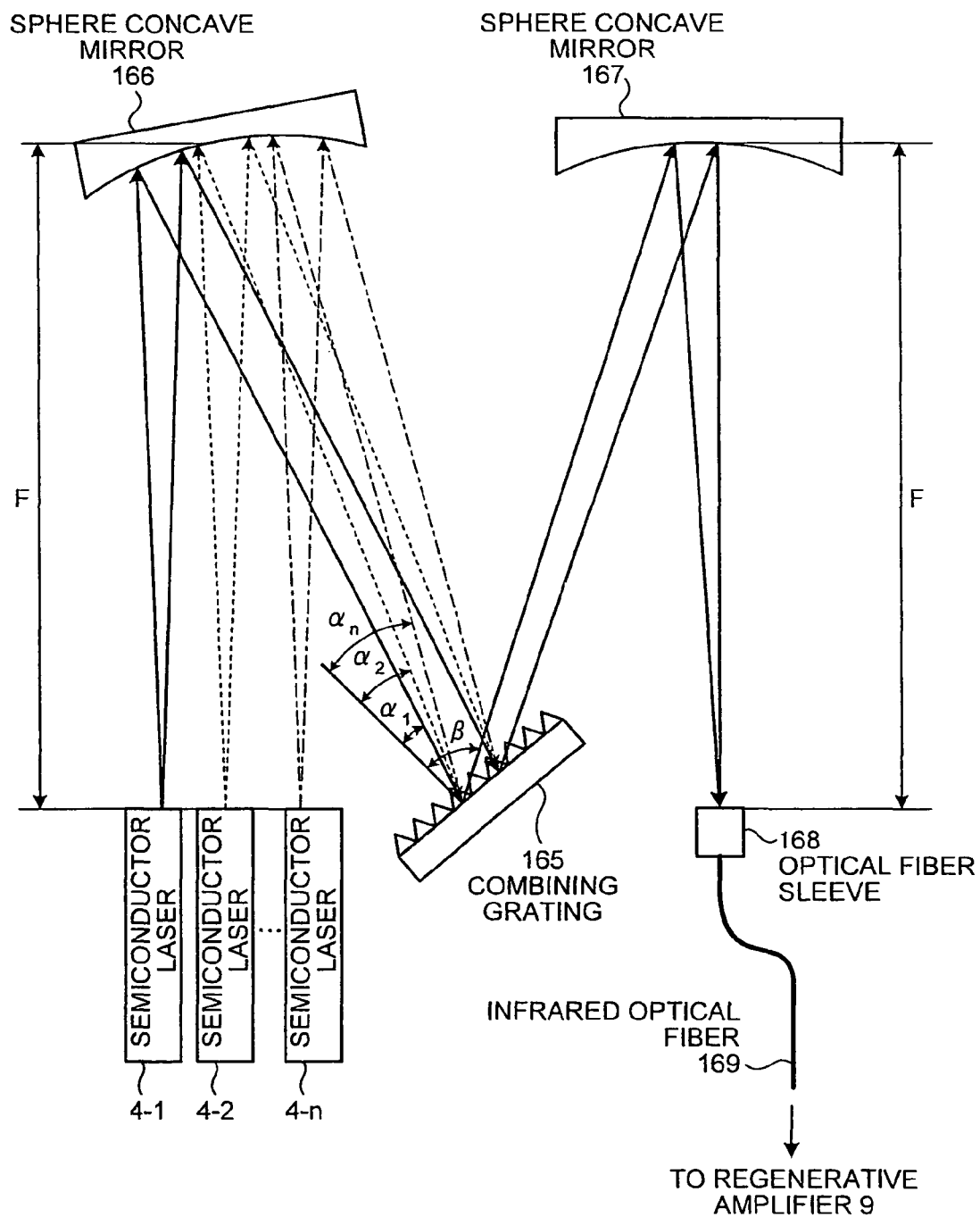
FIG. 46 is a schematic diagram showing another example of a structure of an optical combiner according to another alternate example of the sixth embodiment.

In the above-described alternate example, the semiconductor lasers 4-1 to 4-n are arranged in annular. However, as shown in FIG. 46, each of the semiconductor lasers 4-1 to 4-n can be arranged in parallel. FIG. 46 is a schematic diagram showing another example of a structure of a combiner used for an extreme ultraviolet light source apparatus according to another alternate example of the sixth embodiment of the present disclosure. As shown in FIG. 46, in the semiconductor laser, each of the semiconductor lasers 4-1 to 4-n are arranged in parallel, while a sphere concave mirror 166 collimating the laser lights outputted from each of the semiconductor lasers 4-1 to 4-n, the combining grating 165 diffracting the lights collimated respectively by the sphere concave mirror 166, a sphere concave mirror 167 focusing the collimate lights diffracted by the combining grating 165, and an infrared optical fiber 169 receiving and guiding the lights focused by the sphere concave mirror 167 by an optical fiber sleeve 168 are arranged. Here, the diffraction angles $\beta$ of respective laser lights by the combining grating 165 are the same.

At a position where each laser light reflected by the sphere concave mirror 167 is focused, i.e. a focus point F of the sphere concave mirror 167, the optical fiber sleeve 168 is arranged. Therefore, as a result of the laser pulse lights of a plurality of the single-longitudinal mode semiconductor lasers being focused on the single focus point F, the laser pulse light of the semiconductor lasers with different wavelengths are combined and introduced into the infrared optical fiber 169. The light guided by the infrared optical fiber 179 is inputted to the regenerative amplifier 9. Instead of the infrared optical fiber 169, it is also possible to guide the combined laser light to the side of the preamplifier PA using a relay optics.

In the sixth embodiment, as described above, one or more single-longitudinal mode semiconductor lasers are distributed to the single amplification line. Therefore, it is possible to have the wavelength of the laser pulse light outputted from each of the semiconductor lasers 4-1 to 4-n corresponded with the wavelength of the amplification line of the regenerative amplifier 9, the preamplifier PA and the main amplifier MA with more accuracy, respectively. Thereby, it is possible to further improve the amplification efficiency with a simple structure.

Figure 47:
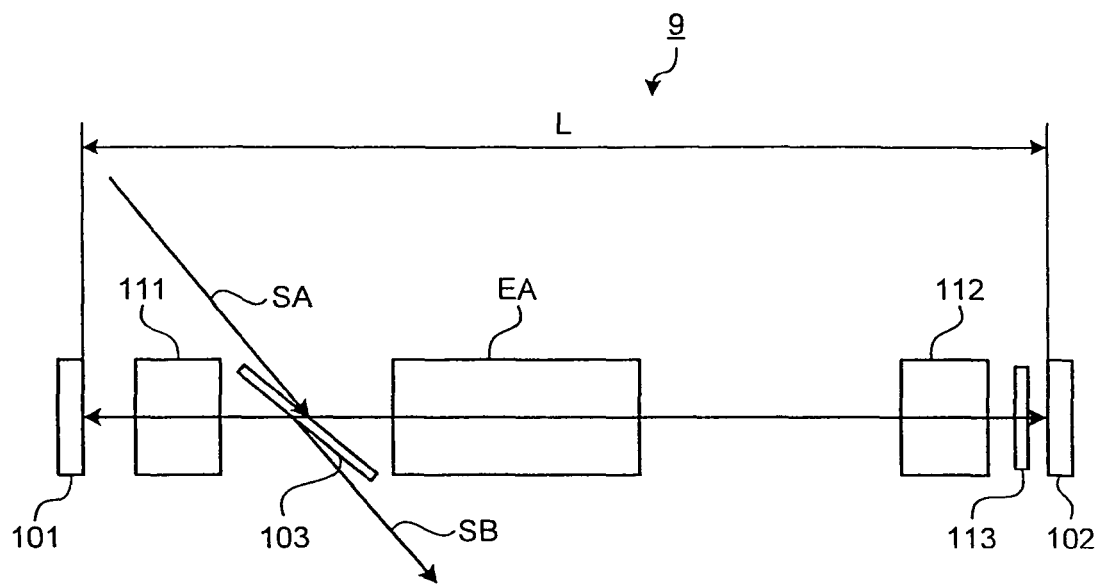
FIG. 47 is a schematic diagram showing a resonator length of a regenerative amplifier according to the sixth embodiment.
Figure 48:
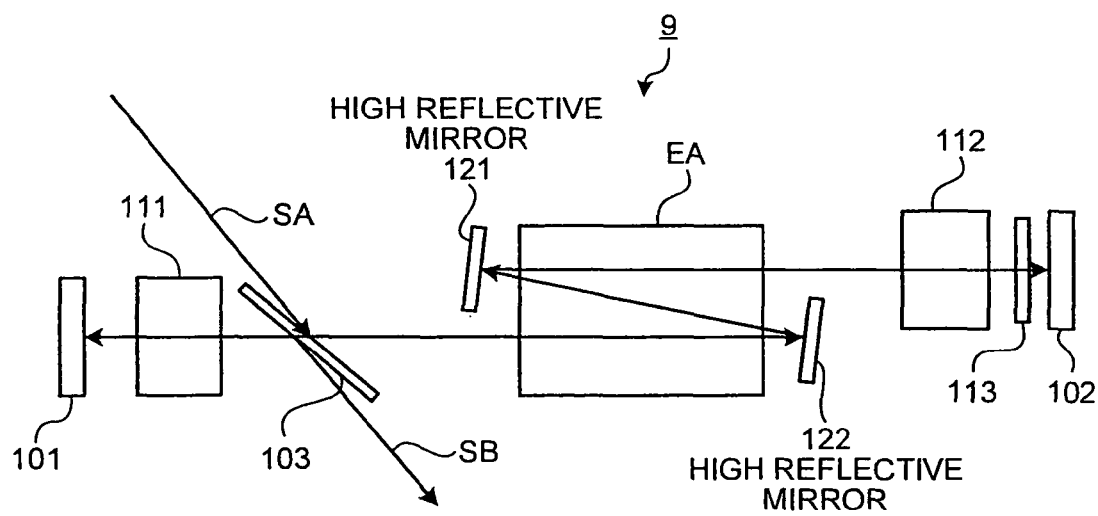
FIG. 48 is a schematic diagram showing a structure for elongating the resonator length while maintaining miniaturization of the regenerative amplifier according to the sixth embodiment.

In addition, in the above-described first to sixth embodiments, although the regenerative amplifier 9 shown in FIG. 3 is used, a regenerative amplifier shown in FIG. 47 or FIG. 48 can be used instead.

In the regenerative amplifier, assuming that a time width of the (semiconductor laser or combined) seed pulse light SA is Tsem, it is preferred that the resonator length L (cf. FIG. 47) of the regenerative amplifier 9 satisfies the following formula 14. Here, C is a light speed.

$$2L/C \geq Tsem \quad \text{(formula 14)}$$

By adopting the resonator length L satisfying the formula 14, a longitudinal mode due to the resonator length of the regenerative amplifier 9 will not occur. That is, it is possible to prevent deformation and instability of pulse shape arising from division of the pulse shape, or the like, caused by interference of light by resonance at the resonator of the regenerative amplifier. As a result, it is possible to stably amplify the seed pulse light SA while maintaining the wave shape. In this case, the control for adjusting the resonator length L of the regenerative amplifier 9 is not required in order to control for making generation of longitudinal mode (interference of light) stable. Moreover, when the seed pulse lights SA with plural wavelengths are inputted to the regenerative amplifier 9, if the formula 14 is not satisfied, it is necessary to make a longitudinal mode wavelength based on the resonator length of the regenerative amplifier 9 and wavelengths of a plurality of the seed pulse lights SA correspond to each other. In this case, because all of the seed pulse lights SA cannot be amplified, the amplification efficiency will be decreased. On the other hand, by satisfying the formula 14, it is possible to amplify all of the seed pulse lights SA. As a result, high amplification efficiency can be obtained. Furthermore, if the pulse width is equal to or less than the time width Tsem determined by the resonator length L of the regenerative amplifier 9, by controlling the wave shape of the current pulse for the semiconductor laser, it is possible to generate a seed pulse light SA of which pulse width is flexibly changed. Moreover, by using the regenerative amplifier 9 described above, it is possible to stably control amplification of the variable seed pulse light SA.

When the time width Tsem of the seed pulse light SA is 20 ns, for instance, the resonator length L satisfying the formula 14 is about 3 m or larger.

In order to prevent the regenerative amplifier 9 from becoming large and long due to the resonator length L becoming longer, as shown in FIG. 48, for instance, an optical path shuttling over the amplifiable region of the $CO_2$ gas amplifier EA can be formed by arranging a pair of high reflective mirrors 121 and 122. By this arrangement, it is possible to obtain the resonator length L satisfying the formula 14 while being able to downsize the regenerative amplifier 9, and increase the amplification efficiency in a short time.

In FIG. 48, the optical path is shuttled once over the amplifiable region of the $CO_2$ gas amplifier EA using the high reflective mirrors 121 and 122. However, such arrangement is not definite while it is also possible to have the optical path shuttle more than once. Moreover, in FIG. 48, the laser light passes through the amplifiable region of the $CO_2$ gas amplifier EA three times, but if under conditions that self-oscillation and parasitic-oscillation do not occur, it is possible to enhance improvement of the amplification efficiency by a further multipass.

Furthermore, the resonator length L satisfying the formula 14 can be obtained by reflecting the laser light using a plurality of reflective mirrors located outside the amplifiable region of the $CO_2$ gas amplifier EA.

Furthermore, as the above-described semiconductor lasers 4, 41 to 45, and 4-1 to 4-n, a distributed feedback (DFB) type lasers can be applied.

Figure 49:
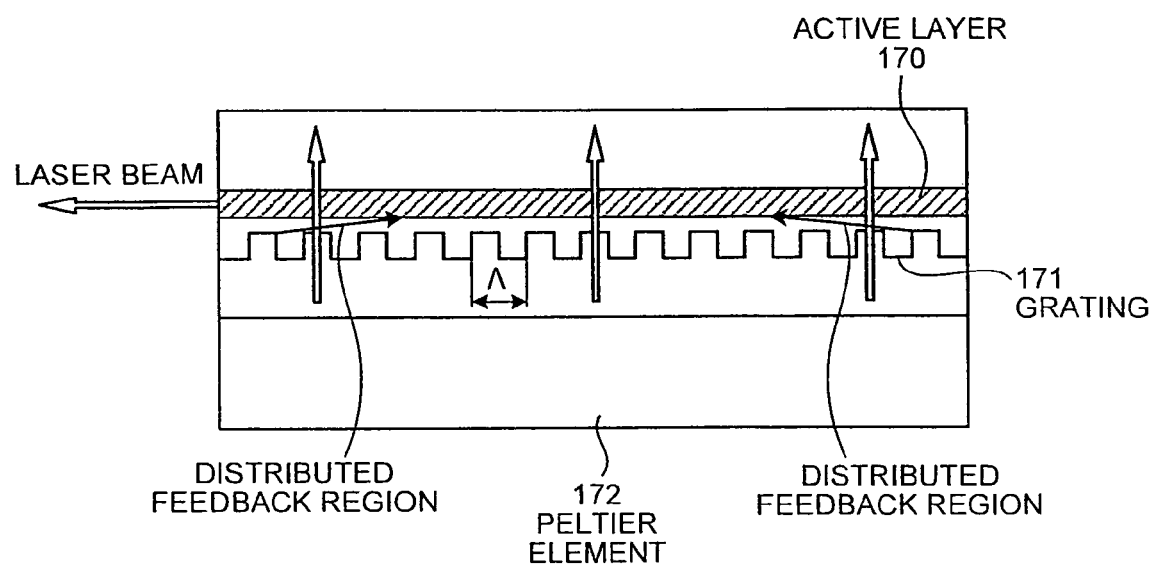
FIG. 49 is a cross-sectional schematic diagram showing an outline structure of a distributed feedback (DFB) semiconductor laser applied to a semiconductor laser in the sixth embodiment.

FIG. 49 is a cross-sectional schematic diagram showing a structure of a distributed feedback type semiconductor laser applied to the semiconductor as being the master oscillator. The semiconductor laser has a grating 171 formed near an active layer 170. For instance, the grating 171 is formed under or over the active layer 170. In the semiconductor having such structure, a wavelength of which reflectance ratio becomes maximum is commonly expressed by the following formula 15.

$$\lambda = \lambda b \pm \delta \lambda \quad \text{(formula 15)}$$

Here, $\lambda b = 2n\Lambda/m$ is a Bragg reflection wavelength, $\Lambda$ is a pitch of the grating, and m is a diffraction order. In addition, a selection wavelength width $2\delta\lambda$ is a value determined based on a depth of a trench of the grating, a resonator length of a laser, and so forth. By arranging so that the selection wavelength width $2\delta\lambda$, by the grating selects only one longitudinal mode based on the resonator length of the semiconductor laser, it is possible to manufacture a semiconductor laser with a single-longitudinal mode. In a control of the oscillation wavelength of the single-longitudinal mode and the single-longitudinal mode, a temperature of the semiconductor laser is controlled by Peltier element 172, or the like. Thereby, it is possible to stabilize the oscillation wavelength of the semiconductor laser within one amplification line of the amplifiable region of the $CO_2$ gas amplifier. As a result, effective amplification is made possible.

Moreover, in this particular embodiment, the grating 171 is formed over or under the active layer 170 so that the selection wavelength width $2\delta\lambda$, of the grating 171 becomes a selection wavelength width where a plurality of the amplifiable regions can be selected. Furthermore, a wavelength gap $L_{FSR}$ of the longitudinal mode based on the resonator length of the semiconductor laser is set to 0.0206 μm. By arranging such structure, it is possible to manufacture a semiconductor laser with multiple-longitudinal mode oscillation. For instance, a semiconductor laser being able to oscillate in seven (a plural) amplifiable region of the $CO_2$ gas amplifier can be manufactured. A longitudinal mode control in this case can be made possible by controlling a temperature of the semiconductor laser with high accuracy using a Peltier element 172, or the like. According to this structure, because arranging an etalon and a grating inside an external resonator is not necessary, it is possible to easily stabilize a spectrum of the oscillation laser light while being able to realize downsizing and high power.

In the first to sixth embodiments described above, the single preamplifier PA and the single main amplifier MA are used, but one or more preamplifiers PA and one or more main amplifiers MA can be arranged in multiple stages in series, respectively.

Furthermore, in the first to sixth embodiments, although the pulse laser apparatus has been explained as an example of the laser apparatus, it is also possible to apply the first to sixth embodiments to a CW laser apparatus outputting a CW laser light.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents. For instance, it is needless to say that the alternate examples arbitrarily explained in each of the embodiments can be applied to the other embodiments as well.

As described above, according to each of the embodiments of the present disclosure, the controller executes the wavelength control so that the wavelength(s) of the single or multiple longitudinal mode laser lights outputted from the master oscillator corresponds to the amplification line(s) of the molecular gas amplifier, and executes the wave shape control adjusting the pulse shape and/or the pulse output timing. Thereby, a high speed and a high accuracy laser energy control can be realized with a wide dynamic range. Moreover, it is possible to fast-change a peak power, a pulse width and a pulse shape of the outputted laser pulse which greatly influence the conversion efficiency of the EUV light. Furthermore, when amplifying by the multiple lines, the amplification efficiency increases, and consumption energy can be saved. Accordingly, it is possible to provide a laser apparatus being optimum as a driver laser of the EUV light source apparatus.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents. Furthermore, the above-mentioned embodiments and the alternate examples can be arbitrarily combined with one another.

What is claimed is:

1. A laser apparatus comprising:
    an amplifier including at least one of a power amplifier and a power oscillator each of which amplifies a single-longitudinal or multiple-longitudinal mode laser light, an amplifiable agent of the amplifier being a molecular gas;
    a master oscillator comprising a semiconductor laser configured to oscillate a single-longitudinal or multiple-longitudinal mode laser light of which wavelength is within one or more amplification lines of the amplifier;
    a controller configured to adjust at least one of a pulse energy, a pulse width, a wavelength, and a pulse output timing of the single-longitudinal or multiple-longitudinal mode laser light outputted from the master oscillator; and
    a temperature regulator configured to control a temperature of the semiconductor laser, wherein
    the controller controls a wavelength of the master oscillator so that a wavelength of the single-longitudinal or multiple-longitudinal mode laser light outputted from the master oscillator becomes within the one or more amplification lines.

2. The laser apparatus according to claim 1, wherein the controller is further configured to execute a wave shape control by controlling a current directed to the semiconductor laser.

3. The laser apparatus according to claim 1, wherein the semiconductor laser is a quantum cascade laser.

4. The laser apparatus according to claim 3, wherein the master oscillator is an external resonator type or a distributed feedback type semiconductor laser.

5. The laser apparatus according to claim 1, wherein the amplifier is a single-stage or multiple-stage $CO_2$ gas amplifier.

6. The laser apparatus according to claim 1, wherein the semiconductor laser is a quantum cascade laser, and the amplifier is a single-stage or multiple-stage $CO_2$ gas amplifier.

7. The laser apparatus according to claim 1, wherein the master oscillator comprises:
    a plurality of semiconductor lasers each of which oscillates a single-longitudinal or multiple-longitudinal mode laser light of which wavelength is within one or more of the amplification lines, and
    a combiner combining the single-longitudinal or multiple-longitudinal mode laser light outputted from each of the semiconductor lasers and inputting the combined laser light into the amplifier.

8. The laser apparatus according to claim 7, wherein the controller controls at least one of the pulse energy, the pulse width, the wavelength and the pulse output timing of the single-longitudinal or multiple-longitudinal mode laser light outputted from each of the semiconductor lasers.

9. The laser apparatus according to claim 8, wherein the controller controls at least one of the pulse energy, the pulse width, the wavelength and the pulse output timing by executing a current control of the semiconductor lasers.

10. The laser apparatus according to claim 7, wherein the controller controls the pulse output timing of each of the semiconductor lasers based on a trigger inputted from external.

11. The laser apparatus according to claim 1, further comprising:
    a detector monitoring at least one or more of a pulse energy, a pulse width, an amplifiable wavelength and a pulse output timing outputted from the amplifier, wherein
    the controller executes a feedback control of at least one of the pulse energy, the pulse width, the amplifiable wavelength and the pulse output timing outputted from the amplifier based on a monitoring result of the detector.

12. The laser apparatus according to claim 1, further comprising:
    a regenerative amplifier arranged between the master oscillator and the amplifier.

13. The laser apparatus according to claim 12, further comprising:
    a detector monitoring at least one or more of a pulse energy, a pulse width, an amplifiable wavelength and a pulse output timing outputted from the amplifier, wherein
    the controller executes a feedback control of at least one of the pulse energy, the pulse width, the amplifiable wavelength and the pulse output timing outputted from the amplifier based on a monitoring result of the detector.

14. The laser apparatus according to claim 5, further comprising a detector monitoring at least one or more of a pulse energy, a pulse width, an amplifiable wavelength and a pulse output timing from the amplifier, wherein
    the controller executes a control for preventing an irradiation target from being irradiated with the amplified pulse laser light outputted from the amplifier while executing a control with respect to the master oscillator when a difference between a monitoring result of the detector and a desired value is larger than a predetermined value.

15. An extreme ultraviolet light source apparatus comprising:
    a laser apparatus comprising:
        an amplifier including at least one of a power amplifier and a power oscillator each of which amplifies a single-longitudinal or multiple-longitudinal mode laser light, an amplifiable agent of the amplifier being a molecular gas,
        a master oscillator comprising a semiconductor laser configured to oscillate a single-longitudinal or multiple-longitudinal mode laser light of which wavelength is within one or more amplification lines of the amplifier,
        a controller configured to adjust at least one of a pulse energy, a pulse width, a wavelength, and a pulse output timing of the single-longitudinal or multiple-longitudinal mode laser light outputted from the master oscillator, and
        a temperature regulator configured to control a temperature of the semiconductor laser, wherein
    the controller controls a wavelength of the master oscillator so that a wavelength of the single-longitudinal or multiple-longitudinal mode laser light outputted from the master oscillator becomes within the one or more amplification lines, and
    using the laser apparatus as a driver laser, a plasma is generated by irradiating an irradiation target with a single-longitudinal or multiple-longitudinal mode laser light outputted from the driver laser, and an extreme ultraviolet light is emitted from the plasma.

16. The extreme ultraviolet light source apparatus according to claim 15, further comprising:
an extreme ultraviolet light detector detecting an energy of an extreme ultraviolet light emitted from the plasma, wherein
based on a detection result of the extreme ultraviolet light source detector, the controller executes a feedback control including a wavelength control which controls a wavelength of a single-longitudinal or multiple-longitudinal mode laser light outputted from the master oscillator corresponds to an amplification line of the amplifier and a wave shape control which adjusts at least one of a pulse energy, a pulse width, an amplifiable wavelength and a pulse output timing outputted from the amplifier.

17. The extreme ultraviolet light source apparatus according to claim 16, wherein the extreme ultraviolet light source detector is arranged inside the extreme ultraviolet light source apparatus or an exposure apparatus.

18. The laser apparatus according to claim 1, wherein the amplifier includes a slab laser amplifier.

19. The laser apparatus according to claim 1, wherein the temperature regulator includes a Peltier element.

* * * * *